US008633550B2

(12) United States Patent
Uno et al.

(10) Patent No.: US 8,633,550 B2
(45) Date of Patent: Jan. 21, 2014

(54) SEMICONDUCTOR DEVICE

(75) Inventors: Tomoaki Uno, Kanagawa (JP);
Yoshitaka Onaya, Kanagawa (JP);
Hirokazu Kato, Kanagawa (JP);
Ryotaro Kudo, Kanagawa (JP); Koji Saikusa, Kanagawa (JP); Katsuhiko Funatsu, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 25 days.

(21) Appl. No.: 13/531,567

(22) Filed: Jun. 24, 2012

(65) Prior Publication Data

US 2013/0001792 A1   Jan. 3, 2013

(30) Foreign Application Priority Data

Jun. 30, 2011   (JP) ................... 2011-145701

(51) Int. Cl.
*H01L 27/088* (2006.01)

(52) U.S. Cl.
USPC ...... 257/401; 257/E23.01; 257/365; 257/773; 438/217; 438/289

(58) Field of Classification Search
USPC ............ 257/E23.01, E29.257, 107, 250, 278, 257/288, 365, 401, 467, 666, 686, 723, 724, 257/773; 438/217, 289, 618, 666; 374/178, 374/179, 208; 326/61
See application file for complete search history.

(56) References Cited

U.S. PATENT DOCUMENTS 5,642,252 A * 6/1997 Sakamoto et al. ........... 361/93.9
6,005,433 A * 12/1999 Hale ............................ 327/379
6,339,344 B1 * 1/2002 Sakata et al. ................. 326/83
6,920,071 B2 * 7/2005 Kawata et al. ........... 365/189.11
7,403,363 B2 * 7/2008 Mandai ........................ 361/58
7,425,845 B2 * 9/2008 Toba et al. .................. 326/80
7,449,733 B2 * 11/2008 Inaba et al. .................. 257/250
7,501,853 B2 * 3/2009 Ueda ............................ 326/33
7,507,023 B2 * 3/2009 Oyabe et al. ................ 374/178
7,598,603 B2 * 10/2009 Otremba ...................... 257/675
7,898,092 B2 * 3/2011 Lu et al. ....................... 257/777
8,072,241 B2 * 12/2011 Kouno ......................... 326/61
8,148,815 B2 * 4/2012 Girdhar et al. ............... 257/724

FOREIGN PATENT DOCUMENTS

| JP | 7-58293 A | 3/1995 |
|---|---|---|
| JP | 2005-322781 A | 11/2005 |
| JP | 2006-302977 A | 11/2006 |
| JP | 2008-017620 A | 1/2008 |
| JP | 2009-268336 A | 11/2009 |
| JP | 2011-049273 A | 3/2011 |

* cited by examiner

*Primary Examiner* — Chris Chu
(74) *Attorney, Agent, or Firm* — Miles & Stockbridge P.C.

(57) ABSTRACT

To improve reliability of a semiconductor device

A power MOSFET for switching and a sense MOSFET having an area smaller than that of the power MOSFET and configured to detect an electric current flowing through the power MOSFET are formed within one semiconductor chip CPH and the semiconductor chip CPH is mounted over a chip mounting part via an electrically conductive joining material and sealed with a resin. In a main surface of the semiconductor chip CPH, a sense MOSFET region in which the sense MOSFET is formed is located more internally than a source pad PDHS4 of the sense MOSFET region RG2. Furthermore, in the main surface of the semiconductor chip, the sense MOSFET region RG2 is surrounded by a region in which the power MOSFET is formed.

22 Claims, 51 Drawing Sheets

SEMICONDUCTOR DEVICE

CROSS-REFERENCE TO RELATED APPLICATION

The disclosure of Japanese Patent Application No. 2011-145701 filed on Jun. 30, 2011 including the specification, drawings and abstract is incorporated herein by reference in its entirety.

BACKGROUND

The present invention relates to a semiconductor device and particularly, to a technology effective when applied to a semiconductor device in which a semiconductor chip in which a switching transistor is formed is sealed with a resin.

In recent years, in order to achieve downsizing and quick response of a power source circuit etc., the frequency of power MOSFET (Metal Oxide Semiconductor Field Effect Transistor) used in a power source circuit has been increasing.

In particular, a CPU (Central Processing Unit) and DSP (Digital Signal Processor) of a desktop or notebook personal computer, server, gaming machine, etc., tend to increase in electric current and frequency. Because of this, the power MOSFET configuring a non-insulating DC-DC converter for controlling the power source of the CPU and DSP is under technical development so as to be capable of dealing with a large electric current and high frequency.

A DC-DC converter widely used as an example of the power source circuit has a configuration in which the power MOSFET for high side switch and the power MOSFET for low side switch are connected in series. The power MOSFET for high side switch has a switch function to control the DC-DC converter, the power MOSFET for low side switch has a switch function for synchronized rectification, and these two power MOSFETs convert the power source voltage by alternately turning on/off in synchronization.

Japanese Patent Laid-Open No. 2005-322781 (Patent Document 1) describes a technology relating to semiconductor chip provided with an electric current sensing unit.

Japanese Patent Laid-Open No. 1995-058293 (Patent Document 2) describes a technology relating to a semiconductor chip provided with a temperature detecting diode.

Japanese Patent Laid-Open No. 2011-49273 (Patent Document 3) describes a technology relating to a semiconductor chip provided with a temperature detecting element.

Japanese Patent Laid-Open No. 2009-268336 (Patent Document 4) describes a technology relating to a semiconductor chip provided with a temperature-sensitive diode.

Japanese Patent Laid-Open No. 2006-302977 (Patent Document 5) describes a technology relating to a semiconductor chip provided with a temperature detecting diode.

Japanese Patent Laid-Open No. 2008-17620 (Patent Document 6) describes a technology relating to a semiconductor device in which first, second, and third semiconductor chips are mounted on one package, the first semiconductor chip is a first power MOSFET, the second semiconductor chip is a second power MOSFET, and the third semiconductor chip includes a drive circuit to drive the first and second power MOSFETs.

SUMMARY

According to a study conducted by the inventors of the present invention, the following has been found.

A semiconductor device, which was manufactured by forming a switching power MOSFET and a sense MOSFET having an area smaller than that of the power MOSFET and configured to detect an electric current flowing through the power MOSFET within one semiconductor chip, mounting the semiconductor chip over a chip mounting part via an electrically conductive joining material, and sealing the semiconductor chip, was examined. The semiconductor device detects an electric current flowing through the power MOSFET by the sense MOSFET and controls the power MOSFET in accordance with the electric current flowing through the sense MOSFET. For example, when determining that an excessive electric current flows through the power MOSFET by the electric current flowing through the sense MOSFET, the semiconductor device forcefully turns off the power MOSFET to protect the semiconductor device and electronic devices using the same.

However, if thermal stress (for example, thermal load during use, temperature cycle test, etc.) is applied to the semiconductor device, there is a possibility that cracks or peeling is generated in the electrically conductive joining material interposed between the semiconductor chip and the chip mounting part. In the electrically conductive joining material, the region in which cracks or peeling has been generated is hard for the electric current to pass through, and thus the region hardly functions as a path of the electric current. The electric current flowing through the power MOSFET and the electric current flowing through the sense MOSFET have a predetermined ratio, but if cracks or peeling is generated in the electrically conductive joining material interposed between the semiconductor chip and the chip mounting part, the ratio varies, and thus there is a possibility that the precision when detecting the electric current flowing through the power MOSFET by the sense MOSFET is reduced. This results in reducing reliability of the semiconductor device.

The present invention has been made in view of the above circumstances and provides a technology capable of improving reliability of a semiconductor device.

The other purposes and the new feature of the present invention will become clear from the description of the present specification and the accompanying drawings.

The following explains briefly the outline of a typical invention among the inventions disclosed in the present application.

The semiconductor device according to the typical embodiment is a semiconductor device in which semiconductor chip is joined over a chip mounting part having electric conductivity via an electrically conductive joining material and sealed with a resin. In the semiconductor chip, a main MOSFET and a sense MOSFET having an area smaller than that of the main MOSFET and configured to detect an electric current flowing through the main MOSFET are formed. Then, the region in which the sense MOSFET is formed is located more internally than the source pad of the sense MOSFET in the main surface of the semiconductor chip.

The semiconductor device according to another typical embodiment is a semiconductor device in which a semiconductor chip is joined over a chip mounting part having electric conductivity via an electrically conductive joining material and sealed with a resin. In the semiconductor chip, a main MOSFET and a sense MOSFET having an area smaller than that of the main MOSFET and configured to detect an electric current flowing through the main MOSFET are formed. Then, the region in which the sense MOSFET is formed is surrounded by the region in which the main MOSFET is formed in the main surface of the semiconductor chip.

The following explains briefly the effect acquired by the typical embodiment among the inventions disclosed in the present application.

According to a typical embodiment, it is possible to improve reliability of a semiconductor device.

DETAILED DESCRIPTION

Figure 1:
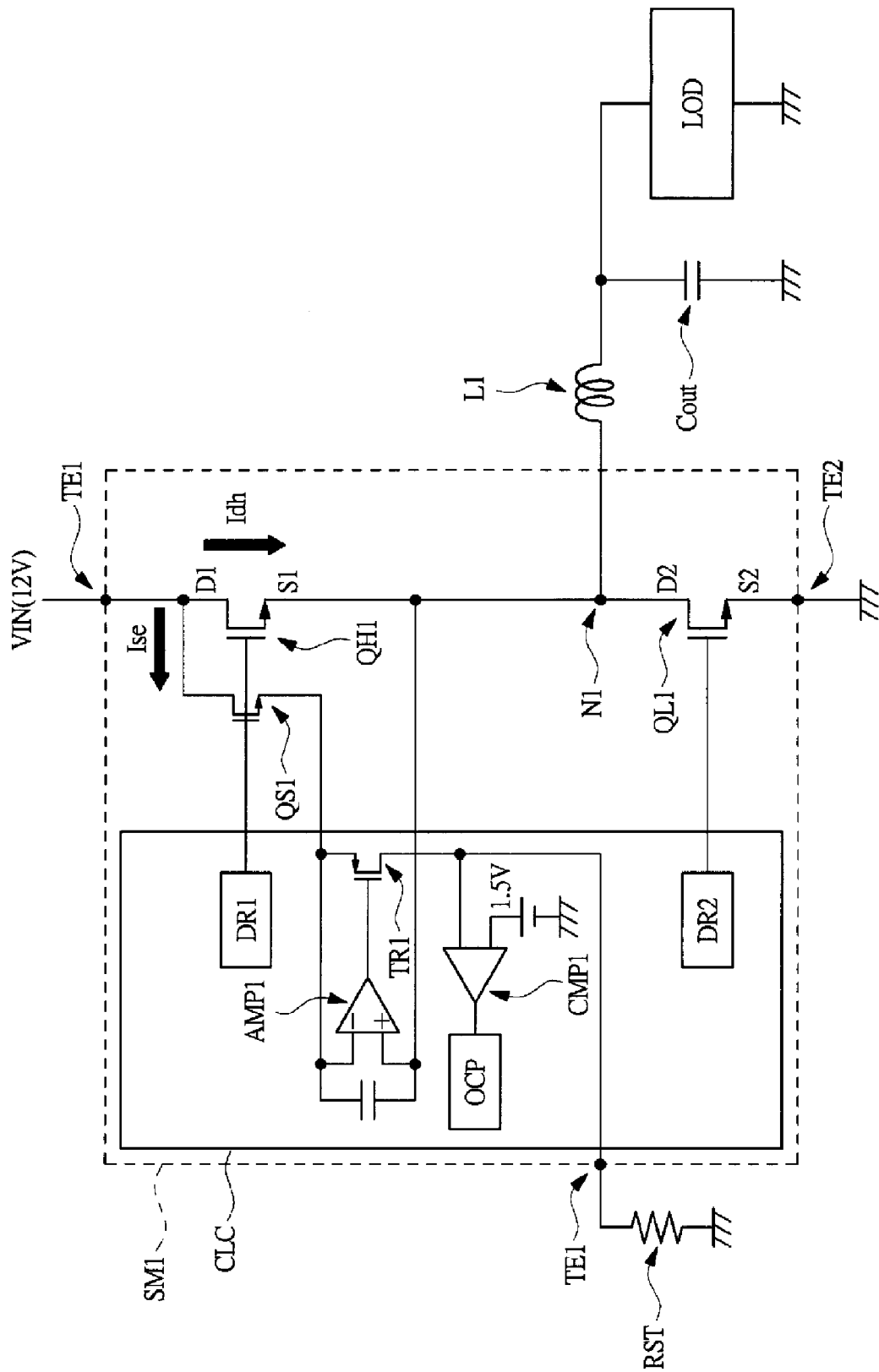
FIG. 1 is a circuit diagram showing an example of an electronic device using a semiconductor device of an embodiment of the present invention.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another. In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the following embodiments, it is needless to say that an element (including an element step etc.) is not necessarily indispensable, except for the case where it is clearly specified in particular and where it is considered to be clearly indispensable from a theoretical point of view, etc. Similarly, in the following embodiments, when referring to shape, position relationship, etc. of an element etc., what resembles or is like in the case of the shape substantially shall be included, except for the case where it is clearly specified in particular and where it is considered to be clearly not right from a theoretical point of view. This statement also applies to the numeric value and range described above.

Hereinafter, embodiments of the present invention will be explained in detail based on the drawings. Meanwhile, in all the drawings for explaining embodiments, the same symbol is attached to the member having the same function and the repeated explanation thereof is omitted. Furthermore, in the following embodiments, the explanation of the same or similar part is not repeated, as a principle, except for the case where it is necessary in particular.

In the drawings used in embodiments, in order to make a drawing intelligible, hatching may be omitted even if it is a cross-sectional view. Further, in order to make a drawing intelligible, hatching may be attached even if it is a plan view.

Moreover, in the present application, a field effect transistor is described as MOSFET (Metal Oxide Semiconductor Field Effect Transistor) or simply as MOS, but a non-oxide film is not excluded as a gate insulating film.

First Embodiment

<With Regard to Circuit Configuration>

FIG. 1 is a circuit diagram showing an example of an electronic device that uses a semiconductor device (semiconductor package) SM1 of an embodiment of the present invention, and here, a circuit diagram when anon-insulating DC-DC converter is configured by using the semiconductor device SM1 is shown.

The non-insulating DC-DC converter shown in FIG. 1 can be used in a power source circuit and the like of an electronic device such as a desktop personal computer, notebook personal computer, server, and gaming machine.

The semiconductor device SM1 used in the non-insulating DC-DC converter shown in FIG. 1 has two power MOSFETs QH1 and QL1, a sense MOSFET QS1 configured to detect an electric current flowing through the power MOSFET QH1, and a control circuit CLC. Although details will be described later, the control circuit CLC is formed within a semiconductor chip (semiconductor chip for control) CPC, the power MOSFET QH1 and the sense MOSFET QS1 are formed within a semiconductor chip (semiconductor chip for high side) CPH, the power MOSFET QL1 is formed within a semiconductor chip (semiconductor chip for low side) CPL, and these three semiconductor chips CPC, CPH, and CPL are sealed as one package and thus the semiconductor device SM1 is formed.

The control circuit CLC has two driver circuits (drive circuits) DR1 and DR2, which are drive circuits, and the driver circuits DR1 and DR2 are circuits that respectively control the operations of the power MOSFETs QH1 and QL1 by controlling the potentials of the gate terminals of the power MOSFETs QH1 and QL1 in accordance with a pulse width modulation (PWM) signal etc. supplied to the control circuit CLC from (a control circuit) outside the semiconductor device SM1. Furthermore, as another aspect, it is also possible to provide a circuit that generates the pulse width modulation (PWM) signal within the control circuit CLC.

The output of the driver circuit DR1 is electrically connected to the gate terminal of the power MOSFET QH1 and the output of the driver circuit DR2 is electrically connected to the gate terminal of the power MOSFET QL1. It is possible to regard the driver circuits DR1 and DR2 as the driver circuits (drive circuits) of the power MOSFETs QH1 and QL1.

The power MOSFET QH1 and the power MOSFET QL1 are connected in series between a terminal (external connecting terminal of the semiconductor device SM1) TE1 for supplying an input voltage and a terminal (external connecting terminal of the semiconductor device SM1) TE2 for supplying a reference potential. That is, the source/drain path of the power MOSFET QH1 is connected in series between the terminal TE1 for supplying an input voltage, and an output node (output terminal of the semiconductor device SM1) N1 and the source/drain path of the power MOSFET QL1 is connected in series between the output node N1 and the terminal TE2 for supplying a reference potential. Meanwhile, to the terminal TE1 for supplying an input voltage, a potential (power source potential) VIN on the high potential side of the power source (power source for input) outside the semiconductor device SM1, for example, 12 V is supplied and to the terminal TE2 for supplying a reference potential, a reference potential lower than the input voltage (potential VIN) to be supplied to the terminal TE1 for supplying an input voltage, for example, a ground potential (ground potential, 0 V) is supplied. In addition, in FIG. 1, symbol D1 represents the drain of the power MOSFET QH1, symbol S1 represents the source of power MOSFET QH1, symbol D2 represents the drain of the power MOSFET QL1, and symbol S2 represents the source of the power MOSFET QL1. The output node N1 is connected to a load LOD via a coil (for example, choke coil) L1.

The power MOSFET (field effect transistor, power transistor) QH1 is a field effect transistor for high side switch (high potential side: first operating voltage; hereinafter, simply referred to as high side) and has a switch function to accumulate energy in the coil L1. That is, the power MOSFET QH1 is a transistor for switching (switching element). The coil L1 is an element that supplies electric power to the output of the non-insulating DC-DC converter (that is, the input of the load LOD).

This high side power MOSFET QH1 is formed in the semiconductor chip (high side semiconductor chip) CPH, as will be described later. Furthermore, the power MOSFET QH1 is formed by, for example, an n-channel field effect transistor. Here, the channel of the field effect transistor is formed in the thickness direction of the semiconductor chip CPH. In this case, it is possible to increase the channel width per unit area as compared with the field effect transistor, the channel of which is formed along the main surface of the semiconductor chip CPH (surface perpendicular to the thickness direction of the semiconductor chip CPH) and to reduce the on-resistance, and thus it is possible to realize reduction in size of an element and to downsize packaging.

In contrast, the power MOSFET (field effect transistor, power transistor) QL1 is a field effect transistor for low side switch (low potential side: second operating voltage; hereinafter, simply referred to as low side) and has a function to rectify an electric current by reducing the resistance of the transistor in synchronization with the frequency of a signal supplied to the control circuit CLC from (a control circuit) outside the semiconductor device SM1. That is, the power MOSFET QL1 is a transistor for rectification (synchronized rectification) and here, is a transistor for rectification of a non-insulating DC-DC converter.

The low side power MOSFET QL1 is formed in the semiconductor chip (low side semiconductor chip) CPL, as will be described later. The power MOSFET QL1 is formed by, for example, an n-channel power MOSFET and as in the case of the power MOSFET QH1, the channel is formed in the thickness direction of the semiconductor chip CPL. The reason why the power MOSFET the channel of which is formed in the thickness direction of the semiconductor chip CPL is used is that the on-time (time during which a voltage is applied) of the low side power MOSFET QL1 is longer than the on-time of the high side power MOSFET QH1 and the loss by the on-resistance seems larger than the switching loss, and thus, when the field effect transistor the channel of which is formed in the thickness direction of the semiconductor chip CPL is used, it is possible to increase the channel width per unit area as compared with the case where the field effect transistor, the channel of which is formed along the main surface of the semiconductor chip CPL is used. That is, by forming the low side power MOSFET QL1 by a field effect transistor, the channel of which is formed in the thickness direction of the semiconductor chip CPL, the on-resistance can be reduced, and thus it is possible to improve voltage conversion efficiency even when the electric current flowing through the non-insulating DC-DC converter increases.

It is possible to regard the high side power MOSFET QH1 as the high side MOSFET (MOSFET for high side) of a DC-DC converter (here, the non-insulating DC-DC converter) and the low side power MOSFET as the low side MOSFET (MOSFET for low side) of a DC-DC converter (here, the non-insulating DC-DC converter).

A wiring that connects the source of the power MOSFET QH1 and the drain of the power MOSFET QL1 is provided with the output node N1 for supplying the output power source potential to the outside of the semiconductor device SM1. The output node N1 is electrically connected to the coil L1 via an output wiring and is further electrically connected to the load LOD via an output wiring. As the load LOD, there are included, for example, a hard disk drive HDD, ASIC (Application Specific Integrated Circuit), FPGA (Field Programmable Gate Array), extension card (PCI CARD), memory (DDR memory, DRAM (Dynamic RAM), flash memory, etc.), CPU (Central Processing Unit), etc.

Furthermore, an output capacitor Cout is electrically connected between the output wiring connecting the coil L1 and the load LOD and the terminal for supplying the reference potential GND.

In such a non-insulating DC-DC converter, the power source voltage is converted by the power MOSFETs QH1 and QL1 alternately turning on/off in synchronization. That is, when the high side power MOSFET QH1 is in the on-state, an electric current flows from the terminal TE1 to the output node N1 through the power MOSFET QH1. In contrast, when the high side power MOSFET QH1 is in the off-state, an electric current flows by the counter electromotive voltage of the coil L1 and by turning on the low side power MOSFET QL1 while the electric current is flowing, it is possible to reduce the voltage drop.

The electric current flowing through the power MOSFET QH1 is detected by the sense MOSFET QS1 and the power MOSFET QH1 is controlled in accordance with the electric current flowing through the sense MOSFET QS1. For example, when it is determined (detected) that an excessive current flows through the power MOSFET QH1 by the electric current flowing through the sense MOSFET QS1, it is possible to protect the semiconductor device SM1 and electronic devices that use the semiconductor device SM1 by forcedly turning off the power MOSFET QH1.

As will be described later, the sense MOSFET (field effect transistor) QS1 is formed in the semiconductor chip CPH together with the high side power MOSFET QH1. The sense MOSFET QS1 is formed so as to configure a current mirror circuit with the power MOSFET QH1 within the semiconductor chip CPH and includes, for example, a size 1/20,000 of that of the power MOSFET QH1. This size ratio can be changed in accordance with necessity, but explanation will be given below on the assumption that the size ratio is 1/20,000.

The drain and gate of the sense MOSFET QS1 are shared by the power MOSFET QH1. That is, the drain of the sense MOSFET QS1 is electrically connected to the drain of the power MOSFET QH1 and the shared drain is connected to the terminal TE1 so that the same potential is supplied to the drain of the sense MOSFET QS1 and the drain of the power MOSFET QH1. Further, the gate of the sense MOSFET QS1 is electrically connected to the gate of the power MOSFET QH1, that is, the gate is shared, and the shared gate is connected to the driver circuit DR1 so that the same gate signal is input from the driver circuit DR1 to the gate of the sense MOSFET QS1 and the gate of the power MOSFET QH1.

In contrast, the source of the sense MOSFET QS1 is not shared by the power MOSFET QH1 and while the source of the power MOSFET QH1 is connected to the output node N1, the source of the sense MOSFET QS1 is connected to a terminal (external terminal, external connecting terminal of the semiconductor device SM1) TE3 via a transistor TR1. Specifically, the source of the sense MOSFET QS1 is connected to the source of the transistor (p-channel MOSFET) TR1 formed in the semiconductor chip CPC, to be described later, and the drain of the transistor TR1 is connected to the terminal TE3. Furthermore, it is also possible to connect a diode (not shown schematically) for protection between the source of the power MOSFET QH1 and the source of the sense MOSFET QS1.

To two input nodes of an amplifier circuit AMP1 (this amplifier circuit AMP1 is formed in the semiconductor chip CPC, to be described later), the source of the power MOSFET QH1 and the source of the sense MOSFET QS1 are connected, respectively, and the gate of the transistor TR1 is driven by the output node of the amplifier circuit AMP1. The sense MOSFET QS1 is an element to detect an electric current Idh flowing through the power MOSFET QH1. When the source voltage of the sense MOSFET QS1 is equal to that of the power MOSFET QH1, an electric current in a predetermined ratio (here 1/20,000) of the electric current Idh flows through the sense MOSFET QS1. That is, the size ratio between the power MOSFET QH1 and the sense MOSFET QS1 is set so that when the electric current Idh flows through the power MOSFET QH1, an electric current Ise that flows through the sense MOSFET QS1 is 1/20,000 of the electric current Idh (that is, Ise=Idh/20,000). The amplifier circuit AMP1 and the transistor TR1 are provided in order to make the source voltage of the sense MOSFET QS1 equal to that of the power MOSFET QH1 and to detect the electric current Idh of the power MOSFET QH1 with high precision.

The terminal (terminal of the semiconductor device SM1) TE3 is connected to a resistor RST provided outside the semiconductor device SM1 and the resistor RST is an external resistor (resistor, resistor element provided externally) for current/voltage conversion. Specifically, to one end of the resistor RST, the terminal TE3 is connected and the other end of the resistor RST is connected to the ground potential (0 V). By connecting the resistor RST to the terminal TE3, it is possible to convert the value of the electric current flowing through the sense MOSFET QS1 into the value of the voltage of the terminal TE3 (the larger the electric current Ise flowing through the sense MOSFET QS1 is, the larger the value of the voltage of the terminal TE3 is, that is, specifically, the value of the voltage of the terminal TE3 is approximately in proportion to the value of the electric current Ise flowing through the sense MOSFET QS1).

The voltage of the terminal TE3 is compared with a comparison voltage (for example, 1.5 V) by a comparator circuit CMP1 within the control circuit CLC. When it is detected that the voltage value of the terminal TE3 is larger than the comparison voltage (for example, 1.5 V) by the comparator circuit CMP1, an overcurrent protection circuit OCP within the control circuit CLC operates to control the driver circuits DR1 and DR2 and bring the power MOSFETs QH1 and QL1 into the off-state (that is, the gate signal input to the gate of the power MOSFETs QH1 and QL1 is turned off).

That is, when the voltage value of the terminal TE3 is determined (detected) to be larger than the comparison voltage (for example, 1.5 V) (that is, when the electric current Ise flowing through the sense MOSFET QS1 is determined (detected) to be excessive), the control circuit CLC turns off the power MOSFETs QH1 and QL1 (off-state, nonconductive state). When determining (detecting) that the electric current Ise flowing through the sense MOSFET QS1 is excessive by detecting the electric current Idh flowing through the power MOSFET QH1 by the sense MOSFET QS1 (as the electric current Ise flowing through the sense MOSFET QS1), the control circuit CLC turns off the power MOSFETs QH1 and QL1, and thus, it is possible to forcedly turn off the power MOSFETs QH1 and QL1 when an excessive current flows through the power MOSFET QH1.

Specifically, the resistance value of the resistor RST is set so that when an electric current 1/20,000 of a permitted upper limit value Ilm of the electric current Idh of the power MOSFET QH1 flows (that is, when Ise=Ilm/20,000 holds), the voltage of the terminal TE3 becomes equal to the above-mentioned comparison voltage (for example, 1.5 V). Because of this, when an electric current equal to or larger than the permitted upper limit value Ilm flows through the power MOSFET QH1, an electric current equal to or larger than Ilm/20,000 flows through the sense MOSFET QS1 and the voltage of the terminal TE3 becomes equal to or larger than the comparison voltage (for example, 1.5 V), and thus, the control circuit CLC forcedly turns off the power MOSFETs QH1 and QL1. Because of this, it is possible to prevent an electric current equal to or larger than the permitted upper limit value Ilm from flowing through the power MOSFET QH1 and to improve reliability of the semiconductor device SM1 and electronic devices using the same.

<With Regard to Structure of Semiconductor Device>

Figure 2:
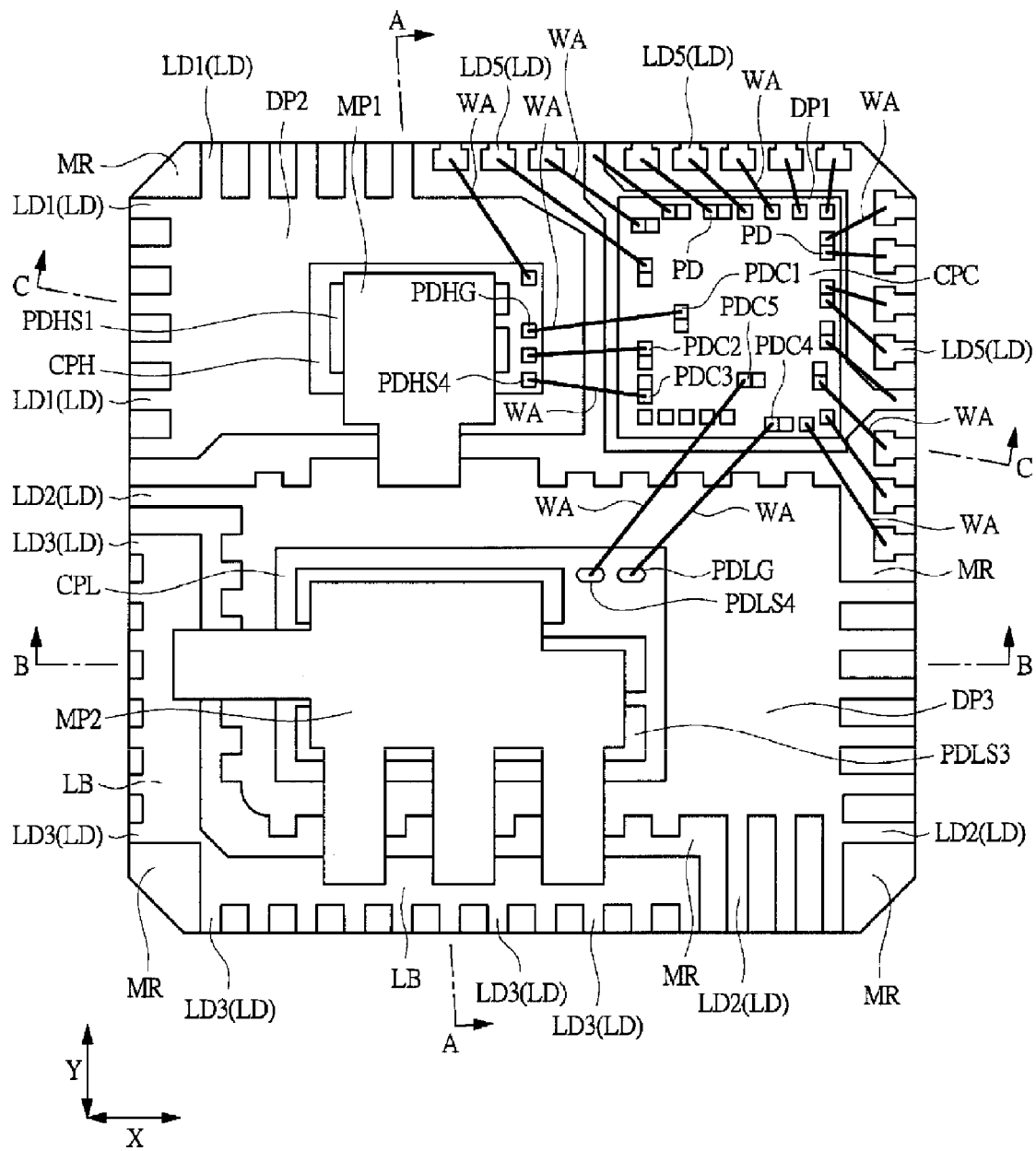
FIG. 2 is a perspective plan view of a semiconductor device of an embodiment of the present invention.
Figure 3:
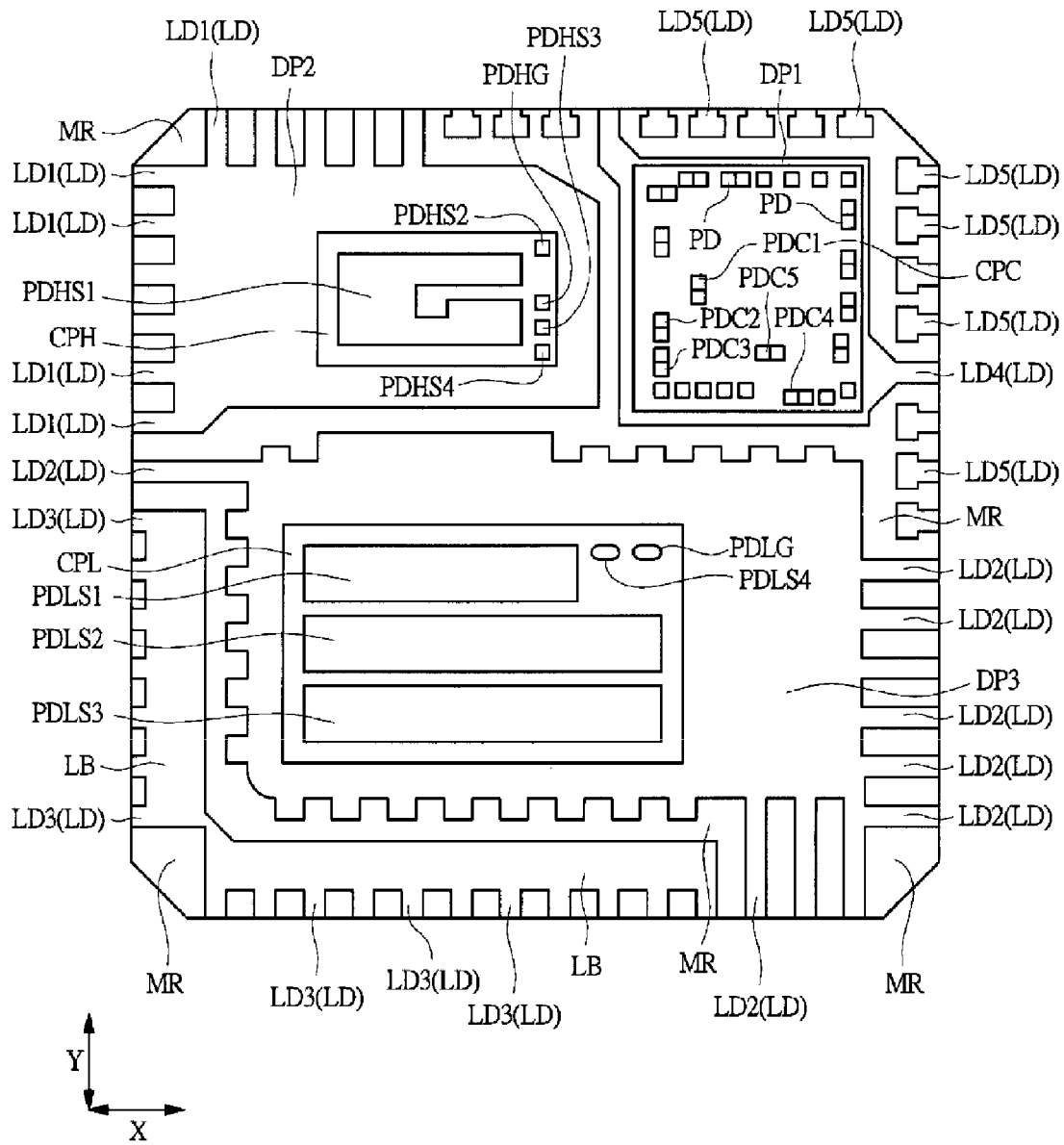
FIG. 3 is a perspective plan view of a semiconductor device of an embodiment of the present invention.
Figure 4:
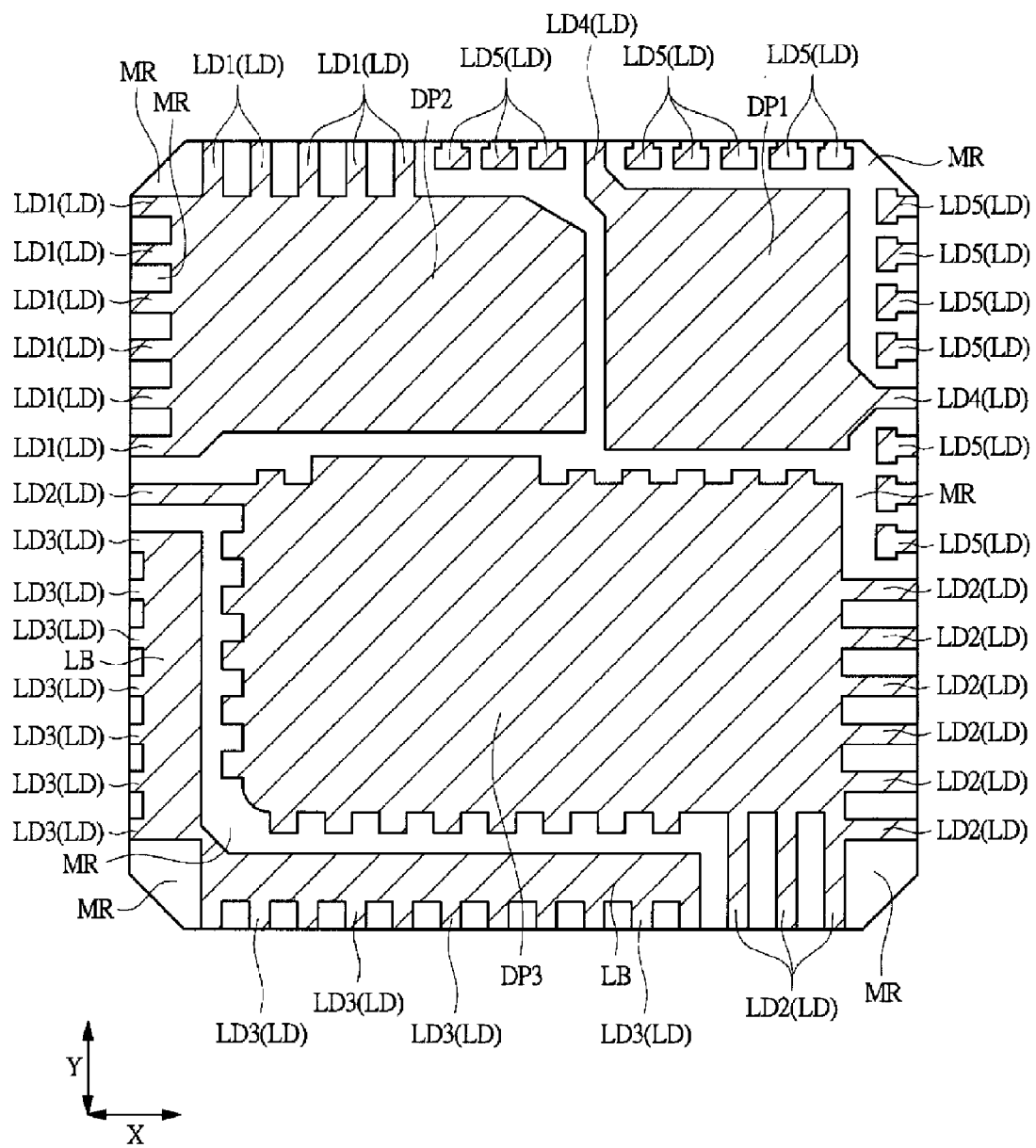
FIG. 4 is a perspective plan view of a semiconductor device of an embodiment of the present invention.
Figure 5:
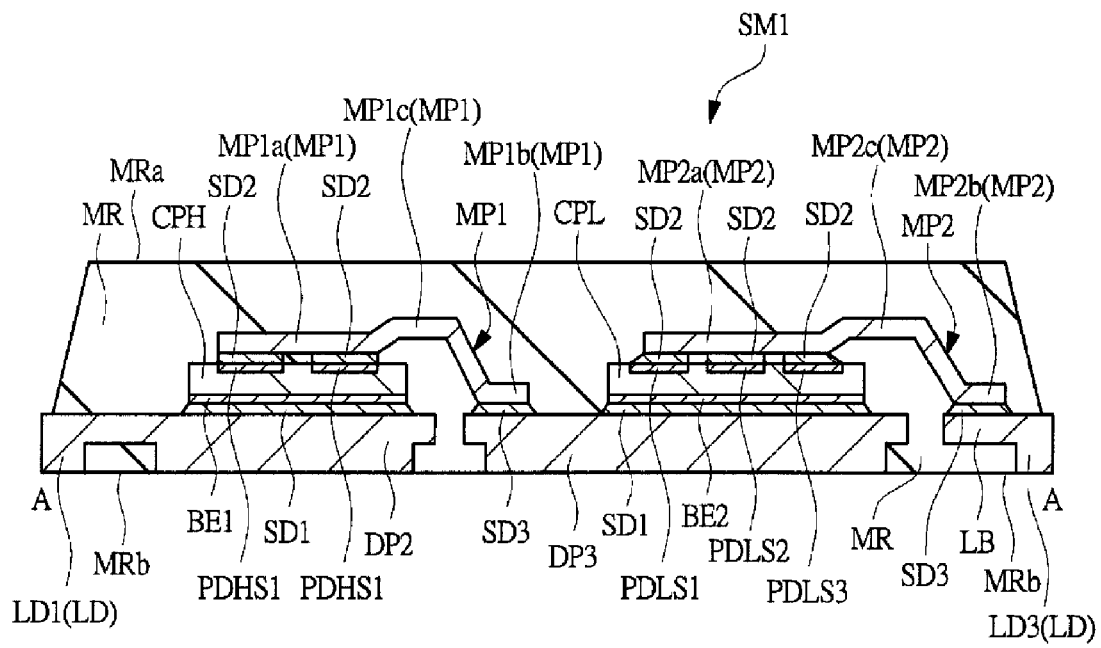
FIG. 5 is a cross-sectional view of a semiconductor device of an embodiment of the present invention.
Figure 6:
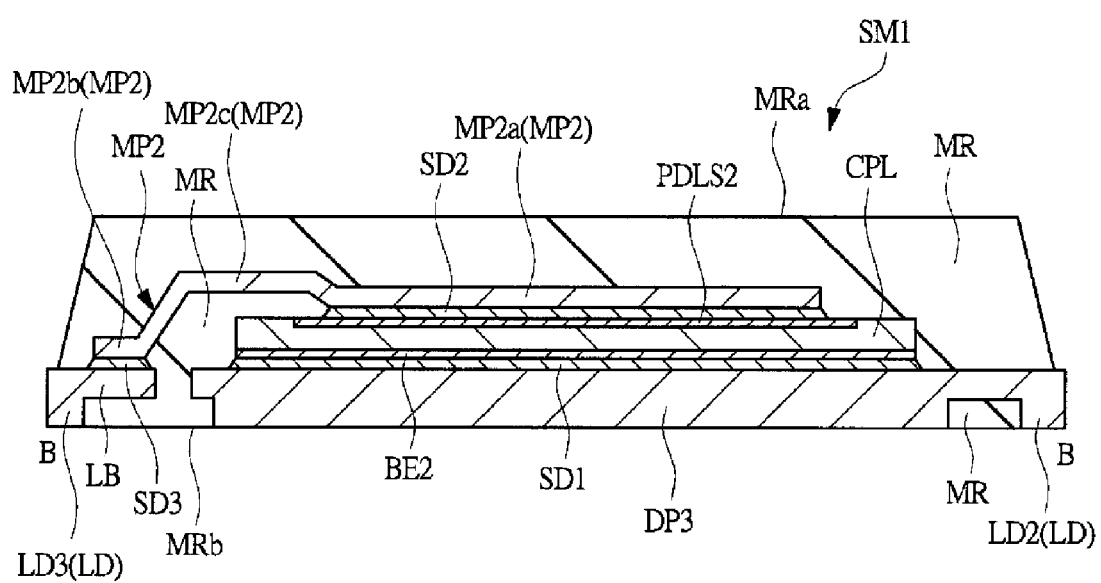
FIG. 6 is a cross-sectional view of a semiconductor device of an embodiment of the present invention.
Figure 7:
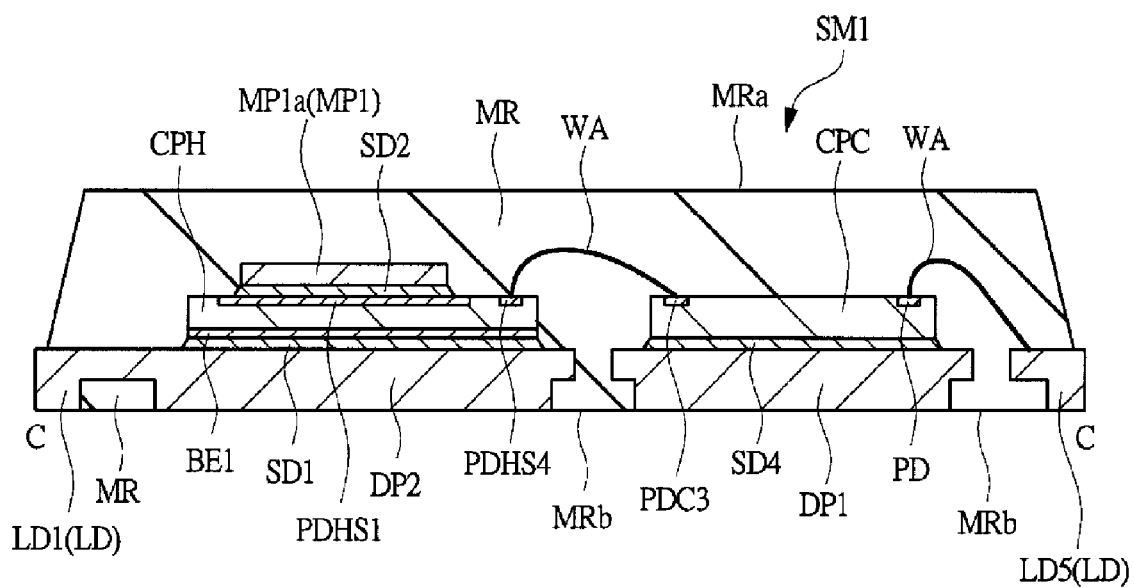
FIG. 7 is a cross-sectional view of a semiconductor device of an embodiment of the present invention.
Figure 8:
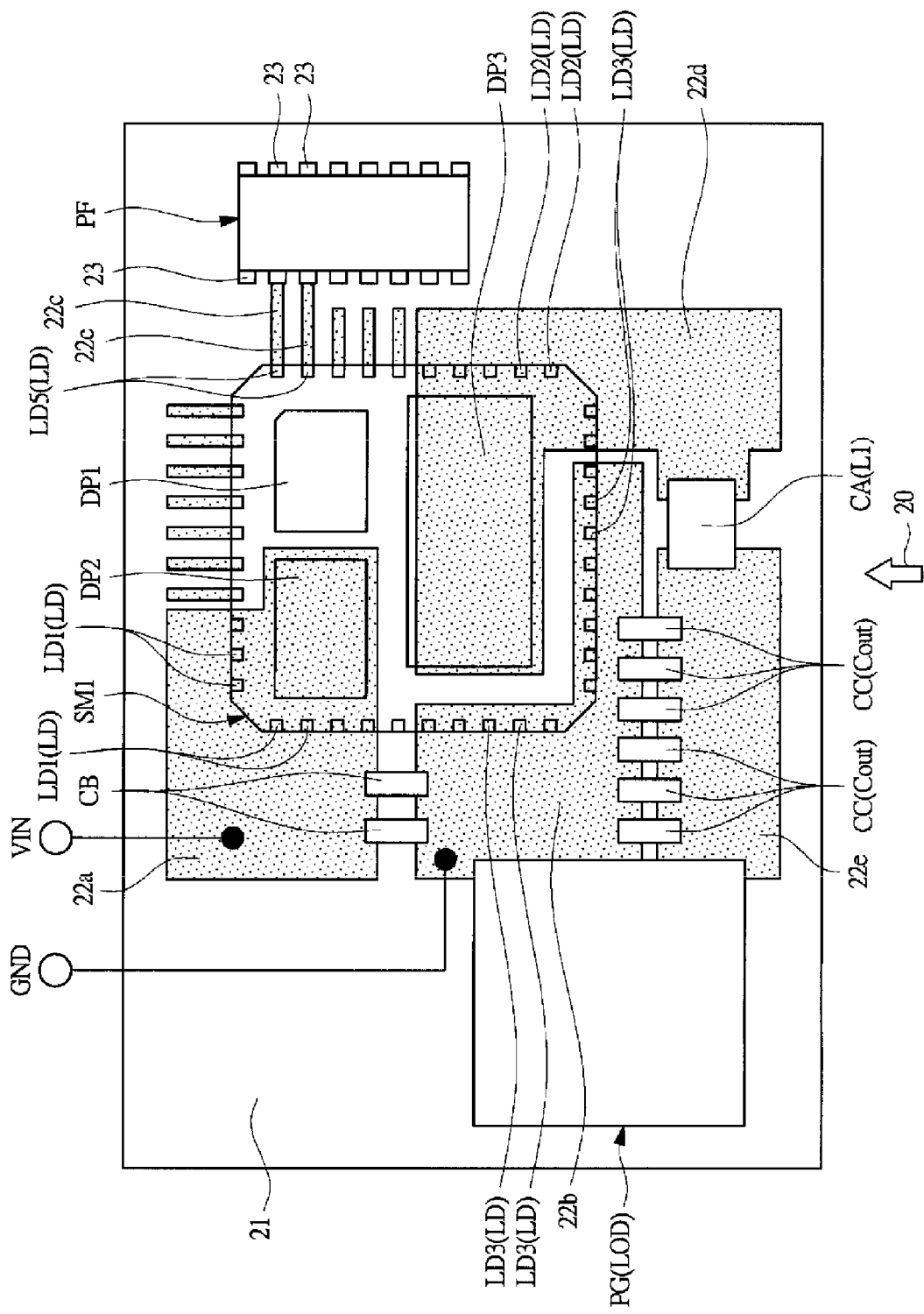
FIG. 8 is a plan view of essential parts showing an example of implementation of a semiconductor device of an embodiment of the present invention.

FIG. 2 to FIG. 4 are perspective plan views of the semiconductor device SM1 of the present embodiment, and FIG. 5 to FIG. 7 are cross-sectional views (lateral cross-sectional views) of the semiconductor device SM1. FIG. 2 shows a plan view (top view) when the semiconductor device SM1 is viewed from the upper surface side, and a sealing part (sealing resin part) MR is viewed through. FIG. 3 is a perspective plan view of the semiconductor device SM1 in a state where metal plates MP1 and MP2 and a bonding wire WA are further removed (viewed through) in FIG. 2 and FIG. 4 is a perspective plan view of the semiconductor device SM1 in a state where the semiconductor chips CPC, CPH, and CPL are further removed (viewed through) in FIG. 3. Meanwhile, although FIG. 8 is a plan view, in order to make the drawing intelligible, hatching of slashes is attached to die pads DP1, DP2, and DP3, a lead wire LB, and a lead LD. In addition, FIG. 5 approximately corresponds to the cross-sectional view along A-A line in FIG. 2, FIG. 6 approximately corresponds to the cross-sectional view along B-B line in FIG. 2, and FIG. 7 approximately corresponds to the cross-sectional view along C-C line in FIG. 2. Meanwhile, symbol X represents a first direction and symbol Y represents a second direction perpendicular to the first direction X.

As described above, in the present embodiment, the semiconductor chip CPC in which the control circuit CLC is formed, the semiconductor chip CPH in which the power MOSFET QH1, which is a field effect transistor for high side switch, is formed, and the semiconductor chip CPL in which the power MOSFET QL1, which is a field effect transistor for low side switch, is formed are put together (packaged) into one semiconductor package, and thus one semiconductor device SM1 is formed. By doing so, in addition to the realization of reduction in size and thickness of an electronic device (for example, a non-insulating DC-DC converter), it is possible to realize high frequencies and high efficiency because wiring parasitic inductance can be reduced. Meanwhile, in the semiconductor chip CPH, the sense MOSFET QS1 configured to detect an electric current flowing through the power MOSFET QH1 is also incorporated.

The semiconductor device SM1 of the present embodiment has the die pads (tab, chip mounting part) DP1, DP2, and DP3, the semiconductor chips CPC, CPH, and CPL mounted over the main surface (upper surface) of each of the die pads DP1, DP2, and DP3, the metal plates (conductor plate) MP1 and MP2, a plurality of bonding wires (hereinafter, simply referred to as wire) WA, a plurality of leads LD, the lead wire (wiring part) LB, and the sealing part (sealing resin part) MR that seals these parts.

The sealing part (sealing resin part) MR includes a resin material such as, for example, a thermosetting resin material, and can also include a filler etc. For example, it is possible to form the sealing part MR by using an epoxy resin including a filler. It may also be possible to use, for example, a phenol-based curing agent and a biphenyl-based thermosetting resin to which silicone rubber, filler, etc., are added as the material of the sealing part MR, for reasons of aiming at the reduction of stress or the like, other than the epoxy-based resin.

The semiconductor device SM1 of the present embodiment is formed as a surface-mount semiconductor package of QFN (Quad Flat Non-leaded package) type.

The sealing part MR has a upper surface (surface) MRa, which is one of the main surfaces, a back surface (lower surface, bottom surface) MRb, which is the main surface on the side opposite to the upper surface MRa, and side surfaces (four side surfaces) intersecting with the upper surface MRa and the back surface MRb. That is, the external appearance of the sealing part MR is formed into the shape of a thin plate surrounded by the upper surface MRa, the back surface MRb, and the side surfaces. The planar shape of the upper surface MRa and the back surface MRb of the sealing part MR is formed into the shape of, for example, a rectangle and it is also possible to cut (chamfer) the corners of the rectangle (planar rectangle) or to make the corners of the rectangle (planar rectangle) round. When the planar shape of the upper surface MRa and the back surface MRb of the sealing part MR is formed into a rectangle, the planar shape (outer shape) of the sealing part MR intersecting with the thickness thereof is a rectangle (quadrilateral).

At the outer circumference of side surfaces (MRc1, MRc2, MRc3, and MRc4) and the back surface (MRb) of the sealing part MR, the leads LD are exposed along the outer circumference of the sealing part MR. Here, the lead LD is formed without protruding considerably to the outside of the sealing part MR and the semiconductor device SM1 is formed into the QFN configuration. In addition, at the back surface MRb of the sealing part MR, for example, the back surface (lower surface) of the three die pads (chip mounting part) DP1, DP2, and DP3 in the shape of approximately a planar rectangle is exposed. Among the die pads, the exposed area of the die pad DP3 is the largest and the exposed area of the die pad DP2 is the second largest.

However, the configuration of the semiconductor device SM1 is not limited to the QFN configuration and can be modified in various ways, and for example, another flat package configuration, such as a QFP (Quad Flat Package) configuration and SOP (Small Out-line Package) configuration, may be used. In the case of the QFP configuration, the leads LD are exposed in a state of protruding considerably to the outside from the four sides (outer circumference of the side surfaces and the back surface) of the sealing part MR. In the case of the SOP configuration, the leads LD are exposed in a state of protruding considerably to the outside from the two sides (outer circumference of the side surfaces and the back surface) of the sealing part MR.

The die pads DP1, DP2, and DP3 are arranged adjacent to one another in a state of being separated at predetermined intervals. The die pads DP1, DP2, and DP3 are arranged so that each center thereof deviates from the center of the semiconductor device SM1 (sealing part MR). Among the die pads, the total area (planar dimension) of the die pad DP3 is the largest, the total area (planar dimension) of the die pad DP2 is the second largest, and the total area (planar dimension) of the die pad DP1 is the smallest. The die pads DP1, DP2, and DP3 are arranged so that each long side thereof is along one another. One side of the die pad PD1 is along the short side of the die pad PD2 and the other one side intersecting with the one side of the die pad DP1 is arranged so as to be along the long side of the die pad DP3. The die pad DP1 is a chip mounting part (chip mounting part for driver, chip mounting part for control) on which the semiconductor chip CPC is mounted, the die pad DP2 is a chip mounting part (high side chip mounting part) on which the semiconductor chip CPH is mounted, and the die pad DP3 is a chip mounting part (low side chip mounting part) on which the semiconductor chip CPL is mounted.

At least a part of each of the die pads DP1, DP2, and DP3 is sealed by the sealing part MR, but in the present embodiment, a part of the back surface (lower surface) of each of the die pads DP1, DP2, and DP3 is exposed from the back surface MRb of the sealing part MR. Because of this, it is possible to dissipate heat generated at the time of the operation of the semiconductor chips CPC, CPH, and CPL mainly from the back surface (lower surface) of the semiconductor chips CPC, CPH, and CPL to the outside of the semiconductor device SM1 through the die pads DP1, DP2, and DP3. Each of the die pads DP1, DP2, and DP3 is formed so as to have an area larger than that of each of the semiconductor chips CPC, CPH, and CPL mounted thereon, and thus it is possible to improve heat dissipation characteristics.

The die pads DP1, DP2, and DP3, the lead LD, and the lead wire LB include an electric conductor and preferably include a metal material, such as copper (Cu) and copper alloy. Copper (Cu) or copper (Cu) alloy is excellent in easy workability, high heat conductivity, and comparatively low cost, and thus copper or copper alloy is suitable as the main material of the die pads DP1, DP2, and DP3, the lead LD, and the lead wire LB. Furthermore, if the die pads DP1, DP2, and DP3, the lead LD, and the lead wire LB are formed by the same material (the same metal material), the semiconductor device SM1 can be manufactured by using the same lead frame, and thus the manufacturing of the semiconductor device SM1 becomes easy.

In the main surface (upper surface) of the die pads DP1, DP2, and DP3, the lead LD, and the lead wire LB, it is also possible to form a plated layer (not shown schematically) including silver (Ag) etc. in a region where the semiconductor chips CPC, CPH, and CPL contact, a region where the wire WA contacts, and a region where the metal plates MP1 and MP2 contact. In such a case, it is possible to connect the semiconductor chips CPC, CPH, and CPL, the metal plates MP1 and MP2, and the wire WA to the die pads DP1, DP2, and DP3, the lead LD, and the lead wire LB more accurately.

Furthermore, a part of the side of the back surface (lower surface) of the die pads DP1, DP2, and DP3, the lead wire LB, and the lead LD is relatively thin in the total thickness thereof (as compared with other parts). Because of this, the sealing material (sealing resin material) of the sealing part MR enters the thin part on the side of the back surface of the die pads DP1, DP2, and DP3, the lead wire LB, and the lead LD. Because of this, it is possible to improve adhesion between the die pads DP1, DP2, and DP3, the lead wire LB, and the lead LD and the sealing part MR and at the same time, it is possible to reduce or prevent peeling and deformation failure of the die pads DP1, DP2, and DP3, the lead wire LB, and the lead LD because it becomes difficult for the die pads DP1, DP2, and DP3, the lead wire LB, and the lead LD to drop off from the sealing part MR.

It is also possible to form a plated layer (not shown schematically), such as a solder plated layer, on each lower surface of the die pads DP1, DP2, and DP3, the lead wire LB, and the lead LD exposed at the back surface MRb of the sealing part MR. In such a case, it becomes easy to implement (solder implement) the semiconductor device SM1 on an implementation substrate (corresponding to a wiring substrate 21, to be described later).

The die pad (high side chip mounting part) DP2 is formed into the shape of a planar rectangle in which the length in the first direction X is longer than the length in the second direction Y. To the two sides intersecting with each other of the die pad DP2 (two sides along the outer circumference of the sealing part MR), a plurality of leads LD1 of the leads LD is connected integrally along the two sides. That is, the die pad DP2 and the leads LD1 are formed integrally. The leads LD1 (also the die pad DP2 as the case may be) form the above-mentioned terminal TE1 and the above-mentioned potential (power source potential) VIN on the high potential side of the external power source (input power source) of the semiconductor device SM1 is supplied to the lead LD1 (the terminal TE1).

Over the main surface (upper surface) of the die pad DP2, the semiconductor chip CPH for the above-mentioned power transistor is mounted in a state where the main surface (surface, upper surface) faces upward and the back surface (lower surface) faces the die pad DP2. That is, the semiconductor chip CPH is mounted (face-up bonding) and joined (fixed) over the die pad DP2 via an electrically conductive adhesive layer (joining material) SD1. The main surface and the back surface of the semiconductor chip CPH are surfaces on the opposite side to each other.

The semiconductor chip CPH is formed into the shape of a planar rectangle more elongated than that of the semiconductor chip CPC and arranged so that the long side of the semiconductor chip. CPH is along a longitudinal direction of the die pad DP2. On the back surface (the entire back surface) of the semiconductor chip CPH, a back surface electrode (electrode) BE1 is formed and the back surface electrode BE1 is joined and electrically connected to the die pad DP2 via the electrically conductive adhesive layer SD1. The back surface electrode BE1 of the semiconductor chip CPH is electrically connected to the drain of the above-mentioned high side power MOSFET QH1 formed within the semiconductor chip CPH and at the same time, is also electrically connected to the drain of the sense MOSFET QS1. That is, the back surface electrode BE1 of the semiconductor chip CPH serves both as the drain electrode of the high side power MOSFET QH1 and as the drain electrode of the sense MOSFET QS1. The adhesive layer SD1 includes an electrically conductive joining material (adhesive material) and preferably solder, but it is also possible to use a paste type electrically conductive adhesive material (this paste type adhesive material is already in a state of having hardened), such as silver paste.

Over the main surface (surface, upper surface) of the semiconductor chip CPH, a gate bonding pad (hereinafter, simply referred to as a pad) PDHG and source bonding pads (hereinafter, simply referred to as pads) PDHS1, PDHS2, PDHS3, and PDHS4 are arranged. Of these pads, the gate pad PDHG and the source pads PDHS2, PDHS3, and PDHS4 are electrodes (pad electrode, electrode pad, bonding pad) for connecting the wire WA and the source pad PDHS1 is an electrode (pad electrode, electrode pad, bonding pad) for connecting the metal plate MP1.

The gate pad PDHG of the semiconductor chip CPH is electrically connected to the gate electrode of the high side power MOSFET QH1 formed within the semiconductor chip CPH and the gate electrode of the sense MOSFET QS1. That is, the gate pad PDHG of the semiconductor chip CPH serves both as the gate pad (bonding pad) of the high side power MOSFET QH1 and as the gate pad (bonding pad) of the sense MOSFET QS1. The gate pad PDHG is arranged on the side of one end (end part on the side facing the semiconductor chip CPC) in a longitudinal direction of the semiconductor chip CPH. That is, the gate pad PDHG is arranged along the side on the side facing the semiconductor chip CPC (more specifically, in the vicinity of the center of the side) in the main surface of the semiconductor chip CPC. The semiconductor chip CPH is arranged in a state where the gate pad PDHG faces the side of the semiconductor chip CPC. The gate pad PDHG is electrically connected to a pad PDC 1 in the main surface of the semiconductor chip CPC through the wire WA (singular or plural). That is, one end of the wire WA is joined to the gate pad PDHG of the semiconductor chip CPH and the other end is joined to the pad PDC 1 of the semiconductor chip CPC. The wire WA is formed by a thin wire of metal, such as, for example, gold (Au).

The source pads PDHS1, PDHS2, and PDHS3 of the semiconductor chip CPH are electrically connected to the source of the high side power MOSFET QH1 formed within the semiconductor chip CPH and in contrast, the source pad PDHS4 of the semiconductor chip CPH is electrically connected to the source of the sense MOSFET QS1 formed within the semiconductor chip CPH. That is, the source pads PDHS1, PDHS2, and PDHS3 of the semiconductor chip CPH correspond to the source pad (bonding pad) of the high side power MOSFET QH1 and the source pad PDHS4 of the semiconductor chip CPH corresponds to the source pad (bonding pad) of the sense MOSFET QS1. The source pad PDHS1 is formed larger than the gate pad PDHG and the source pads PDHS2, PDHS3, and PDHS4. In contrast, the source pads PDHS2, PDHS3, and PDHS4 are arranged on the side of one end (end part on the side facing the semiconductor chip CPH) in a longitudinal direction of the semiconductor chip CPH on which the gate pad PDHG is arranged. That is, the source pads PDHS2, PDHS3, and PDHS4 are arranged along the side on the side facing the semiconductor chip CPC in the main surface of the semiconductor chip CPH. Consequently, the gate pad PDHG and the source pads PDHS2, PDHS3, and PDHS4 are arranged along the side on the side facing the semiconductor chip CPC in the main surface of the semiconductor chip CPH. The source pads PDHS1, PDHS2, and PDHS3 are separated from one another by a protective film (corresponding to an insulating film, a protective film 12, to be described later) in the uppermost layer of the semiconductor chip CPH, but in the lower layer of the protective film (protective film in the uppermost layer of the semiconductor chip CPH), the source pads PDHS1, PDHS2, and PDHS3 are formed integrally and electrically connected to one another.

The source pad PDHS1 of the semiconductor chip CPH (that is, the source of the high side power MOSFET QH1) is electrically connected to the die pad DP3 through the metal plate (high side metal plate) MP1. That is, the metal plate MP1 is joined to the source pad PDHS1 of the semiconductor chip CPH via an electrically conductive adhesive layer (joining material) SD2 and also joined to the upper surface of the die pad DP3 via an electrically conductive adhesive layer (joining material) SD3. The adhesive layers SD2 and SD3 include an electrically conductive joining material (adhesive material) and are preferably solder, but it is also possible to use a paste type electrically conductive adhesive material (this paste type adhesive material is already in a state of having hardened), such as silver paste. By using the metal plate MP1, it is possible to reduce the on-resistance of the high side power MOSFET QH1 as compared with the case where the source pad PDHS1 of the semiconductor chip CPH and the die pad DP3 are connected by a wire. Because of this, it is possible to reduce the package resistance and the conduction loss.

The metal plate MP1 is a conductor plate including an electric conductor and preferably formed by a metal (metal material) having a high electric conductivity and a thermal conductivity, such as copper (Cu), copper (Cu) alloy, aluminum (Al), and aluminum (Al) alloy. It is further preferable for the metal plate MP1 to be formed by copper (Cu) or copper (Cu) alloy in that it is easy to machine, thermal conductivity is high, and the cost is comparatively low. By using the metal plate MP1 formed by a metal material less expensive than gold in place of a wire formed by gold (Au) as described above, it is possible to reduce the cost of the semiconductor device SM1. Each of the dimension (width) in the first direction X and that in the second direction Y of the metal plate MP1 is greater than the diameter of the wire WA.

The metal plate MP1 integrally has a first part MP1a, a second part MP1b, and a third part MP1c as described below.

The first part (chip contact part, high side chip contact part) MP1a is a part joined to and electrically connected to the source pad PDHS1 via the electrically conductive adhesive layer SD2 and in the shape of, for example, a rectangular. As shown in FIG. 5, the first part MP1a is formed flat so as to be along the main surface of the semiconductor chip CPH when viewed in a section.

The second part (mounting part contact part, chip mounting part contact part) MP1b is apart joined to and electrically connected to (the main surface of) the die pad DP3 via the electrically conductive adhesive layer SD3. As shown in FIG. 5, the second part MP1b is formed flat so as to be along the main surface of the die pad DP3 when viewed in a section.

The third part (intermediate part) MP1c is a part that connects (links) the first part MP1a and the second part MP1b. The third part MP1c and the second part MP1b are provided extending from the side of the long side of the first part MP1a along the second direction Y so as to connect the first part MP1a and the die pad DP3. As shown in FIG. 5, the height of the third part MP1c is greater than that of the first part MP1a and the second part MP1b so as to become more distant from the main surface of the semiconductor chip CPH between the semiconductor chip CPH and the die pad DP3 when viewed in a section. The height referred to here is the distance from the back surface of the die pads DP1, DP2, and DP3, which is taken to be a reference, to a position distant toward the thickness direction of the sealing part MR (direction perpendicularly intersecting with the main surface of the semiconductor chip CPH).

The semiconductor chip CPH and the semiconductor chip CPL are in the shape of a planar rectangle and have one set of long sides and one set of short sides intersecting with the long sides, respectively, but the long sides of the semiconductor, chip CPH and the long sides of the semiconductor chip CPL are facing each other and the metal plate MP1 is arranged so as to intersect the long sides of the semiconductor chip CPH facing the semiconductor chip CPL.

The metal plate MP1 is arranged so as to cover a part of the main surface of the semiconductor chip CPH that generates heat and the semiconductor chip CPH is sandwiched by the metal plate MP1 and the die pad DP2. Because of this, heat generated in the semiconductor chip CPH is dissipated from the main surface of the semiconductor chip CPH through the metal plate MP1 as well as being dissipated from the back surface of the semiconductor chip CPH through the die pad DP2 and as a result, it is possible to improve dissipation characteristics of heat generated in the semiconductor chip CPH.

The source pad PDHS2 of the semiconductor chip CPH is electrically connected to the lead LD5 of the leads LD, which is not linked to the die pads DP1, DP2, and DP3, through the wire WA (singular or plural). That is, one end of the wire WA is joined to the source pad PDHS2 of the semiconductor chip CPH and the other end of the wire WA is joined to the lead LD5.

The source pad PDHS3 of the semiconductor chip CPH is electrically connected to a pad PDC2 of the main surface of the semiconductor chip CPC through the wire WA (singular or plural). That is, one end of the wire WA is joined to the source pad PDHS3 of the semiconductor chip CPH and the other end of the wire WA is joined to the pad PDC2 of the semiconductor chip CPC.

The source pad PDHS4 of the semiconductor chip CPH is electrically connected to a pad PDC3 of the main surface of the semiconductor chip CPC through the wire WA (singular or plural). That is, one end of the wire WA is joined to the source pad PDHS4 of the semiconductor chip CPH and the other end of the wire WA is joined to the pad PDC3 of the semiconductor chip CPC.

The die pad (low side chip mounting part) DP3 is formed into the shape of a planar rectangle in which the length in the first direction X is longer than the length in the second direction Y. To the die pad DP3, a plurality of leads LD2 of the leads LD is connected integrally. That is, the die pad DP3 and the leads LD2 are formed integrally. The leads LD2 (the die pad DP3 is also included as the case may be) form the output node N1.

Over the main surface (upper surface) of the die pad DP3, the semiconductor chip CPL for the power transistor is mounted in a state where the main surface (surface, upper surface) faces upward and the back surface (lower surface) faces the die pad DP3. That is, the semiconductor chip CPL is mounted (face-up bonding) and joined (fixed) over the die pad DP3 on the electrically conductive adhesive layer (joining material) SD1. The main surface and the back surface of the semiconductor chip CPL are surfaces on the opposite side to each other.

The semiconductor chip CPL is formed into the shape of a planar rectangle and arranged in such a manner that the long side of the semiconductor chip CPL is along a longitudinal direction of the die pad DP3. The planar area of the semiconductor chip CPL is larger than each planar area of the semiconductor chip CPH and the semiconductor chip CPC. Because the on-time of the low side power MOSFET QL1 is longer than that of the high side power MOSFET QH1, it is necessary to reduce the on-resistance of the power MOSFET QL1 more than the on-resistance of the power MOSFET QH1, and thus the outer size (area) of the semiconductor chip CPL is formed larger than the outer size (area) of the semiconductor chip CPH. On the back surface (the entire back surface) of the semiconductor chip CPL, aback surface electrode (electrode) BE2 is formed and the back surface electrode BE2 is joined and electrically connected to the die pad DP3 via the electrically conductive adhesive layer SD1. The back surface electrode BE2 of the semiconductor chip CPL is electrically connected to the drain of the low side power MOSFET QL1 formed within the semiconductor chip CPL. That is, the back surface electrode BE2 of the semiconductor chip CPL corresponds to the drain electrode of the low side power MOSFET QL1.

Over the main surface (surface, upper surface) of the semiconductor chip CPL, a gate bonding pad (hereinafter, simply referred to as a pad) PDLG and source bonding pads (hereinafter, simply referred to as pads) PDLS1, PDLS2, PDLS3, and PDLS4 are arranged. Of these pads, the gate pad PDLG and the source pad PDLS4 are electrodes (pad electrode, electrode pad) for connecting the wire WA and the source pads PDLS1, PDLS2, and PDLS3 are electrodes (pad electrode, electrode pad) for connecting the metal plate MP2.

The gate pad PDLG of the semiconductor chip CPL is electrically connected to the gate electrode of the low side power MOSFET QL1 formed within the semiconductor chip CPL. That is, the gate pad PDLG of the semiconductor chip CPL corresponds to the gate pad (bonding pad) of the low side power MOSFET QL1. The gate pad PDLG is arranged in the vicinity of the corner part on the side of one end in a longitudinal direction of the semiconductor chip CPL. The semiconductor chip CPL is arranged in a state where the gate pad PDLG faces the side of the semiconductor chip CPC. The gate pad PDLG is electrically connected to a pad PDC 4 of the main surface of the semiconductor chip CPC through the wire WA (singular or plural). That is, one end of the wire WA is joined to the gate pad PDLG of the semiconductor chip CPL and the other end of the wire WA is joined to the pad PDC 4 of the semiconductor chip CPC.

The source pads PDLS1, PDLS2, PDLS3, and PDLS4 of the semiconductor chip CPL are electrically connected to the source of the low side power MOSFET QL1 formed within the semiconductor chip CPL. That is, the source pads PDLS1, PDLS2, PDLS3, and PDLS4 of the semiconductor chip CPL correspond to the source pad (bonding pad) of the low side power MOSFET QL1. The source pads PDLS1, PDLS2, and PDLS3 are formed larger than the gate pad PDLG and the source pad PDLS4 and into the shape of, for example, a rectangle extending along a longitudinal direction (the first direction X) of the semiconductor chip CPL. In contrast, the source pad PDLS4 is arranged in the vicinity of the corner part on the side of one end in a longitudinal direction of the semiconductor chip CPL on which the gate pad PDLG is arranged. The source pads PDLS1, PDLS2, PDLS3, and PDLS4 are separated from one another by the protective film (corresponding to the insulating film, the protective film 12, to be described later) in the uppermost layer of the semiconductor chip CPL, but in the lower layer of the protective film (protective film in the uppermost layer of the semiconductor chip CPL), the source pads PDLS1, PDLS2, PDLS3, and PDLS4 are formed integrally and electrically connected to one another.

The source pads PDLS1, PDLS2, and PDLS3 (that is, the source of the low side power MOSFET QL1) are electrically connected to the lead wire LB through the metal plate (low side metal plate) MP2. Because of this, it is possible to reduce the on-resistance of the low side power MOSFET QL1 as compared with the case where the source pads PDLS1, PDLS2, and PDLS3 and the lead wire LB are connected by a wire. Because of this, it is possible to reduce the package resistance and the conduction loss.

The metal plate MP2 is a conductor plate including an electric conductor and preferably formed by the same material (metal material) as that of the metal plate MP1. Preferably, the metal plate MP2 is formed by a metal having a high electric conductivity and a thermal conductivity, such as copper (Cu), copper (Cu) alloy, aluminum (Al), and aluminum (Al) alloy. It is also preferable for the metal plate MP2 to be formed by copper (Cu) or copper (Cu) alloy in that it is easy to machine, thermal conductivity is high, and the cost is comparatively low as in the case of the metal plate MP1. By using the metal plate MP2 formed by a metal material less expensive than gold in place of a wire formed by gold (Au) as described above, it is possible to reduce the cost of the semiconductor device SM1. Each of the dimension (width) in the first direction X and that in the second direction Y of the metal plate MP2 is greater than the diameter of the wire WA. The planar area of the metal plate MP2 is larger than the planar area of the metal plate MP1. The metal plate MP2 integrally has a first part MP2$a$, a second part MP2$b$, and a third part MP2$c$ as described below.

The first part (chip contact part, low side chip contact part) MP2$a$ is a part joined and electrically connected to the source pads PDLS1, PDLS2, and PDLS3 via the electrically conductive adhesive layer SD2 and in the shape of, for example, a rectangular. As shown in FIG. 5 and FIG. 6, the first part MP2$a$ is formed flat so as to be along the main surface of the semiconductor chip CPL when viewed in a section.

The second part (lead contact part) MP2$b$ is a part joined and electrically connected to the lead wire LB via the electrically conductive adhesive layer SD3. The second part MP2$b$ overlaps with a part of the lead wire LB in a planar manner. As shown in FIG. 5 and FIG. 6, the second part MP2$b$ is formed flat so as to be along the main surface of the lead wire LB when viewed in a section.

The third part (intermediate part) MP2$c$ is a part that connects (links) the first part MP2$a$ and the second part MP2$b$.

It is possible to provide one or more sets of the third part MP2$c$ and the second part MP2$b$ and in the case of FIG. 2, there are provided one set extending along the first direction X from the side of the short side of the first part MP2$a$ so as to connect the first part MP2$a$ and the lead wire LB and three sets extending along the second direction Y from the side of the long side of the first part MP2$a$ so as to connect the first part MP2$a$ and the lead wire LB. Further, as shown in FIG. 5 and FIG. 6, the height of the third part MP2$c$ is greater than that of the first part MP2$a$ and the second part MP2$b$ so as to become more distant from the main surface of the semiconductor chip CPL between the semiconductor chip CPL and the lead wire LB when viewed in a section.

The metal plate MP2 is arranged so as to cover a part of the main surface of the semiconductor chip CPL that generates heat and the semiconductor chip CPL is sandwiched by the metal plate MP2 and the die pad DP3. Because of this, heat generated in the semiconductor chip CPL is dissipated from the main surface of the semiconductor chip CPL through the metal plate MP2 as well as being dissipated from the back surface of the semiconductor chip CPL through the die pad DP3 and as a result, it is possible to improve dissipation characteristics of heat generated in the semiconductor chip CPL.

The source pad PDLS4 of the semiconductor chip CPL is electrically connected to a pad PDC5 of the main surface of the semiconductor chip CPC through the wire WA (singular or plural). That is, one end of the wire WA is joined to the source pad PDLS4 of the semiconductor chip CPL and the other end of the wire WA is joined to the pad PDC5 of the semiconductor chip CPC.

The lead wire LB is arranged in the vicinity of one of the corner parts of the die pad DP3 in a state of being separated from the die pad DP3 but adjacent thereto. The planar shape of the lead wire LB is formed into a planar L-shaped pattern extending along the short side and the long side intersecting with each other with one corner of the die pad DP 3 sandwiched in between. Because of this, it is possible to reduce the current path of the main circuit, and thus the inductance can be reduced.

Further, to the lead wire LB, a plurality of leads LD3 of the leads LD is connected integrally. That is, the lead wire LB and the leads LD3 are formed integrally. The leads LD3 form the terminal TE2 and the reference potential GND is supplied to the lead LD3 (terminal TE2). Consequently, it is possible to regard the lead wire LB and the leads LD3 connected integrally thereto as the ground terminal part for supplying the ground potential.

By connecting the leads LD3 to the lead wire LB integrally as described above, it is possible to increase the volume more than the case where the leads LD3 are divided, and thus it is possible to reduce the wire resistance and to enhance the reference potential GND. Such a configuration is a configuration that has taken into consideration the fact that an increase in the on-resistance on the source side of the low side power MOSFET QL1 affects considerably an increase in switching loss. That is, by adopting the configuration described above, it is possible to reduce the on-resistance on the source side of the power MOSFET QL1, and thus it is possible to reduce the conduction loss of the power MOSFET QL1. Further, it is possible to enhance the reference potential GND, and therefor, it is possible to improve operation stability.

The die pad (control chip mounting part) DP1 is formed into the shape of approximately a planar rectangle. To the die pad DP1, a plurality of leads LD4 of the leads LD is connected integrally. That is, the die pad PD1 and the leads LD4 are formed integrally. Over the main surface (upper surface) of the die pad DP1, the semiconductor chip CPC in which the control circuit CLC is formed is mounted in a state where the main surface (surface, upper surface) thereof faces upward and the back surface (lower surface) faces the die pad DP1. The semiconductor chip CPC is mounted (face-up bonding) and joined (fixed) over the die pad DP1 on an adhesive layer SD4, but the adhesive layer SD4 may have electric conductivity or insulating properties. The semiconductor chip CPC is also formed into the shape of a planar rectangle. The pads PDC1, PDC2, and PDC3 of the pads formed in the main surface of the semiconductor chip CPC, which are connected to the semiconductor chip CPH (power MOSFET QH1 and sense MOSFET QS1) by the wire WA, are arranged so as to come close to the side on the side on which the pads neighbor the semiconductor chip CPH in the main surface of the semiconductor chip CPC. Furthermore, the pads PDC4 and PDC5 connected to the semiconductor chip CPL (power MOSFET QL1) by the wire WA, are arranged so as to come close to the side on the side on which the pads neighbor the semiconductor chip CPL in the main surface of the semiconductor chip CPC. Because of this, it is possible to further reduce the length of the wire WA, and thus it is possible to further reduce the parasitic inductance caused in the wire path.

Furthermore, a plurality pads PD arranged on the main surface of the semiconductor chip CPC includes, in addition to the pads PDC 1 to PDC5, pads for inputting or outputting each signal of the driver circuits DR1 and DR2, pads for supplying the reference potential GND, etc. These pads (PD) are electrically connected to the leads LD5 of the leads LD, which are not connected to the die pads DP1, DP2, and DP3 through the wires WA. It is also possible for the pads PD arranged on the main surface of the semiconductor chip CPC to include a pad electrically connected to the lead LD4 through the wire WA.

<With Regard to Example of Implementation of Semiconductor Device SM1>

Figure 9:
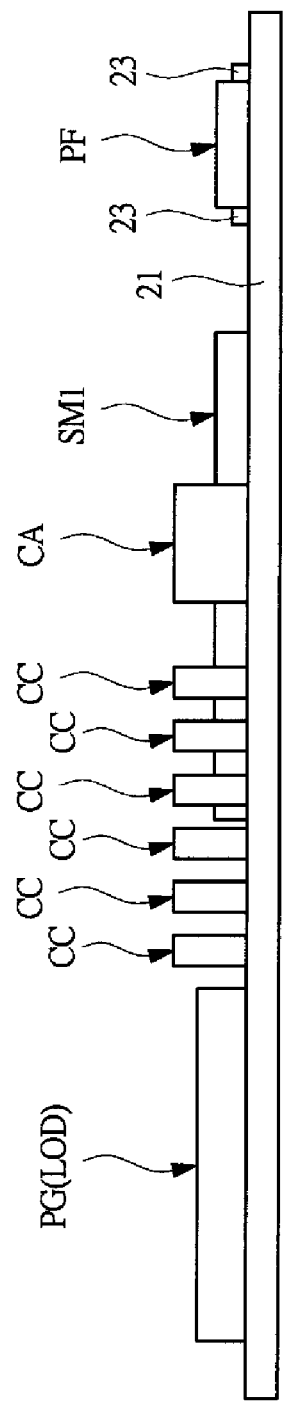
FIG. 9 is a side view of the example of implementation in FIG. 8.

FIG. 8 is a plan view of essential parts showing an example of implementation of the semiconductor device SM1 and FIG. 9 is a side view when FIG. 8 is viewed in the direction represented by an arrow 20.

The wiring substrate (implementation substrate) 21 includes, for example, a printed wiring substrate and on the main surface thereof, the semiconductor device SM1, packages PF and PG, and chip parts CA, CB, and CC are mounted. In FIG. 8, the semiconductor device SM1 becomes transparent so that wires 22a to 22e of the wiring substrate 21 are seen. Further, in FIG. 8, in order to make the drawing intelligible, hatching is attached to the wires 22a, 22b, 22c, 22d, and 22e of the wiring substrate 21 even though it is a plan view.

In the package PF, a control circuit etc. configured to control the semiconductor chip CPC (control circuit CLC) of the semiconductor device SM1 is formed, in the package PG, the load LOD is formed, in the chip part CA, the coil L1 is formed, in the chip part CB, an input capacitor is formed, and in the chip part CC, the output capacitor Cout is formed.

The potential (power source potential) VIN of the input power source is supplied to the lead LD1 of the semiconductor device SM1 and the die pad DP2 through the wire 22a of the wiring substrate 21 and the ground potential GND is supplied to the lead LD3 of the semiconductor device SM1 through the wire 22b of the wiring substrate 21.

To the lead LD5 of the semiconductor device SM1, a lead (terminal) 23 of the package PF is electrically connected through the wire 22c of the wiring substrate 21. The lead LD2, which is the output terminal (corresponding to the output node N1) of the semiconductor device SM1, and the die pad DP3 are electrically connected to one end of the chip part CA (coil L1) through the wire 22d of the wiring substrate 21. The other end of the chip part CA (coil L1) is electrically connected to the wire 22e of the wiring substrate 21.

To the wire 22e, an input lead (terminal) of the package PG (load LOD) is electrically connected. A reference potential lead (terminal) of the package PG (load LOD) is electrically connected to the wire 22b. In addition, between the wires 22b and 22e, the chip part CC (output capacitor Cout) is electrically connected.

Furthermore, the semiconductor device SM1 is implemented on the wiring substrate 21 by solder. That is, the lead LD and the die pads DP2 and DP3 exposed at the back surface (lower surface) of the semiconductor device SM1 are joined and electrically connected to the wires 22a to 22d of the wiring substrate 21 via solder.

<With Regard to Configuration of Semiconductor Chip CPH>

Next, the configuration of the semiconductor chip CPH in which the power MOSFET QH1 and the sense MOSFET QS1 are formed will be explained.

Figure 10:
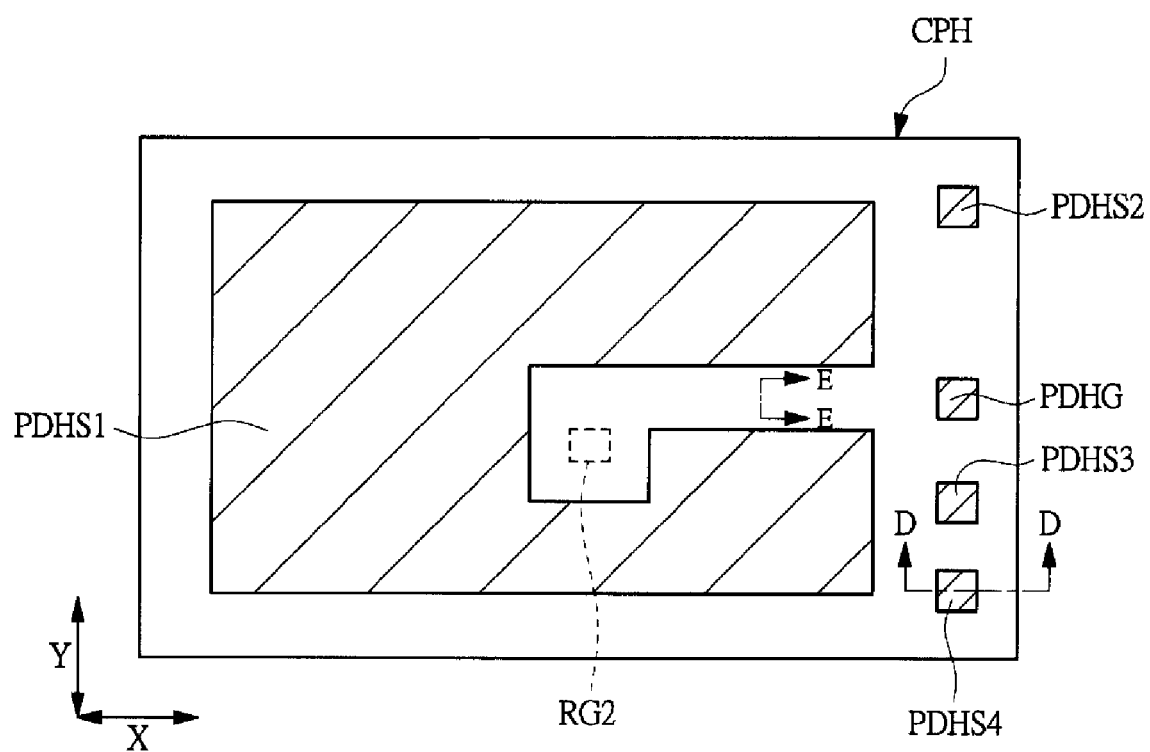
FIG. 10 is a plan view showing a chip layout of a semiconductor chip used in a semiconductor device of an embodiment of the present invention.
Figure 11:
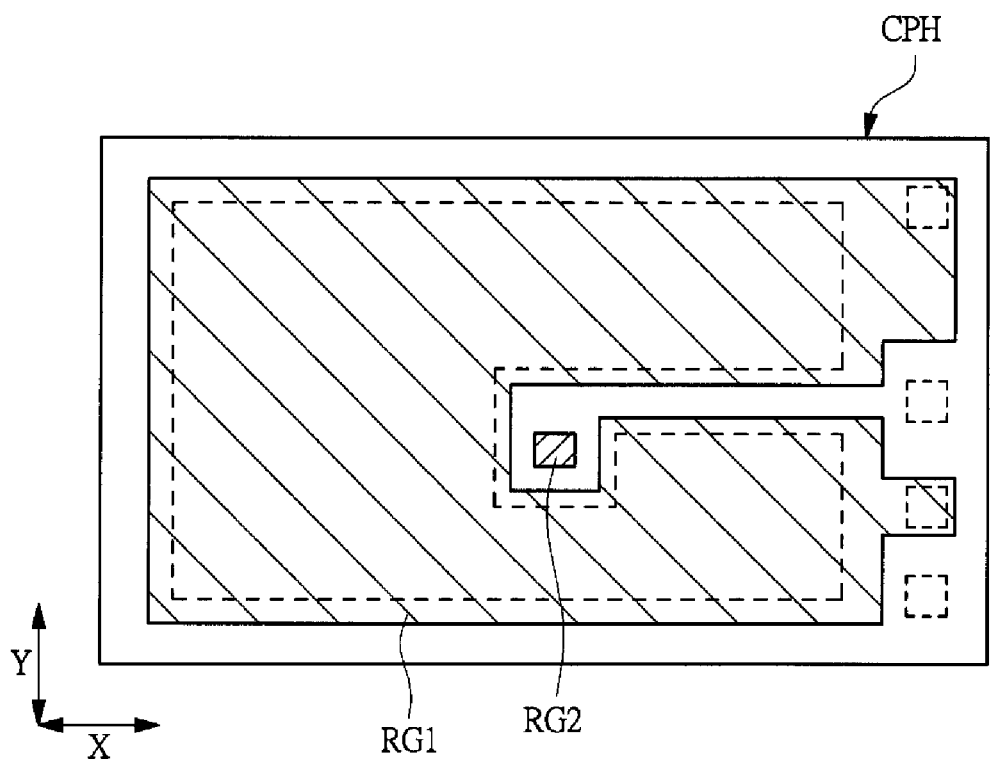
FIG. 11 is a plan view showing a chip layout of a semiconductor chip used in a semiconductor device of an embodiment of the present invention.
Figure 12:
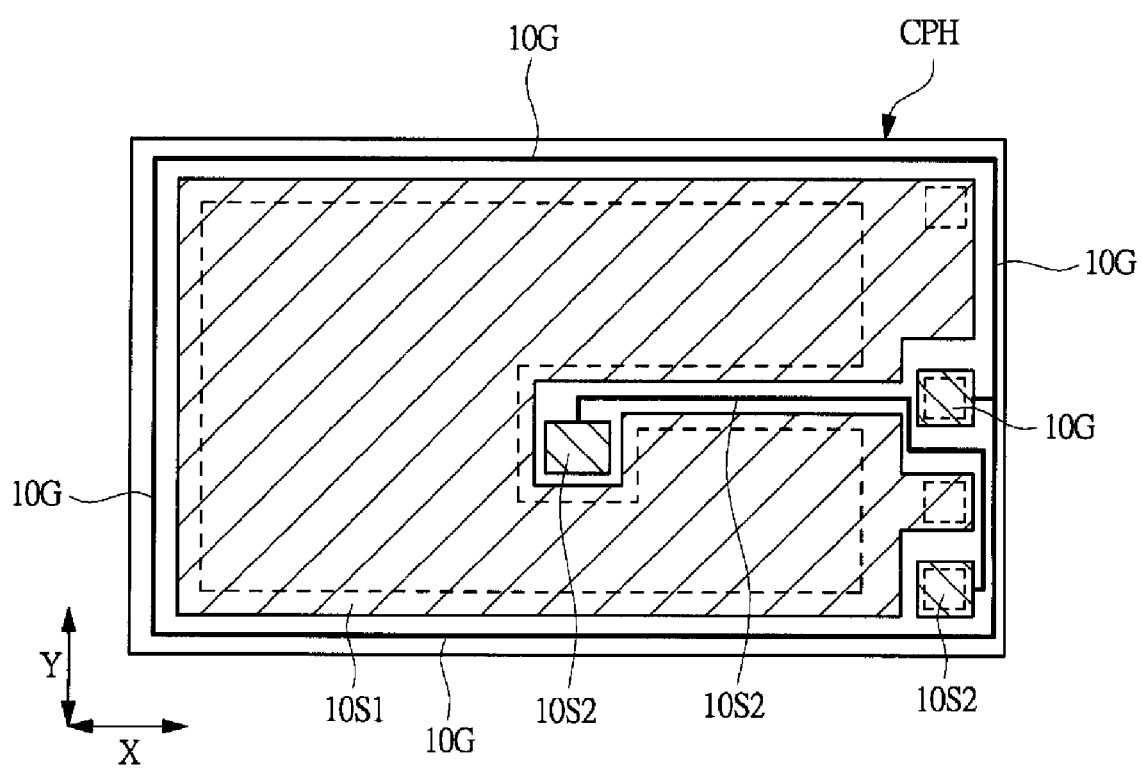
FIG. 12 is a plan view showing a chip layout of a semiconductor chip used in a semiconductor device of an embodiment of the present invention.
Figure 13:
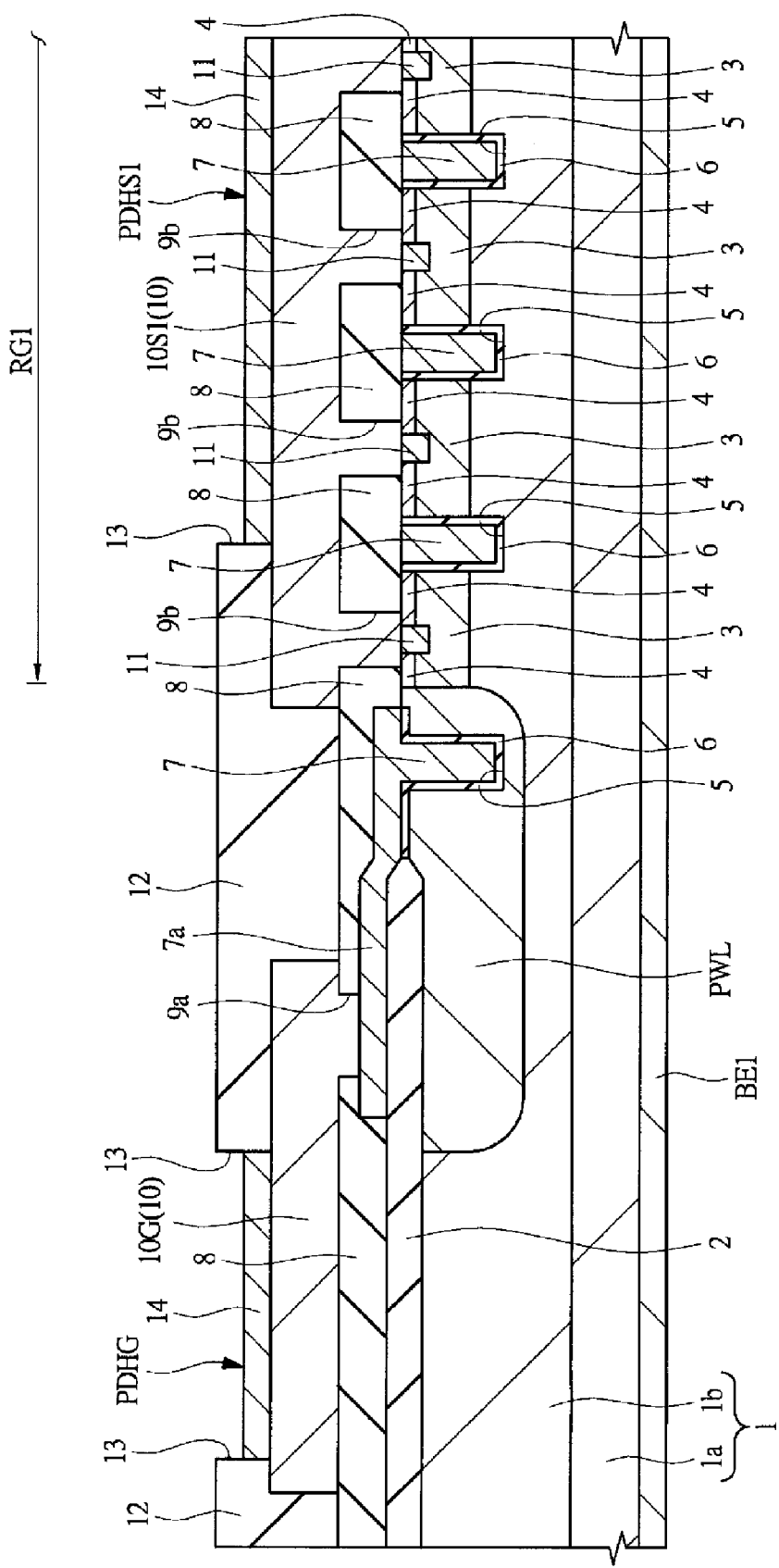
FIG. 13 is a cross-sectional view of essential parts of a semiconductor chip used in a semiconductor device of an embodiment of the present invention.
Figure 14:
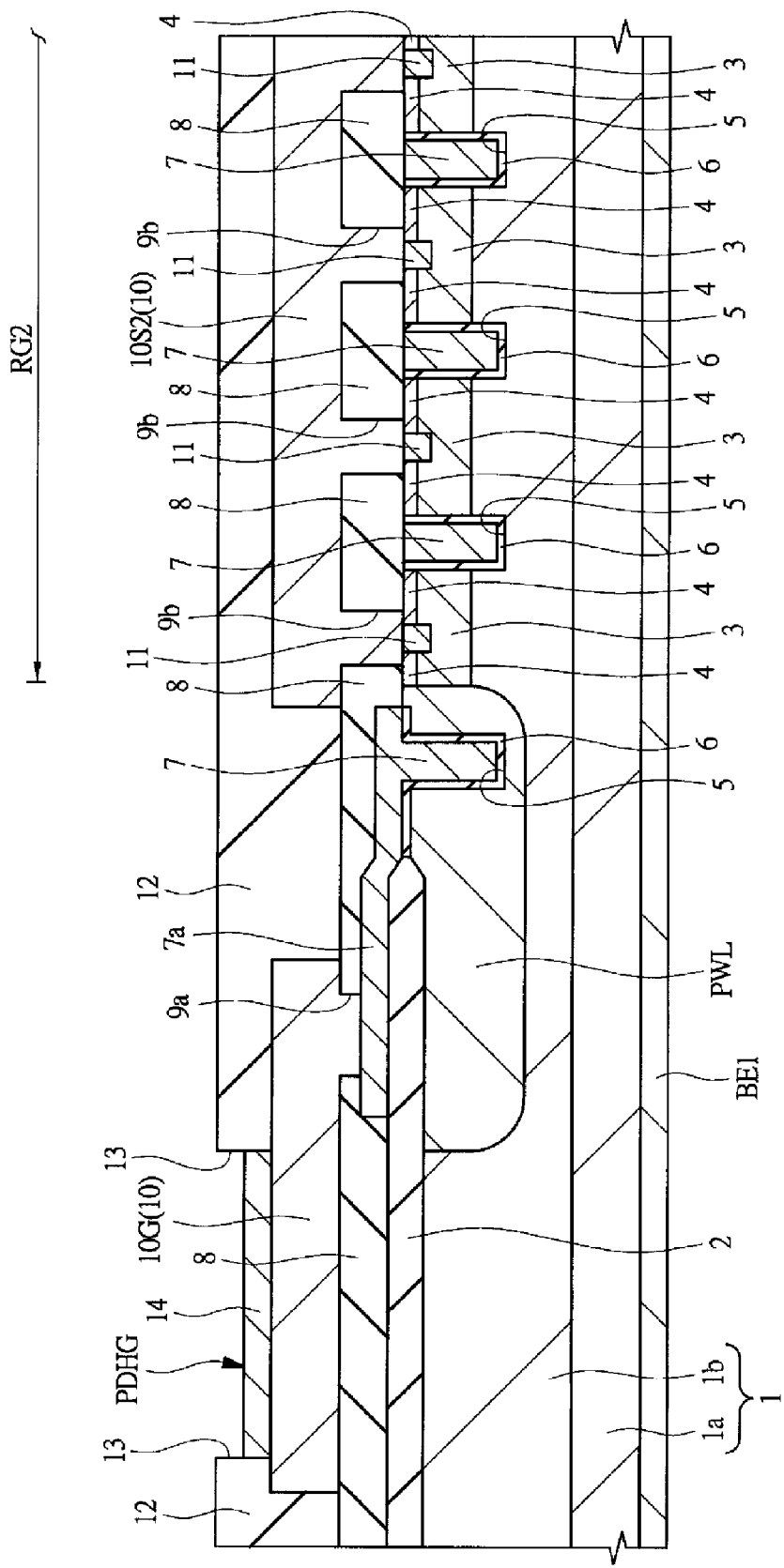
FIG. 14 is a cross-sectional view of essential parts of a semiconductor chip used in a semiconductor device of an embodiment of the present invention.
Figure 15:
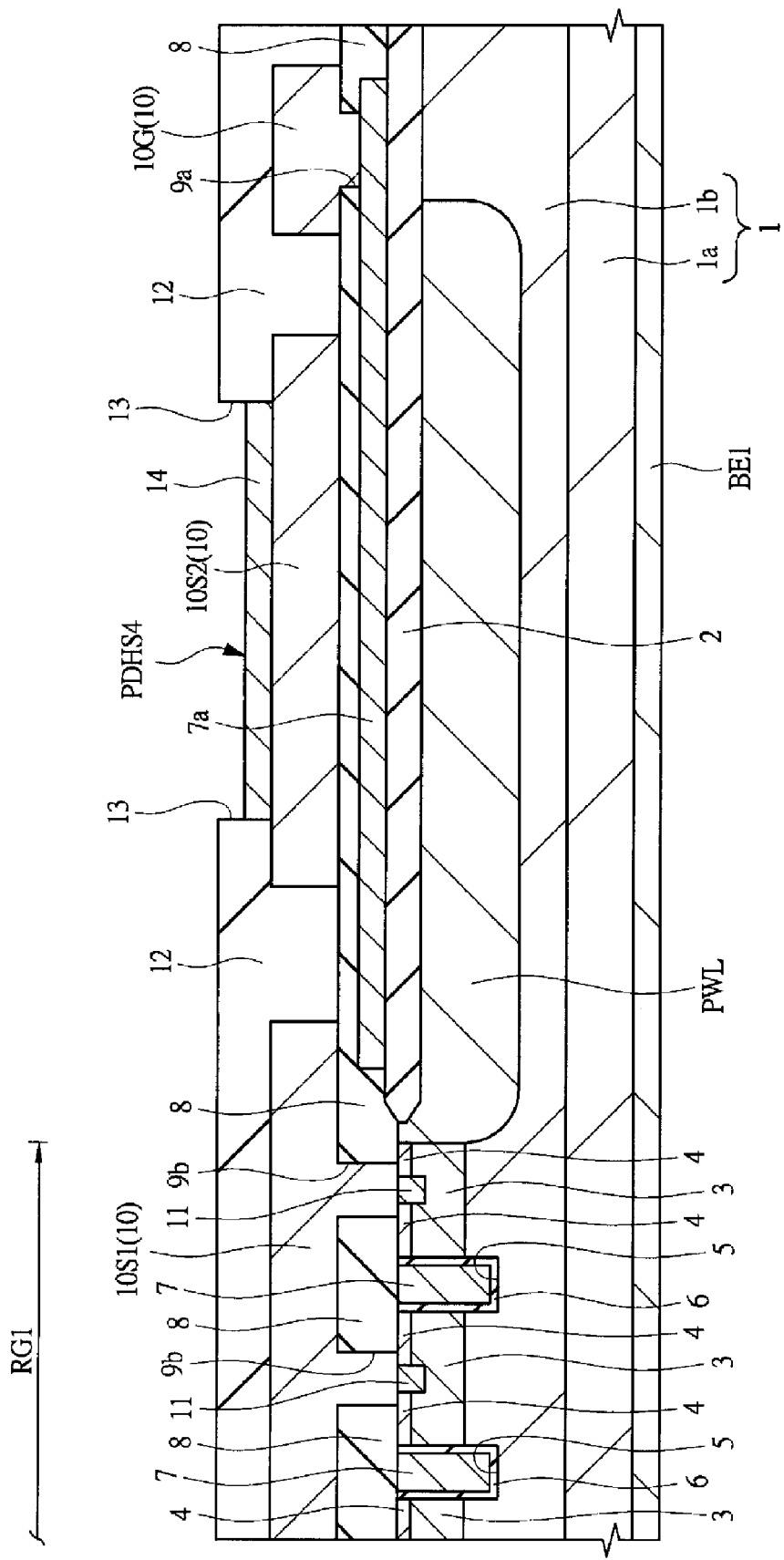
FIG. 15 is a cross-sectional view of essential parts of a semiconductor chip used in a semiconductor device of an embodiment of the present invention.

FIG. 10 to FIG. 12 are plan views showing a chip layout of the semiconductor chip CPH and FIG. 13 to FIG. 16 are cross-sectional views of essential parts of the semiconductor chip CPH. Among these, FIG. 10 corresponds to the top view of the semiconductor chip CPH and although FIG. 10 is a plan view, in order to make understanding easy, hatching is attached to the bonding pads (pads PDHG, PDHS1, PDHS2, PDHS3, and PDHS4) and the position of a sense MOSFET region RG2 is indicated by a dotted line. In FIG. 11, a main MOSFET region RG1 and the sense MOSFET region RG2 in the semiconductor chip CPH are shown with hatching attached and the positions of the bonding pads (pads PDHG, PDHS1, PDHS2, PDHS3, and PDHS4) are indicated by dotted lines. In FIG. 12, the layouts of metal wirings (gate wiring 10G and source wirings 10S1 and 10S2) in the semiconductor chip CPH are indicated by a region attached with hatching and thick lines and the positions of the bonding pads (pads PDHG, PDHS1, PDHS2, PDHS3, and PDHS4) are indicated by dotted lines. Meanwhile, the positions of the bonding pads (pads PDHG, PDHS1, PDHS2, PDHS3, and PDHS4) indicated by dotted lines in FIG. 10 and FIG. 11 correspond to the region shown with hatching attached in FIG. 10. In FIG. 13, the part (range) represented by symbol RG1 corresponds to the cross-sectional view of essential parts of the main MOSFET region RG1 and in FIG. 14, the part (range) represented by symbol RG2 corresponds to the cross-sectional view of essential parts of the sense MOSFET region RG2. In addition, FIG. 15 approximately corresponds to the cross-sectional view along D-D line in FIG. 10 and FIG. 16 approximately corresponds to the cross-sectional view along E-E line in FIG. 10. Meanwhile, in the following, the configuration of the semiconductor chip CPH will be explained with reference to FIG. 10 to FIG. 16, but it is also possible to basically apply the same explanation to the configuration of the semiconductor chip CPL except for the absence of the sense MOSFET region RG2 and the source wiring 10S2.

The power MOSFET QH1 is formed on the main surface of a semiconductor substrate (hereinafter, simply referred to as substrate) 1 configuring the semiconductor chip CPH. As shown in FIG. 13 to FIG. 16, the substrate 1 has, for example, substrate main body (semiconductor substrate, semiconductor wafer) 1a including n$^+$-type single crystal silicon to which, for example, arsenic (As) is introduced and an epitaxial layer (semiconductor layer) 1b including, for example, n$^-$-type single crystal silicon formed over the main surface of the substrate main body 1a. Because of this, the substrate 1 is a so-called epitaxial wafer. In the main surface of the epitaxial layer 1b, a field insulating film (element separation region) 2 including, for example, silicon oxide, is formed. The field insulating film 2 is formed by an insulator, such as silicon oxide, and capable of functioning as an element separation region to specify (define) an active region.

In the main MOSFET region RG1, in an active region surrounded by the field insulating film 2 and a p-type well PWL in the lower layer thereof, a plurality of unit transistor cells configuring the power MOSFET QH1 is formed and the power MOSFET QH1 is formed by these unit transistor cells provided in the main MOSFET region RG1 being connected in parallel. Further, in the sense MOSFET region RG2, in an active region surrounded by the field insulating film 2 and the p-type well PWL in the lower layer thereof, a plurality of unit transistor cells configuring the sense MOSFET QS1 is formed and the sense MOSFET QS1 is formed by these unit transistor cells provided in the sense MOSFET region RG2 being connected in parallel. Each individual unit transistor cell formed in the main MOSFET region RG1 and each individual unit transistor cell formed in the sense MOSFET region RG2 have the same structure (configuration) basically, but the main MOSFET region RG1 and the sense MOSFET region RG2 differ in area and the area of the main MOSFET region RG1 is larger than that of the sense MOSFET region RG2. In other words, the area of the sense MOSFET region RG2 is smaller than that of the main MOSFET region RG1. Because of this, the number of unit transistor cells connected in the power MOSFET QH1 differs from that in the sense MOSFET QS1 and the number of unit transistor cells connected in parallel configuring the sense MOSFET QS1 is smaller than the number of unit transistor cells connected in parallel configuring the power MOSFET QH1. Because of this, if the source potential of the sense MOSFET QS1 is the same as that of the power MOSFET QH1, an electric current smaller than the electric current flowing through the power MOSFET QH1 flows through the sense MOSFET QS1. Each unit transistor cell of the main MOSFET region RG1 and the sense MOSFET region RG2 is formed by, for example, an n-channel MOSFET having a trench gate structure.

The substrate main body 1a and the epitaxial layer 1b have the function as the drain region of the unit transistor cell. On the back surface (the entire back surface) of the substrate (semiconductor chip CPH) 1, the back surface electrode for drain (back surface drain electrode, drain electrode) BE1 is formed. The back surface electrode BE1 is formed by, for example, stacking a titanium (Ti) layer, a nickel (Ni) layer, and a gold (Au) layer in order from the back surface of the substrate 1. In the semiconductor device SM1, the back surface electrode BE1 of the semiconductor chip CPH is joined and electrically connected to the die pad DP2 via the adhesive layer SD1.

A p-type semiconductor region 3 formed in the epitaxial layer 1b in the main MOSFET region RG1 and sense MOSFET region RG2 has the function as the channel formation region of the unit transistor cell. Further, an n$^+$-type semiconductor region 4 formed in the upper part of the p-type semiconductor region 3 has the function as the source region of the unit transistor cell. Consequently, the semiconductor region 4 is a semiconductor region for source.

In the main MOSFET region RG1 and the sense MOSFET region RG2, a groove 5 extending from the main surface in the thickness direction of the substrate 1 is formed in the substrate 1. The groove 5 is formed so as to penetrate from the upper surface of the n$^+$-type semiconductor region 4 through the n$^+$-type semiconductor region 4 and the p-type semiconductor region 3 and terminate in the epitaxial layer 1b in the lower layer thereof. On the bottom surface and side surface of the groove 5, a gate insulating film 6 including silicon oxide etc. is formed. Within the groove 5, a gate electrode 7 is embedded on the gate insulating film 6. The gate electrode 7 includes, for example, a polycrystalline silicon film to which n-type impurities (for example, phosphorus) are introduced. The gate electrode 7 has the function as the gate electrode of the unit transistor cell.

On a part over the field insulating film 2, a gate drawing wiring part 7a including an electrically conductive film in the same layer as that of the gate electrode 7 is formed and the gate electrode 7 and the gate drawing wiring part 7a are formed integrally and electrically connected to each other. The gate drawing wiring part 7a is electrically connected to the gate wiring 10G through a contact hole (opening, through-hole) 9a formed in an insulating film 8 covering the gate drawing wiring part 7a.

The gate wiring 10G is electrically connected to a plurality of the gate electrodes 7 formed in the main MOSFET region RG1 through the gate drawing wiring part 7a, and at the same time, is electrically connected to the gate electrodes 7 formed in the sense MOSFET QS1 through the gate drawing wiring part 7a. Because of this, the gate wiring 10G is electrically connected to the gate electrode 7 of the main MOSFET region RG1 (that is, the gate electrode 7 for the power MOSFET QH1) and the gate electrode 7 of the sense MOSFET region RG2 (that is, the gate electrode 7 for the sense MOSFET QS1).

In contrast, the source wiring 10S1 is electrically connected to the n$^+$-type semiconductor region 4 for source formed in the main MOSFET region RG1 through a contact hole (opening, through-hole) 9b formed in the insulating film 8 of the main MOSFET region RG1. Furthermore, the source wiring 10S1 is electrically connected to a p$^+$-type semiconductor region 11 formed in the upper part of the p-type semiconductor region 3 and between the neighboring n$^+$-type semiconductor regions 4 in the main MOSFET region RG1 and is electrically connected to the p-type semiconductor region for channel formation in the main MOSFET region RG1 therethrough.

In addition, the source wiring 10S2 is electrically connected to the n$^+$-type semiconductor region 4 for source formed in the sense MOSFET region RG2 through the contact hole (opening, through-hole) 9b formed in the insulating film 8 of the sense MOSFET region RG2. Furthermore, the source wiring 10S2 is electrically connected to the p$^+$-type semiconductor region 11 formed in the upper part of the p-type semiconductor region 3 and between the neighboring n$^+$-type semiconductor regions 4 in the sense MOSFET region RG2 and is electrically connected to the p-type semiconductor region 3 for channel formation in the sense MOSFET region RG2 there through.

The gate wiring 10G and the source wirings 10S1 and 10S2 form an electric conductor film 10 over the insulating film 8 in which the contact holes 9a and 9b are formed so as to fill in the contact holes 9a and 9b and are formed by patterning the electric conductor film 10. That is, the gate wiring 10G and the source wirings 10S1 and 10S2 are formed by the patterned electric conductor film 10. In addition, it is also possible to regard the patterned electric conductor film 10 as a wire. The electric conductor film 10 includes a metal film and preferably includes an aluminum film or an aluminum alloy film. Because of this, the gate wiring 10G, the source wiring 10S1, and the source wiring 10S2 include the electric conductor film 10 in the same layer, but are separated from one another.

The electric conductor film 10 (including the gate wiring 10, and the source wirings 10S1 and 10S2) is covered with the insulating protective film (insulating film) 12 including a polyimide resin etc. That is, the protective film 12 is formed over the insulating film 8 so as to cover the electric conductor film 10 (including the gate wiring 10, and the source wirings 10S1 and 10S2). The protective film 12 is a film (insulating film) in the uppermost layer of the semiconductor chip CPH. In the protective film 12, a plurality of openings 13 is formed and from each of the openings 13, a part of the electric conductor film 10 is exposed. The electric conductor film 10 exposed from the opening 13 forms the pad electrode (bonding pad) and the pads PDHG, PDHS1, PDHS2, PDHS3, and PDHS4 are formed respectively by the electric conductor film 10 exposed from the opening 13.

That is, by the gate wiring 10G exposed from the opening 13, the gate pad (pad electrode) PDHG of the power MOSFET QH1 and the sense MOSFET QS1 is formed. Furthermore, by the source wiring 10S1 exposed from the opening 13, the source pads (pad electrode) PDHS1, PDHS2, and PDHS3 of the power MOSFET QH1 are formed. Moreover, by the source wiring 10S2 exposed from the opening 13, the source pad (pad electrode) PDHS4 of the sense MOSFET QS1 is formed. As described above, the source pads PDHS1, PDHS2, and PDHS3 of the power MOSFET QH1 are separated by the protective film 12 in the uppermost layer, but are electrically connected to one another through the source wiring 10S1. In contrast, the source wiring 10S2 is separated from the source wiring 10S1, and thus the source pad PDHS4 of the sense MOSFET QS1 is electrically separated from the source pads PDHS1, PDHS2, and PDHS3 of the power MOSFET QH1 without being short-circuited.

In some cases, on the surface of the pads PDHS1, PDHS2, PDHS3, PDHS4, and PDHG (that is, over the electric conductor film 10 of the part exposed at the bottom part of the opening 13), a metal layer 14 is formed by the plating method etc. The metal layer 14 includes a stacked film of a copper (Cu) film, a nickel (Ni) film, and a gold (Au) film formed in order from bottom or a stacked film of a titanium (Ti) film, a nickel (Ni) film, and a gold (Au) film formed in order from bottom. By forming the metal layer 14, it is possible to suppress or prevent oxidation of the surface of aluminum of the electric conductor film 10.

As can also been seen from FIG. 2 to FIG. 7, in the semiconductor device SM1, the metal plate MP1 is joined to the pad PDHS1 of the pad electrodes of the semiconductor chip CPH, and to the pad electrodes other than that (here, the pads PDHS2, PDHS3, PDHS4, and PDHG), the wire WA is connected.

In the semiconductor chip CPH having such a configuration, the operating current of the unit transistor of the power MOSFET QH1 and the sense MOSFET QS1 flows in the thickness direction of the substrate 1 along the side surface of the gate electrode 7 (that is, the side surface of the groove 5) between the epitaxial layer 1b for drain and the n$^+$-type semiconductor region 4 for source. That is, the channel is formed along the thickness direction of the semiconductor chip CPH.

As described above, the semiconductor chip CPH is a semiconductor chip in which a vertical MOSFET having a trench gate structure is formed and the power MOSFET QH1 and the sense MOSFET QS1 are formed by the trench gate MISFET, respectively. Here, the vertical MOSFET corresponds to a MOSFET in which the electric current between source and drain flows in the thickness direction of the semiconductor substrate (substrate 1) (direction approximately perpendicular to the main surface of the semiconductor substrate).

In addition, here, the case is explained where the n-channel trench gate MISFET is formed as the power MOSFET QH1 and the sense MOSFET QS1. As another aspect, it may also be possible to form a p-channel trench gate MISFET as the power MOSFET QH1 and the sense MOSFET QS1 by reversing the electric conductivities of n type and p type. However, when the p-channel trench gate MISFET is formed as the power MOSFET QH1 and the sense MOSFET QS1, it is preferable to apply a circuit configuration in which the drain side of the power MOSFET QH1 and the drain side of the sense MOSFET QS1 are connected to the output node N1 in the circuit diagram in FIG. 60, to be described later, instead of the circuit in FIG. 1 (that is, a circuit configuration in which the source sides and the drain sides of the power MOSFET QH1 and the sense MOSFET QS1 are reversed in the circuit diagram in FIG. 60).

Furthermore, the structure (cross-sectional structure) of the semiconductor chip CPL is basically the same as the structure (cross-sectional structure) of the semiconductor chip CPH, and the semiconductor chip CPL is a semiconductor chip in which a vertical MOSFET having a trench gate structure is formed in the same substrate as the substrate 1 and the configuration of each unit transistor cell formed in the semiconductor chip CPL is basically the same as that of each unit transistor cell in the semiconductor chip CPH. However, in the semiconductor chip CPL, the sense MOSFET QS1 is not formed, a plurality of unit transistor cells configuring the power MOSFET QH1 is formed in the entire region including both the main MOSFET region RG1 and the sense MOSFET region RG2, and the power MOSFET QH1 is formed by these unit transistor cells being connected in parallel. In the semiconductor chip CPL, the sense MOSFET QS1 is not formed, and thus, the source wiring 10S2 is not also formed. Then, in the case of the semiconductor chip CPL, the gate pad (pad electrode) PDLG of the power MOSFET QH1 is formed by the gate wiring 10G exposed from the opening 13 of the protective film 12 in the uppermost layer of the semiconductor chip CPL, and the pads PDLS1, PDLS2, PDLS3, and PDLS4 are formed by the source wiring 10S1 exposed from the opening 13.

<With Regard to Problem>

In the semiconductor chip CPH, not only the power MOSFET QH1 but also the sense MOSFET QS1 configured to detect an electric current flowing through the power MOSFET QH1 is formed and the semiconductor chip CPH is joined over the electrically conductive die pad DP2, which is the chip mounting part, via the electrically conductive joining material (adhesive layer SD1) and sealed with a resin, and thus the semiconductor device SM1 is formed. The configuration is such that the back surface electrode BE1 is formed on the entire back surface of the semiconductor chip CPH and such that an electric current flows, via the electrically conductive joining material, between the back surface electrode BE1 of the semiconductor chip CPH and the die pad DP2.

However, the inventors of the present invention have found that when thermal stress (for example, thermal load during use, temperature cycle test, etc.) is applied to such a semiconductor device, a crack or peeling is generated in the joining material that joins the semiconductor chip CPH and the die pad DP2 and there is a possibility that the detection precision of an electric current flowing through the power MOSFET QH1 by the sense MOSFET QS1 is reduced due to the crack or peeling. This will be explained below with reference to FIG. 17 to FIG. 20.

Figure 17:
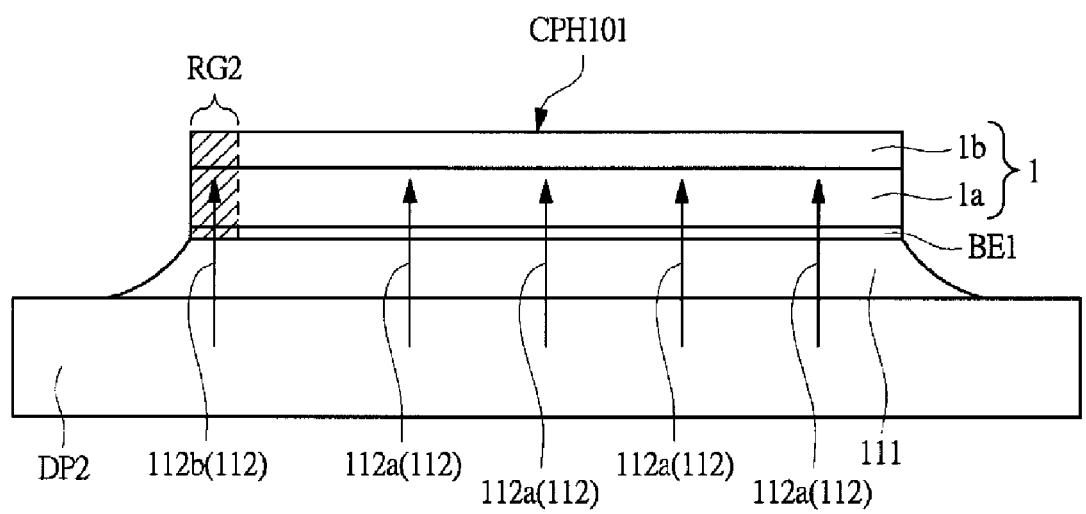
FIG. 17 is an explanatory diagram of a problem.
Figure 18:
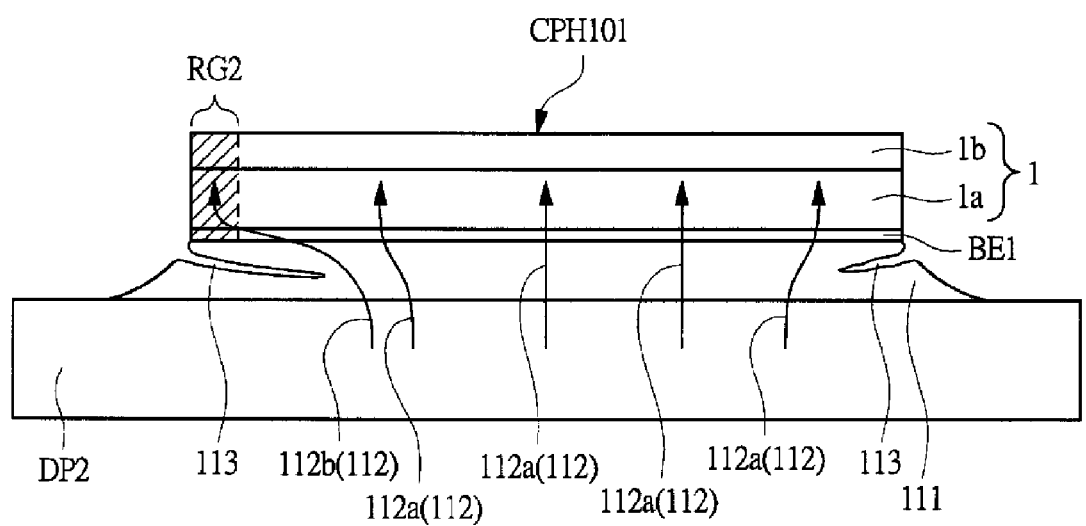
FIG. 18 is an explanatory diagram of a problem.

FIG. 17 and FIG. 18 are explanatory diagrams of the problem and show a state in which a semiconductor chip CPH101 corresponding to the semiconductor chip CPH is mounted and joined over the die pad DP2, on solder 111. Actually, the state is such that the metal plate MP1 and the wire WA are connected to the semiconductor chip CPH101 and sealed with a resin, and thus a semiconductor device (semiconductor package) such as the semiconductor device SM1 is formed and the lower surface of the die pad DP2 is exposed at the lower surface of the sealing resin, but in FIG. 17 and FIG. 18, the sealing part MR, the metal plate MP1, and the wire WA are not shown schematically. Meanwhile, FIG. 17 and FIG. 18 are cross-sectional views, but in order to make the drawings intelligible, hatching is omitted except for the sense MOSFET region RG2.

The position of the sense MOSFET region RG2 in the semiconductor chip. CPH101 is different from that in the semiconductor chip CPH101 in FIG. 17 and in the semiconductor chip CPH, the sense MOSFET region RG2 is located on the periphery of the semiconductor chip CPH101 and in contrast, in the semiconductor chip CPH, the sense MOSFET region RG2 is located closer to the inside (more distant from the periphery) than the case of the semiconductor chip CPH in FIG. 17.

In FIG. 17, the configuration is such that the back surface electrode BE1 is formed on the entire back surface of the semiconductor chip CPH101 and an electric current flows between the back surface electrode BE1 of the semiconductor chip CPH101 and the die pad DP2 via the solder 111. The solder 111 corresponds to the adhesive layer SD1. In FIG. 17, an electric current 112 flowing between the back surface electrode BE1 of the semiconductor chip CPH101 and the die pad DP2 is shown schematically by an arrow. It is assumed that symbol 112a is attached to a part of the electric current 112, which flows through (the unit transistor cells formed in) the main MOSFET region RG1 and this electric current is referred to as an electric current 112a and symbol 112b is attached to a part of the electric current 112, which flows through (the unit transistor cells formed in) the sense MOSFET region RG2 and this electric current is referred to as an electric current 112b. The sum of the electric current 112a and the electric current 112b corresponds to the electric current 112, the electric current flowing through the power MOSFET QH1 (that is, the electric current Idh) corresponds to the electric current 112a, and the electric current flowing through the sense MOSFET QS1 (that is, the electric current Ise) corresponds to the electric current 112b.

However, when thermal stress (for example, a thermal load during use, temperature cycle test, etc.) is applied, there is a possibility that a crack (hereinafter, symbol 113 is attached to this crack and the crack is referred to as a crack 113) is generated in the solder 111. Meanwhile, there may be a case where peeling is generated, but in the present embodiment, explanation will be given on the assumption that peeling is included in the crack.

FIG. 18 shows a state in which the crack 113 has been generated in the solder 111 by thermal stress in FIG. 17. The solder 111 is interposed between the entire back surface of the semiconductor chip CPH101 and the upper surface of the die pad DP2 and the crack 113 is generated on the periphery (outer circumferential part) of the solder 111 and progresses toward the inward direction (in the direction toward the inside). It is hard for the electric current 112 to pass through the region in which the crack 113 has been generated and the region no longer functions as a path of the electric current 112. Because of this, as shown in FIG. 18, the electric current 112 that flows between the back surface electrode BE1 of the semiconductor chip CPH101 and the die pad DP2 skirts the crack 113 and flows through a region in which crack 113 has not been generated in the solder 111 as a result.

However, if the crack 113 is generated in the solder 111 and the electric current 112 flows skirting the crack 113, there is a possibility that the precision when the sense MOSFET QS1 detects the electric current flowing through the power MOSFET QH1 reduces. This will be explained below.

In the semiconductor chip CPH and the semiconductor chip CPH101 shown in FIG. 17 and FIG. 18, the main MOSFET region RG1, a region in which the MOSFET configuring the power MOSFET QH1 is formed, and the sense MOSFET region RG2, a region in which the MOSFET configuring the sense MOSFET QS1 is formed, exit. Then, it is assumed that the area of the main MOSFET region RG1 differs from that of the sense MOSFET region RG2 (the area of the main MOSFET region RG1 is larger than that of the sense MOSFET region RG2) and the ratio between the area of the main MOSFET region RG1 and that of the sense MOSFET region RG2 in the semiconductor chips CPH and CPH101 is set so that the ratio between the electric current flowing through the power MOSFET QH1 and the electric current flowing through the sense MOSFET region RG2 becomes a predetermined ratio, for example, 20,000:1.

When the crack 113 is generated in the solder 111 and the electric current 112 flows skirting the crack 113, the resistance of the path thorough which the electric current 112a flows from the die pad DP2 to (the transistor of) the main MOSFET region RG1 via the solder 111 is not affected so much by the presence/absence of the crack 113 because the area of the main MOSFET region RG1 is larger than that of the sense MOSFET region RG2 and occupies a considerable area of the semiconductor chip CPH101. However, the area of the sense MOSFET region RG2 is much smaller than that of the main MOSFET region RG1 and as shown in FIG. 18, if the crack 113 extends under the sense MOSFET region RG2, the resistance of the path through which the electric current 112 flows from the die pad DP2 to (the transistor of) the sense MOSFET region RG2 via the solder 111 becomes a considerably large resistance value because the path is a circuitous path when the electric current 112b flows skirting the crack 113.

Figure 19:
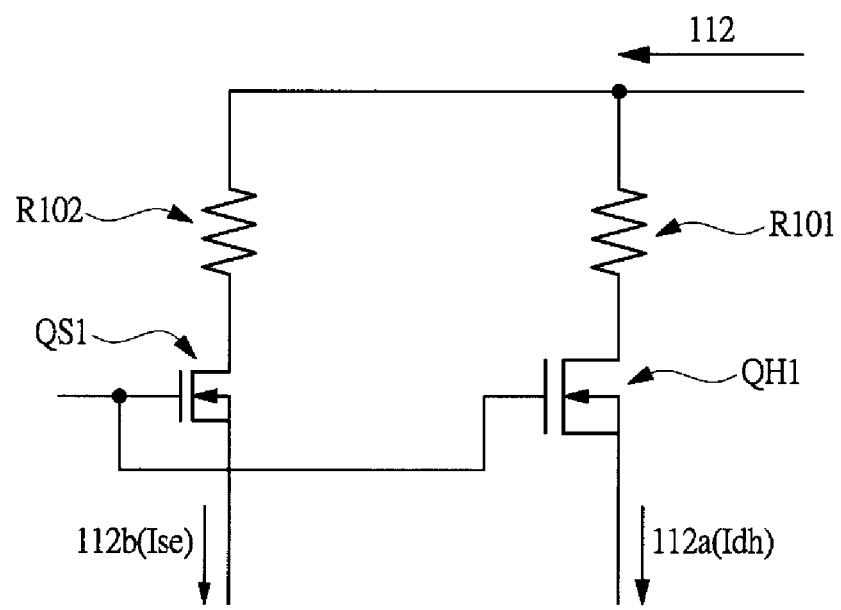
FIG. 19 is an equivalent circuit diagram of the state in FIG. 17.
Figure 20:
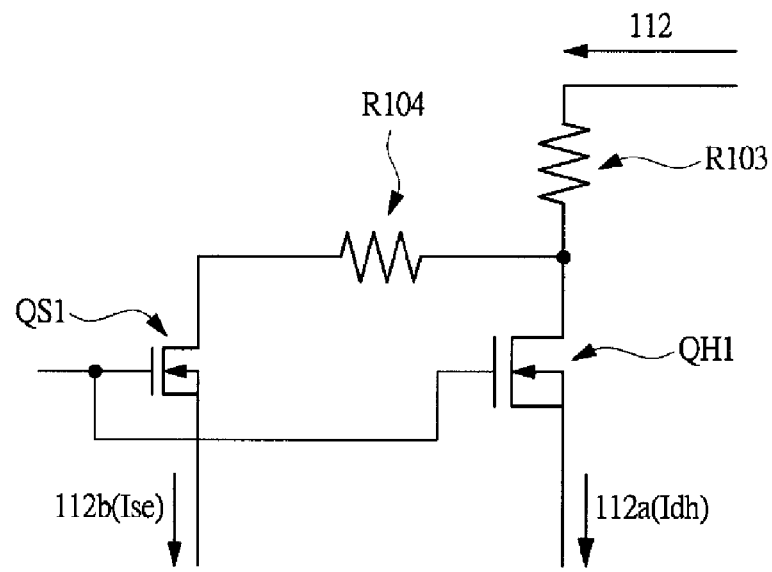
FIG. 20 is an equivalent circuit diagram of the state in FIG. 18.

FIG. 19 is an equivalent circuit diagram in the state in FIG. 17 and FIG. 20 is an equivalent circuit diagram in the state in FIG. 18. In FIG. 19, the electric current 112a (corresponding to the electric current Idh) flows through the power MOSFET QH1 through a resistor R101, the electric current 112b (corresponding to the electric current Ise) flows through the sense MOSFET QS1 through a resistor R102, and the resistors R101 and R102 are formed by the resistance of the solder 111 and the resistance (substrate resistance) of the substrate 1 configuring the semiconductor chip CPH101. In a state where the crack 113 has not been generated as in FIG. 17, the resistor R101 and the resistor. R102 have approximately the same resistance. In contrast, in a state where the crack 113 has been generated as in FIG. 18, the electric current 112a flows through the power MOSFET QH1 through a resistor R103, the electric current 112b flows through the sense MOSFET QS1 through the resistor R103 and a resistor R104, and the resistors R103 and R104 are formed by the resistance of the solder 111 and the resistance (substrate resistor) of the substrate 1 configuring the semiconductor chip CPH101. In a state where the crack 113 has been generated under the sense MOSFET region RG2 as in FIG. 18, the resistance of the resistor R104 is much larger than that of the resistor R103.

Because of this, while the electric current 112$b$ is $\frac{1}{20,000}$ of the electric current 112$a$ when the crack 113 has not been generated, the electric current ratio (electric current 112$a$: electric current 112 $b$=20,000:1) no longer holds and the electric current 112$b$ becomes smaller than $\frac{1}{20,000}$ of the electric current 112$a$ when the crack 113 extends under the sense MOSFET region RG2 as in FIG. 18.

Because of this, even if the semiconductor chip CPH101 is designed originally so that the electric current 112$b$ flowing through the sense MOSFET QS1 is $\frac{1}{20,000}$ of the electric current 112$a$ flowing through the power MOSFET QH1, the electric current 112$b$ flowing through the sense MOSFET QS1 becomes further smaller than $\frac{1}{20,000}$ of the electric current 112$a$ flowing through the power MOSFET QH1 when the crack 113 that has been generated in the solder 111 extends under the sense MOSFET region RG2 as in FIG. 18. For example, in the semiconductor chip CPH101, while the electric current 112$b$ flowing through the sense MOSFET QS1 is $\frac{1}{20,000}$ of the electric current 112$a$ flowing through the power MOSFET QH1 when the crack 113 is absent, the electric current 112$b$ becomes $\frac{1}{24,000}$ of the electric current 112$a$ flowing through the power MOSFET QH1 when the crack 113 as in FIG. 18 is present. Because of this, when detecting the electric current flowing through the power MOSFET QH1 by the sense MOSFET QS1, the precision reduces and the electric current is detected to be an electric current smaller than the electric current that flows actually.

Consequently, when detecting whether or not the electric current 112$a$ flowing through the power MOSFET QH1 exceeds a certain limit value by the sense MOSFET QS1, it is possible to detect with precision by the sense MOSFET QS1 if the crack 113 has not been generated, but when the crack 113 has been generated and extended under the sense MOSFET region RG2, it is not possible to detect successfully by the sense MOSFET QS1 and there is a possibility that the instant at which the electric current 112$a$ flowing through the power MOSFET QH1 exceeds a certain limit value may be overlooked. For example, in the case where the electric current 112$b$ flowing through the sense MOSFET QS1 is $\frac{1}{20,000}$ of the electric current 112$a$ flowing through the power MOSFET QH1 when the crack 113 is absent, but the electric current 112$b$ becomes $\frac{1}{24,000}$ of the electric current 112$a$ flowing through the power MOSFET QH1 resulting from the generation of the crack 113, the sense MOSFET region RG2 detects that the limit value is exceeded when the electric current 112$a$ exceeds 1.2 times the limit value, not the limit, value as a result.

Figure 21:
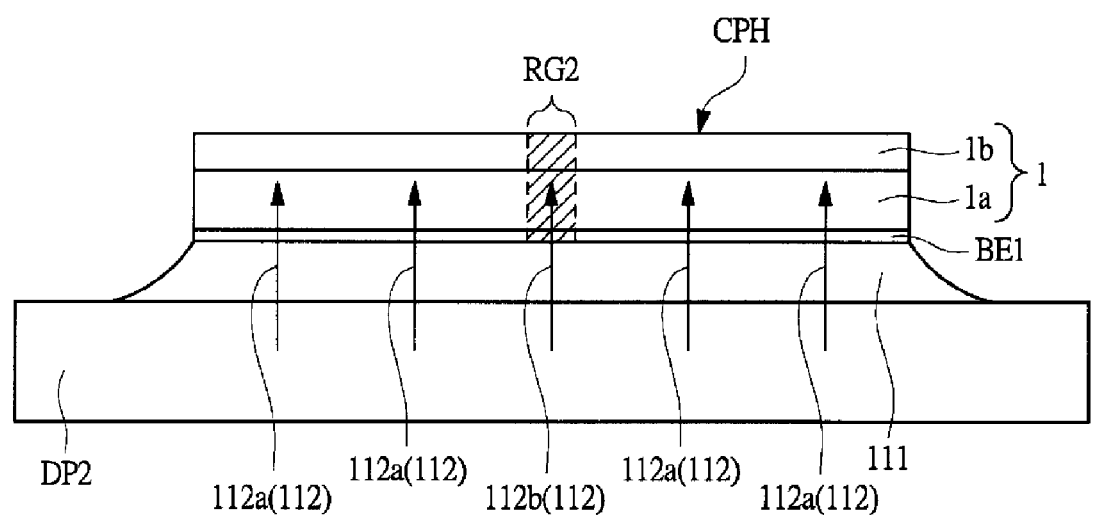
FIG. 21 is an explanatory diagram of a semiconductor device of an embodiment of the present invention.
Figure 22:
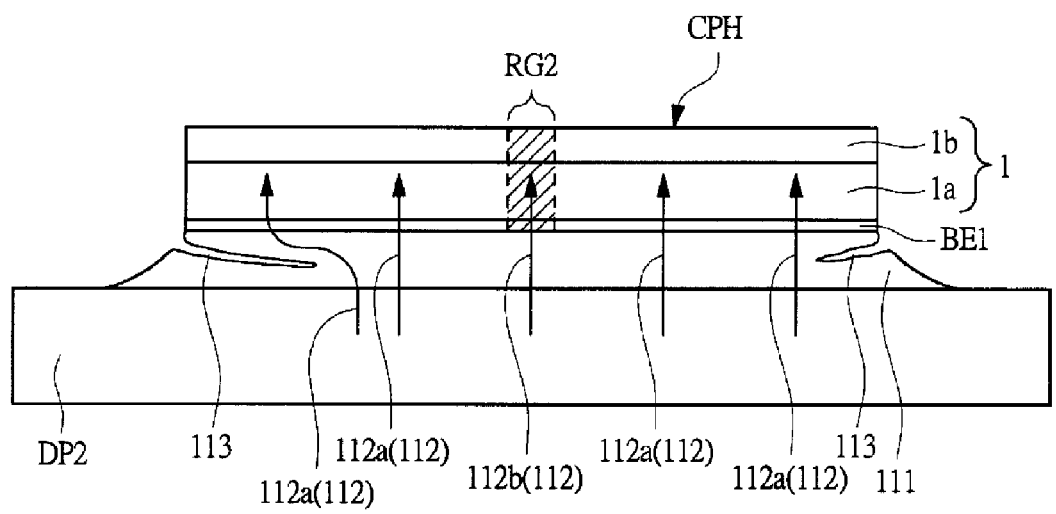
FIG. 22 is an explanatory diagram of a semiconductor device of an embodiment of the present invention.

Such a phenomenon in which the detection precision of the electric current flowing through the power MOSFET QH1 by the sense MOSFET QS1 reduces resulting from the crack 113 is promoted by the generation of the crack 113 under the sense MOSFET region RG2. In order to prevent the phenomenon, in the present embodiment, the layout of the sense MOSFET region RG2 in the semiconductor chip CPH etc. is devised by arranging the sense MOSFET region RG2 in a position hardly affected by the generation of the crack 113. FIG. 21 and FIG. 22 are each an explanatory diagram of the semiconductor device SM1 of the present embodiment, corresponding to FIG. 18 and FIG. 19, respectively.

In FIG. 21, the solder 111 is interposed between the entire back surface of the semiconductor chip CPH and the upper surface of the die pad DP2 and the crack 113 is generated on the periphery (outer circumferential part) of the solder 111 and progresses toward the inward direction (direction toward the inside). Because of this, if the sense MOSFET region RG2 is arranged in the vicinity of the periphery (outer circumferential part) of the semiconductor chip CPH101 as in FIG. 17 and FIG. 18, the crack 113 becomes more likely to be generated under the sense MOSFET region RG2. In contrast to this, in the present embodiment, the sense MOSFET region RG2 is arranged more internally than the vicinity of the periphery (outer circumferential part) of the semiconductor chip CPH as shown in FIG. 21 and FIG. 22 instead of arranging the sense MOSFET region RG2 in the vicinity of the periphery (outer circumferential part) of the semiconductor chip CPH101 where the crack is likely to be generated thereunder. In the examples in FIG. 20 and FIG. 21, the sense MOSFET region RG2 is arranged in the vicinity of the center of the main surface of the semiconductor chip CPH. Because of this, it becomes difficult for the crack 113 to be generated under the sense MOSFET region RG2 (it becomes difficult for the crack 113 to reach there), and thus it becomes easy to maintain the relationship of electric current 112$a$:electric current 112$b$=20,000:1 even if the crack 113 is generated. Because of this, it becomes possible to suppress or prevent the reduction in detection precision of the electric current flowing through the power MOSFET QH1 by the sense MOSFET QS1 resulting from the crack 113. Because of this, it is possible to improve reliability of the semiconductor device.

The problem caused by the crack 113 explained with reference to FIG. 17 to FIG. 20 is generated remarkably in particular when the joining material (die bonding material) for die-bonding the semiconductor chip CPH101 to the die pad DP2 is solder, but the problem may be also generated in the case where the joining material is an electrically conductive joining material (die bonding material) other than solder. Because of this, the present embodiment brings about the significant effect particularly when the joining material (that is, the adhesive layer SD1) for die-bonding the semiconductor chip CPH101 to the die pad DP2 is solder, but the present embodiment is also effective when the joining material is an electrically conductive joining material other than solder, for example, a paste type electrically conductive joining material, such as a silver paste.

As described above, the technical idea of the present embodiment is to devise the arrangement position of the sense MOSFET region RG2 in the semiconductor chip CHP so that even if a crack corresponding to the crack 113 is generated in the electrically conductive adhesive layer SD1 interposed between the semiconductor chip CPH and the die pad DP2, the crack is prevented from existing directly under the sense MOSFET region RG2 as much as possible. That is, the sense MOSFET region RG2 is arranged in a position where the probability of the existence of the crack directly under the sense MOSFET region RG2 is as low as possible even if a crack corresponding to the crack 13 is generated in the electrically conductive adhesive layer SD1 interposed between the semiconductor chip CPH and the die pad DP2.

<With Regard to Layout within Main Surface of Semiconductor Chip CPH>

Hereinafter, the main characteristics of the layout within the main surface of the semiconductor chip CPH are specifically explained including the arrangement position of the sense MOSFET region RG2 with reference to FIG. 10 to FIG. 12.

In the semiconductor chip CPH, not only the power MOSFET QH1 but also the sense MOSFET QS1 configured to detect the electric current flowing through the power MOSFET QH1 is formed. In the present embodiment, as can also be seen from FIG. 10 and FIG. 11, in the main surface of the semiconductor chip CPH, the source pad PDHS4 of the sense MOSFET QS1 and the sense MOSFET region RG2 in which the MOSFET configuring the sense MOSFET QS1 is formed are not arranged in the same planar position (positions that overlap in the vertical direction). Here, the pad PDHS4 is a pad electrode (bonding pad) electrically connected to the source of the sense MOSFET QS1 and the sense MOSFET region RG2 is a region in which the MOSFET configuring the sense MOSFET QS1 (that is, the unit transistor cells connected in parallel for the sense MOSFET QS1) is formed.

Specifically, as can also be seen from FIG. 10 and FIG. 11, in the main surface of the semiconductor chip CPH, the sense MOSFET region RG2 is arranged more internally than the source pad PDHS4 of the sense MOSFET QS1. In other words, in the main surface of the semiconductor chip CPH, the sense MOSFET region RG2 and the pad PDHS4 are arranged so that the pad PDHS4 is nearer to the outer circumferential part of the main surface of the semiconductor chip CPH than the sense MOSFET region RG2. That is, in the main surface of the semiconductor chip CPH, the distance (gap) from the outer circumference in the main surface of the semiconductor chip CPH to the sense MOSFET region RG2 becomes larger (longer) than the distance (gap) from the outer circumference of the main surface of the semiconductor chip CPH to the pad PDHS4.

It is assumed that when determining which one is located closer to the inside of two positions in the main surface of the semiconductor chip CPH, the position the distance (gap) of which from the outer circumference of the main surface of the semiconductor chip CPH is larger is considered to be located more internally than the other.

The reason why the sense MOSFET region RG2 is arranged more internally than the source pad PDHS4 of the sense MOSFET QS1 in the main surface of the semiconductor chip CPH is as follows. That is, even if a crack corresponding to the crack 13 is generated in the adhesive layer SD1, it is because of preventing the crack from extending, as much as possible, to a position under the sense MOSFET region RG2 in the adhesive layer SD1. By arranging the sense MOSFET region RG2 as close as possible to the inside instead of arranging it at the outer circumferential part in the main surface of the semiconductor chip CPH, it is possible to suppress or prevent the formation of a crack corresponding to the crack 113 in a position under the sense MOSFET region RG2 in the adhesive layer SD1. Because of this, it becomes possible to suppress or prevent the decrease in the detection precision of an electric current flowing through the power MOSFET QH1 by the sense MOSFET QS1 resulting from the crack 113, and thus it is possible to improve the detection precision of an electric current flowing through the power MOSFET QH1 by the sense MOSFET QS1. Consequently, it is possible to improve reliability of the semiconductor device. In contrast, the nearer the source pad PDHS4 of the sense MOSFET QS1 is located to the outer circumferential part than to the inside in the main surface of the semiconductor chip CPH, the easier it becomes to connect an electrically conductive member such as the wire WA. Because of this, in the present embodiment, the sense MOSFET region RG2 is arranged more internally than the source pad PDHS4 of the sense MOSFET QS1, in the main surface of the semiconductor chip CPH. Because of this, it is possible to improve the detection precision of an electric current flowing through the power MOSFET QH1 by the sense MOSFET QS1 by suppressing or preventing the formation of a crack in a position under the sense MOSFET region RG2 in the adhesive layer SD1 and at the same time, it is possible to make it easy to connect an electrically conductive member such as the wire WA, to the source pad PDHS4 of the sense MOSFET QS1.

For example, in the case of FIG. 10, in the main surface of the semiconductor chip CPH, the pad PDHS2, the pad PDHG, the pad PDHS3, and the pad PDHS4 are arranged along the side facing the semiconductor chip CPC, the gate pad PDHG is arranged in the vicinity of the center of the side, and the pad PDHS4 is arranged in the vicinity of the end part of the side. Because of this, it becomes easy to perform wire bonding for each pad to which the wire WA is connected in the semiconductor chip CPH.

In the present embodiment, the sense MOSFET region RG2 is arranged more internally than the source pad PDHS4 of the sense MOSFET QS1 in the main surface of the semiconductor chip CPH, and thus the source pad PDHS4 of the sense MOSFET QS1 is not located directly over the sense MOSFET region RG2. Because of this, as can also be seen from FIG. 10 to FIG. 12 and FIG. 14 to FIG. 16, the source region for the sense MOSFET QS1 (corresponding to the semiconductor region 4 of the sense MOSFET region RG2) formed in the sense MOSFET region RG2 and the source pad PDHS4 of the sense MOSFET QS1 are electrically connected via (through) the source wiring (wiring for source) 10S2 formed in the semiconductor chip CPH. Because of this, it is possible to arrange the sense MOSFET region RG2 more internally than the source pad PDHS4 of the sense MOSFET QS1 in the main surface of the semiconductor chip CPH and to accurately connect the source region (corresponding to the semiconductor region 4) formed in the sense MOSFET region RG2 and the source pad PDHS4 of the sense MOSFET QS1 via the source wiring 10S2. The pads PDHS1, PDHS2, and PDHS3 of the semiconductor chip CPH are electrically connected to the source region for the power MOSFET QH1 (corresponding to the semiconductor region 4 of the main MOSFET region RG1) formed in the main MOSFET region RG1 via (through) the source wiring (wiring for source) 10S1 formed within the semiconductor chip CPH.

Furthermore, in the present embodiment, as can also be seen from FIG. 10 and FIG. 11, in the main surface of the semiconductor chip CPH, the sense MOSFET region RG2 is arranged more internally than the gate pad PDHG. In other words, in the main surface of the semiconductor chip CPH, the sense MOSFET region RG2 and the pad PDHG are arranged so that the gate pad PDHG is located nearer to the outer circumferential part of the main surface of the semiconductor chip CPH than the sense MOSFET region RG2. That is, in the main surface of the semiconductor chip CPH, the distance (gap) from the outer circumference of the main surface of the semiconductor chip CPH to the sense MOSFET region RG2 becomes larger (longer) than the distance (gap) from the outer circumference of the main surface of the semiconductor chip CPH to the pad PDHG.

As described above, in the main surface of the semiconductor chip CPH, by arranging the sense MOSFET region RG2 as close as possible to the inside instead of arranging it at the outer circumferential part, it is possible to suppress or prevent the formation of a crack corresponding to the crack 13 in a position under the sense MOSFET region RG2 in the adhesive layer SD1, and thus it is possible to improve the detection precision of an electric current flowing through the power MOSFET QH1 by the sense MOSFET QS1. Consequently, it is possible to improve reliability of the semiconductor device. In contrast, the nearer the gate pad PDHG is arranged to the outer circumferential part than the inside in the main surface of the semiconductor chip CPH, the easier it becomes to connect an electrically conductive member such as the wire WA, to the gate pad PDHG. Because of this, in the present embodiment, in the main surface of the semiconductor chip CPH, the sense MOSFET region RG2 is arranged more internally than the gate pad PDHG. Because of this, it is possible to improve the detection precision of an electric current flowing through the power MOSFET QH1 by the sense MOSFET QS1 by suppressing or preventing the formation of a crack in a position under the sense MOSFET region RG2 in the adhesive layer SD1 and at the same time, it becomes easy to connect an electrically conductive member, such as the wire WA, to the gate pad PDHG.

Furthermore, in the present embodiment, in the main surface of the semiconductor chip CPH, the sense MOSFET region RG2 is arranged more internally than the source pad PDHS4 of the sense MOSFET QS1, but it is preferable for the sense MOSFET region RG2 to be surrounded by the main MOSFET region RG1 in a planar view in the main surface of the semiconductor chip CPH. That is, it is preferable to arrange the sense MOSFET region RG2 in a position surrounded by the main MOSFET region RG1 in which the MOSFET configuring the power MOSFET QH1 (that is, the unit transistor cells connected in parallel for the power MOSFET QH1) is formed. In such a case, it is possible to increase the distance (gap) between the source pad PDHS4 and the sense MOSFET region RG2 in the main surface of the semiconductor chip CPH and at the same time, to increase the area of the main MOSFET region RG1 that occupies the main surface of the semiconductor chip CPH. By increasing the distance (gap) between the source pad PDHS4 and the sense MOSFET region RG2 in the main surface of the semiconductor chip CPH, it is possible to further reduce the possibility that a crack corresponding to the crack 113 is formed in a position under the sense MOSFET region RG2 in the adhesive layer SD1, and thus, it is possible to further improve the detection precision of an electric current flowing through the power MOSFET QH1 by the sense MOSFET QS1. Consequently, it is possible to further improve reliability of the semiconductor device. Further, by increasing the area of the main MOSFET region RG1 that occupies the main surface of the semiconductor chip CPH, it is possible to increase an electric current (corresponding to the electric current Idh) flowing through the power MOSFET QH1 formed in the main MOSFET region RG1, and thus it becomes possible to increase an output current (electric current output from the node N1).

Meanwhile, when referring to "in a planar view", it means that an object is viewed in a plane parallel to the main surface of the semiconductor chip CPH.

In addition, in the present embodiment, it is further preferable if the sense MOSFET region RG2 is surrounded by the source pad PDHS1 of the power MOSFET QH1 in a planar view in the main surface of the semiconductor chip CPH. That is, it is further preferable to arrange the sense MOSFET region RG2 in the position surrounded by the source pad PDHS1 of the power MOSFET QH1. Because of this, it is possible to increase the distance (gap) between the source pad PDHS4 and the sense MOSFET region RG2 in the main surface of the semiconductor chip CPH and at the same time, to increase the area of the source pad PDHS1 of the power MOSFET QH1. By increasing the distance (gap) between the source pad PDHS4 and the sense MOSFET region RG2 in the main surface of the semiconductor chip CPH, it is possible to further reduce the possibility that a crack corresponding to the crack 113 is formed in a position under the sense MOSFET region RG2 in the adhesive layer SD1, and thus it is possible to further improve the detection precision of an electric current flowing through the power MOSFET QH1 by the sense MOSFET QS1. Furthermore, by increasing the area of the source pad PDHS1 of the power MOSFET QH1, it is possible to make it easy to connect an electrically conductive member such as the metal plate MP1, to the source pad PDHS1.

Moreover, by increasing the area of the source pad PDHS1 of the power MOSFET QH1, it also becomes possible to increase the connection area between the source pad PDHS1 and the metal plate MP1, and thus it is possible to reduce the on-resistance of the power MOSFET QH1, make it easy to cause a large current to flow through the power MOSFET QH1, and also to reduce the conduction loss.

Meanwhile, if the main MOSFET region RG1 is located in the position facing each side of the sense MOSFET region RG2 in the main surface of the semiconductor chip CPH, it is possible to regard that the sense MOSFET region RG2 is surrounded by the main MOSFET region RG1 in a planar view. Furthermore, in the main surface of the semiconductor chip CPH, if the source pad PDHS1 of the power MOSFET QH1 is located in the position facing each side of the sense MOSFET region RG2, it is possible to regard that the sense MOSFET region RG2 is surrounded by the source pad PDHS1 of the power MOSFET QH1 in a planar view.

Moreover, as described above, it is necessary to electrically connect the source region (corresponding to the semiconductor region 4) of the sense MOSFET region RG2 and the source pad PDHS4 of the sense MOSFET QS1 via the source wiring 10S2, and thus it is not possible to arrange the main MOSFET region RG1 or the source wiring 10S1, in the planar region in which the source wiring 10S2 and the gate wiring 10G extend. Because of this, the sense MOSFET region RG2 is surrounded by the main MOSFET region RG1 except for the planar region in which the source wiring 10S2 and the gate wiring 10G extend, and the sense MOSFET region RG2 is surrounded by the source pad PDHS1 except for the planar region in which the source wiring 10S2 and the gate wiring 10G extend.

Figure 23:
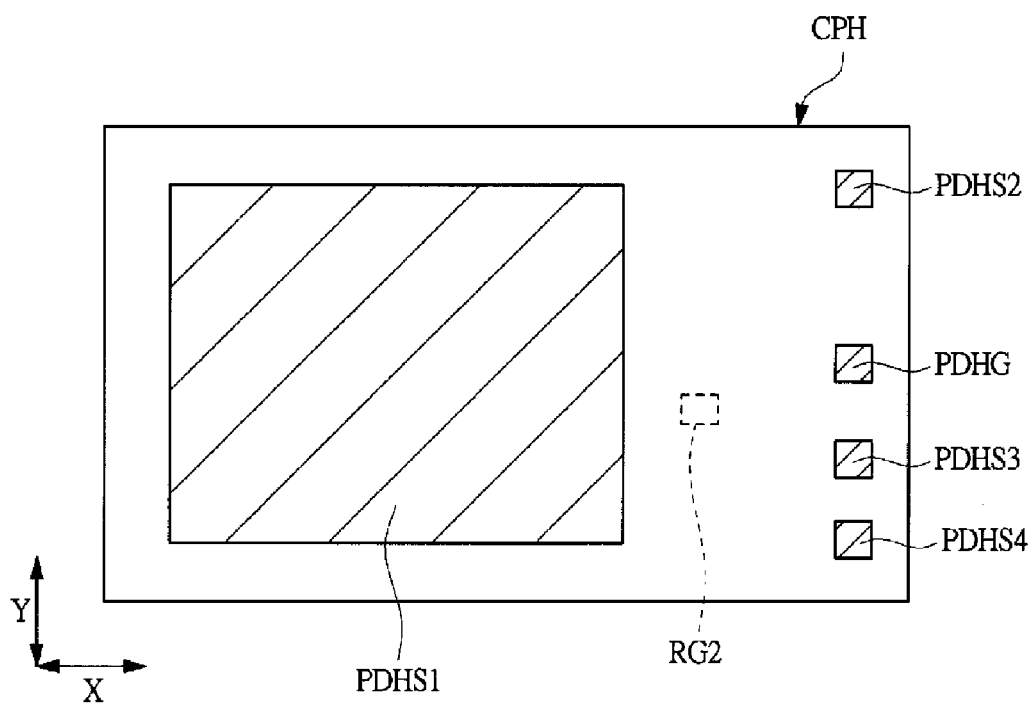
FIG. 23 is a plan view showing a chip layout of a semiconductor chip used in a semiconductor device of an embodiment of the present invention.
Figure 24:
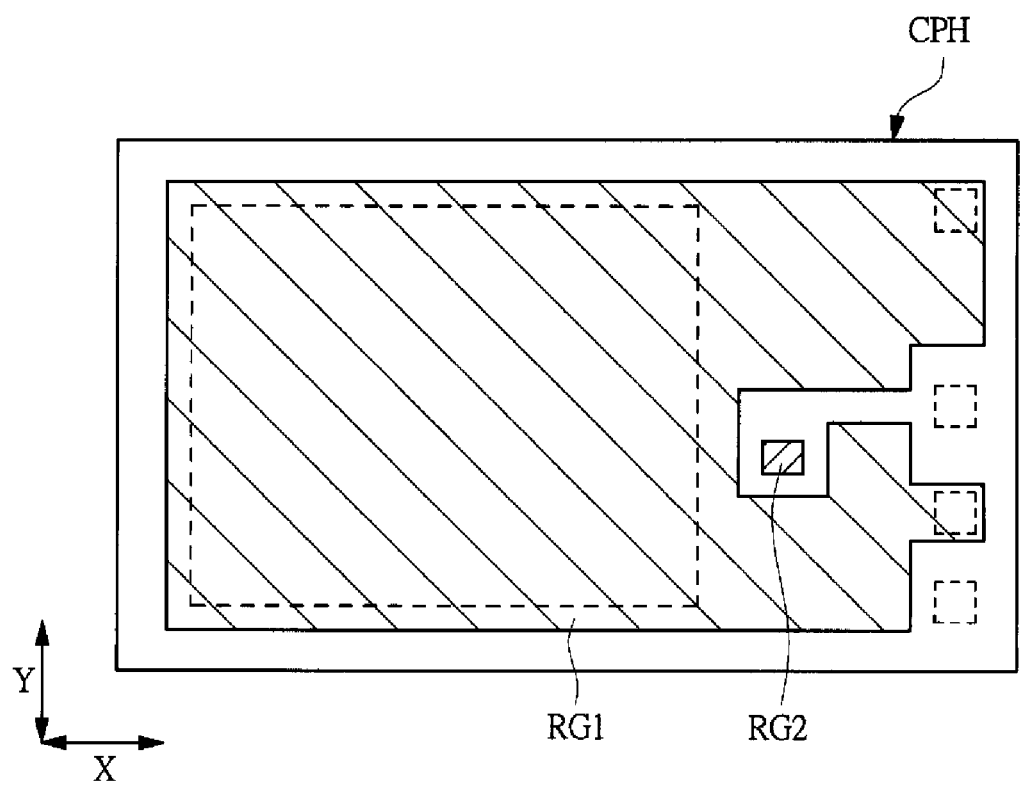
FIG. 24 is a plan view showing a chip layout of a semiconductor chip used in a semiconductor device of an embodiment of the present invention.
Figure 25:
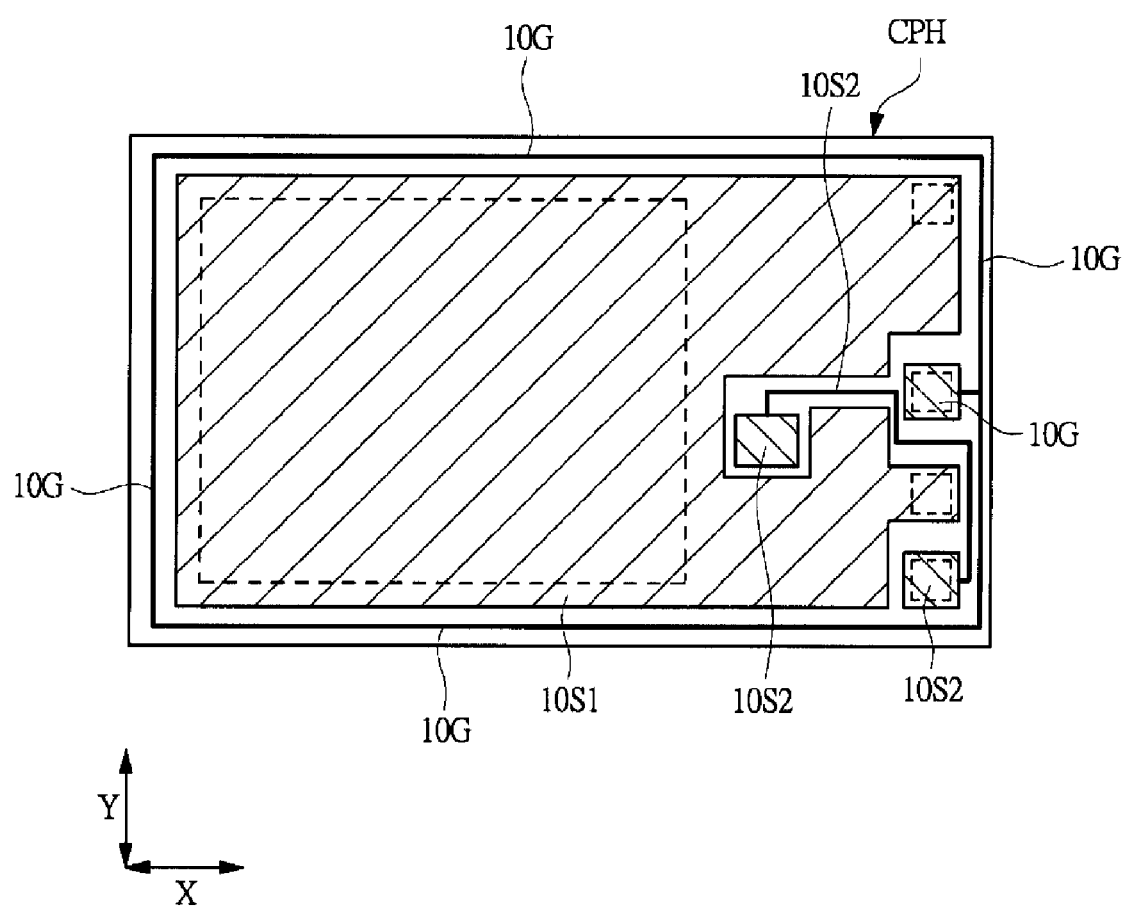
FIG. 25 is a plan view showing a chip layout of a semiconductor chip used in a semiconductor device of an embodiment of the present invention.

FIG. 23 to FIG. 25 are plan views showing the chip layout of the semiconductor chip CPH when the arrangement position of the sense MOSFET region RG2 comes closer to the outer circumferential part of the main surface of the semiconductor chip CPH than in the case of FIG. 10 to FIG. 12 and FIG. 23 corresponds to FIG. 10, FIG. 24 corresponds to FIG. 11, and FIG. 25 corresponds to FIG. 12. Even in the case of the chip layout in FIG. 23 to FIG. 25, it is possible to obtain the above-described effects because the sense MOSFET region RG2 is arranged more internally than the source pad PDHS4 of the sense MOSFET QS1 in the main surface of the semiconductor chip CPH etc., but it is further preferable to arrange the sense MOSFET region RG2 in the vicinity of the center of the main surface of the semiconductor chip CPH as in FIG. 10 to FIG. 12. When the crack 113 is generated in the adhesive layer SD1, the crack 113 is generated on the periphery (outer circumferential part) of the adhesive layer SD1 and progresses toward the inward direction (direction toward inside). Because of this, the adhesive layer SD1 under the vicinity of the center of the semiconductor chip CPH is the region in which a crack is most unlikely to be generated. Consequently, if the sense MOSFET region RG2 is arranged in the vicinity of the center of the main surface of the semiconductor chip CPH, it is possible to reduce the possibility to the minimum that a crack corresponding to the crack 113 is formed in a position under the sense MOSFET region RG2 in the adhesive layer SD1, and thus it is possible to further improve the detection precision of an electric current flowing through the power MOSFET QH1 by the sense MOSFET QS1. Consequently, it is possible to further improve reliability of the semiconductor device. This is the same in each of modified examples below.

Hereinafter, various modified examples of the present embodiment will be explained.

<With Regard to First Modified Example of Layout within Main Surface of Semiconductor Chip CPH>

Figure 26:
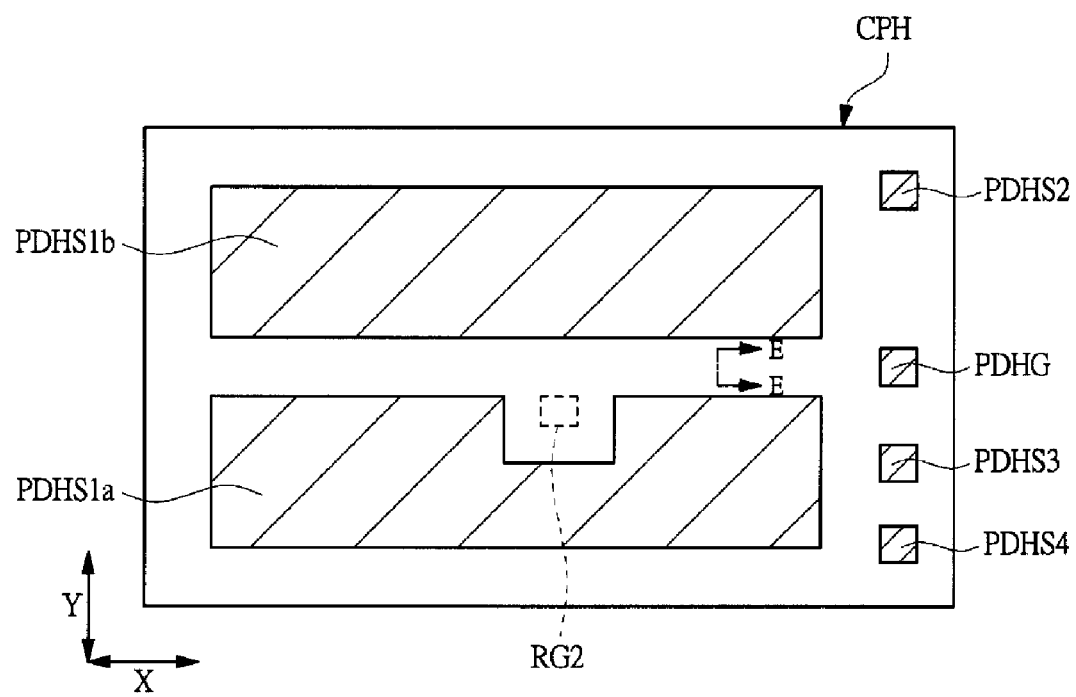
FIG. 26 is a plan view showing a chip layout of semiconductor chip of a first modified example.
Figure 27:
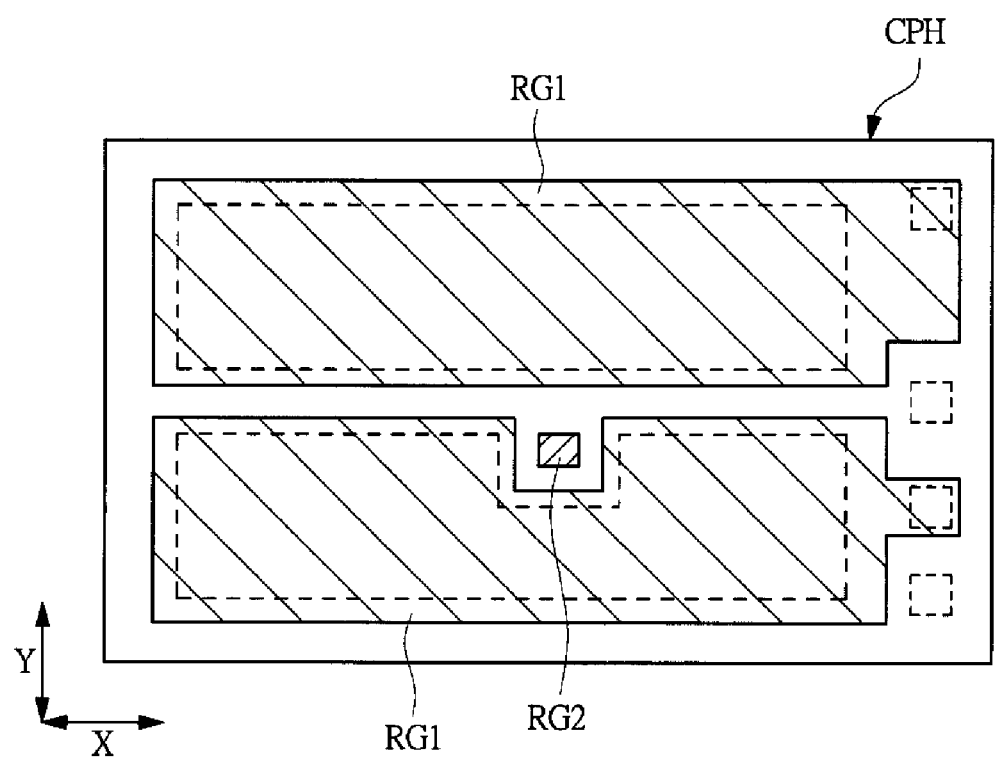
FIG. 27 is a plan view showing the chip layout of the semiconductor chip of the first modified example.
Figure 28:
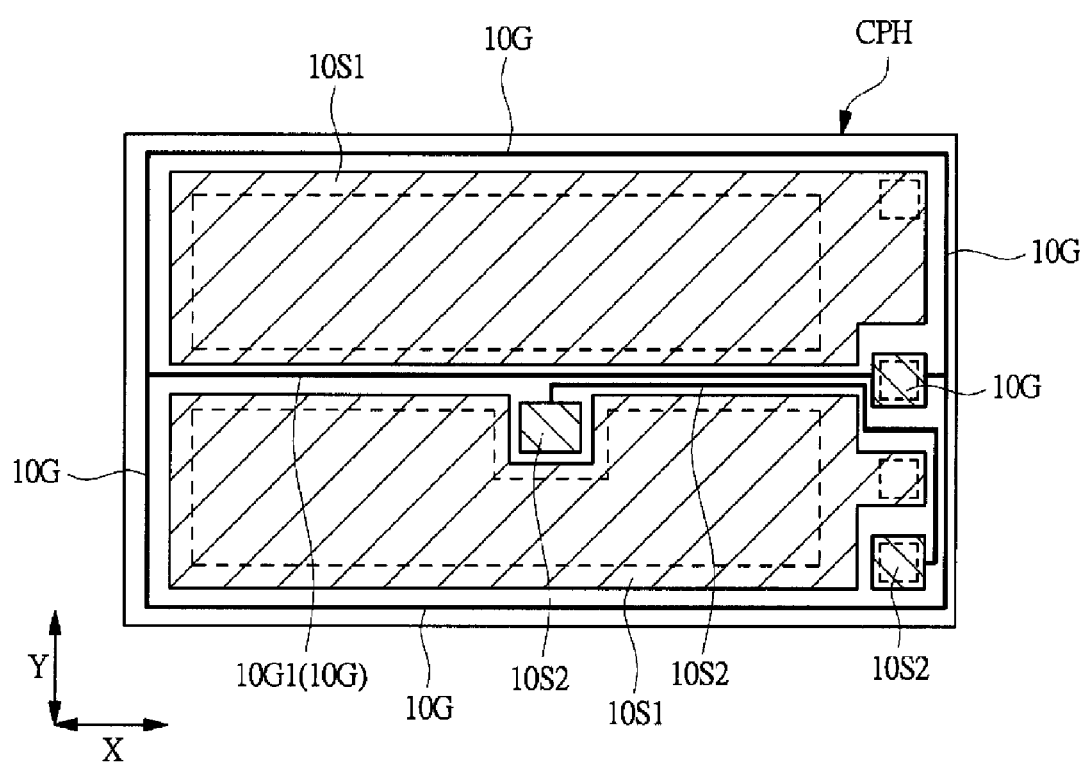
FIG. 28 is a plan view showing the chip layout of the semiconductor chip of the first modified example.
Figure 29:
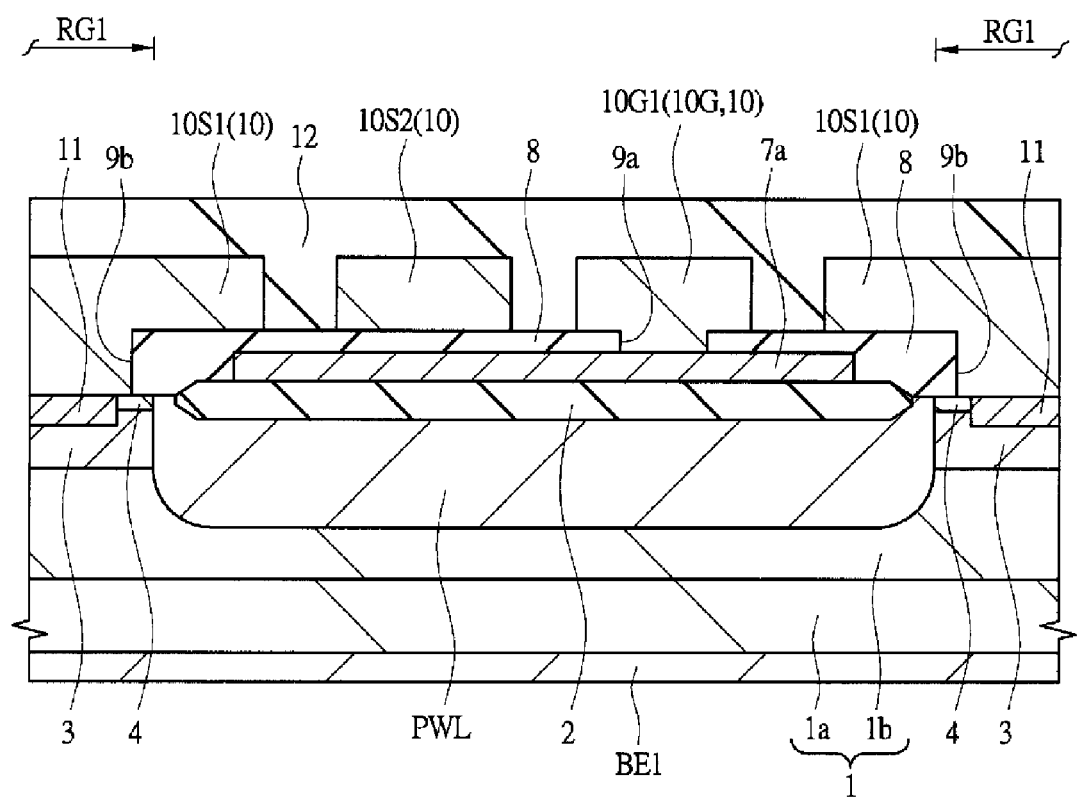
FIG. 29 is a cross-sectional view of essential parts of the semiconductor chip of the first modified example.

FIG. 26 to FIG. 28 are plan views showing a chip layout in a first modified example of the semiconductor chip CPH of the present embodiment and FIG. 26 corresponds to FIG. 10, FIG. 27 corresponds to FIG. 11, and FIG. 28 corresponds to FIG. 12. FIG. 29 is a cross-sectional view along E-E line in FIG. 6 and corresponds to FIG. 16.

In the first modified example shown in FIG. 26 to FIG. 29, instead of the source pad PDHS1, source pads PDHS1a and PDHS1b are formed in the main surface of the semiconductor chip CPH. Like in the case of the pad PDHS1, the source pads PDHS1a and PDHS1b are electrodes (pad electrode, electrode pad, bonding pad) for connecting the metal plate MP1. Moreover, like in the case of the pad PDHS1, the source pads PDHS1a and PDHS1b are electrically connected to the source region (corresponding to the semiconductor region 4) for the power MOSFET QH1 formed in the main MOSFET region RG1 via (through) the source wiring (wiring for source) 10S1 formed within the semiconductor chip CPH. That is, like in the case of the pad PDHS1, the source pads PDHS1a and PDHS1b are pads electrically connected to the source of the power MOSFET QH1.

The source pads PDHS1a and PDHS1b are larger than the gate pad PDHG and the source pads PDHS2, PDHS3, and PDHS4 and are each formed into the shape of approximately rectangle extending along a longitudinal direction (the first direction X) of the main surface of the semiconductor chip CPH. In the main surface of the semiconductor chip CPH, the pad PDHS1a and the pad PDHS1b are arranged with a predetermined distance apart from each other in the second direction Y. However, in a planar view, in the source pad PDHS1a, of the four sides of the rectangle, a part of the side (preferably, in the vicinity of the central part of the side) on the side facing the pad source PDHS1b is set back in the direction in which the distance from the source pad PDHS1b increases and in the region into which the part is set back, the sense MOSFET region RG2 is arranged.

Like in the case of the source pad PDHS1, the source pads PDHS1a and PDHS1b are also electrodes (pad electrode, electrode pad, bonding pad) for connecting the metal plate MP1 and the first part MP1a of the metal plate MP1 is joined and electrically connected to the source pads PDHS1a and PDHS1b of the semiconductor chip CPH via the adhesive layer SD2. Because of this, the source pads PDHS1a and PDHS1b of the semiconductor chip CPH and the die pad DP3 are electrically connected via the metal plate MP1.

As can also be seen from FIG. 26 to FIG. 29, in the main surface of the semiconductor chip CPH, the gate wiring (wiring for gate) 10G extends (specifically, extends in the first direction X) between the source pad PDHS1a and the source pad PDHS1b in a planar view. Of the gate wiring 10G, a part of the gate wiring 10G, which extends between the source pad PDHS1a and the source pad PDHS1a in a planar view is attached with symbol 10G1 and is referred to as a gate wiring 10G1. The gate wiring 10G1 is connected to the wiring part (gate drawing wiring part) 7a, and electrically connected to the gate electrodes 7 formed in the main MOSFET region RG1 via the wiring part 7a, and electrically connected to the gate electrodes 7 formed in the sense MOSFET region RG2 via the wiring part 7a. The gate wiring 10G1 (the gate wiring 10G other than the gate wiring 10G1 is also included) is a wire (wiring for gate) that electrically connects the gate pad PDHG and the gate electrode 7 for the power MOSFET QH1 formed in the main MOSFET region RG1 and the gate electrode 7 for the sense MOSFET QS1 formed in the sense MOSFET region RG2, and formed in the same layer as that of the source wirings 10S1 and 10S2.

That is, in the case of FIG. 10 to FIG. 12, the gate wiring 10G is formed along the outer circumferential part of the main surface of the semiconductor chip CPH, but in the case of the first modified example in FIG. 26 to FIG. 29, not only the gate wiring 10G formed along the outer circumferential part of the main surface of the semiconductor chip CPH but also the gate wiring 10G (that is, the gate wiring 10G1) extending between the source pad PDHS1a and the source pad PDHS1b is formed.

Each source region (corresponding to the semiconductor region 4 of the main MOSFET region RG1) for the power MOSFET QH1 is connected to the source wiring 10S1 extending directly thereover and each source region (corresponding to the semiconductor region 4 of the sense MOSFET region RG2) for the sense MOSFET QS1 is connected to the source wiring 10S2 extending directly thereover and the gate wiring 10G including the gate wiring 10G1 is formed in the same layer as that of the source wirings 10S1 and 10S2. Because of this, directly under the gate wiring 10G1 extending between the source pad PDHS1a and the source pad PDHS1b, the unit transistor cell is not formed and directly under the source wiring 10S1, the unit transistor cell is formed.

By extending the gate wiring 10G1 between the source pad PDHS1a and the source pad PDHS1b in a planar view in n the main surface of the semiconductor chip CPH, it is possible to reduce the gate resistance. Because of this, it is possible to suppress or prevent the delay of the operation of each unit transistor cell in the main MOSFET region RG1 and it is also possible to suppress or prevent the delay of the operation of each unit transistor cell in the sense MOSFET region RG2.

In addition, in the first modified example shown in FIG. 26 to FIG. 29, the source wiring 10S2 extends (specifically, extends in the first direction X) along the gate wiring 10G1 between the source pad PDHS1a and the source pad PDHS1b in a planar view in the main surface of the semiconductor chip CPH.

It is necessary to connect each source region (corresponding to the semiconductor region 4 of the main MOSFET region RG1) for the power MOSFET QH1 to the source wiring 10S1 extending directly thereover, and thus it is not possible to form the unit transistor cell for the power MOSFET QH1 directly under the source wiring 10S2. Furthermore, as described above, it is also not possible to form the unit transistor cell directly under the gate wiring 10G1. That is, it is not possible to form the unit transistor cell for the power MOSFET QH1 directly under the gate wiring 10G1 or the source wiring 10S1. Because of this, as shown in FIG. 26 to FIG. 29, by extending (specifically, extending in the first direction X) the gate wiring 10G1 and the source wiring 10S2 between the source pad PDHS1a and the source pad PDHS1b in such a manner that the gate wiring 10G1 and the source wiring 10S2 are along each other in the main surface of the semiconductor chip CPH, it is possible to reduce (the area of) the region in which the unit transistor cell for the power MOSFET QH1 cannot be formed in the main surface of the semiconductor chip CPH. Because of this, it is possible to increase the area (that is, the area in which the unit transistor cell for the power MOSFET QH1 is formed) of the main MOSFET region RG1 that occupies the main surface of the semiconductor chip CPH. Consequently, it is possible to increase the electric current flowing through the power MOSFET QH1 formed in the main MOSFET region RG1, and thus it becomes possible to increase the output current (electric current output from the node N1).

In the chip layout in FIG. 10 to FIG. 12, the sense MOSFET region RG2 is surrounded by the pad PDHS1 in a planar view in the main surface of the semiconductor chip CPH, but in the first modified example shown in FIG. 26 to FIG. 29, the sense MOSFET region RG2 is surrounded by the pads PDHS1*a* and PDHS1*b* in a planar view in the main surface of the semiconductor chip CPH.

As described above, in the main surface of the semiconductor chip CPH, if the pads PDHS1*a* and PDHS1*b* are located in the position facing each side of the sense MOSFET region RG2, it is possible to regard that the sense MOSFET region RG2 is surrounded by the pads PDHS1*a* and PDHS1*b* in a planar view. In the case of FIG. 26, the state is such that the three sides (three sides except one on the side on which the source wiring 10S2 and the gate wiring 10G1 extend) of the sense MOSFET region RG2 oppose the source pad PDHS1*a* of the power MOSFET QH1 and the one remaining side of the sense MOSFET region RG2 opposes the pad PDHS1*b*, and thus it is possible to regard that the sense MOSFET region RG2 is surrounded by the source pads PDHS1*a* and PDHS1*b* of the power MOSFET QH1 in a planar view. Further, in the case of FIG. 26, it can also be said that the three sides of the sense MOSFET region RG2 are surrounded by the PDHS1*a* in a planar view in the main surface of the semiconductor chip CPH. In a second modified example in FIG. 30 to FIG. 32, the state is such that the three sides (three sides except one on the side on which the source wiring 10S2 and the gate wiring 10G1 extend) of the sense MOSFET region RG2 oppose the main MOSFET region RG1 and the one remaining side of the sense MOSFET region RG2 opposes another main MOSFET region RG1, and thus, it is possible to regard that the sense MOSFET region RG2 is surrounded by the main MOSFET region RG1 in a planar view.

Other configurations of the chip layout in the first modified example shown in FIG. 26 to FIG. 29 are basically the same as those of the chip layout in FIG. 10 to FIG. 16, and thus the explanation thereof is omitted here.

<With Regard to Second Modified Example of Layout within Main Surface of Semiconductor Chip CPH>

Figure 16:
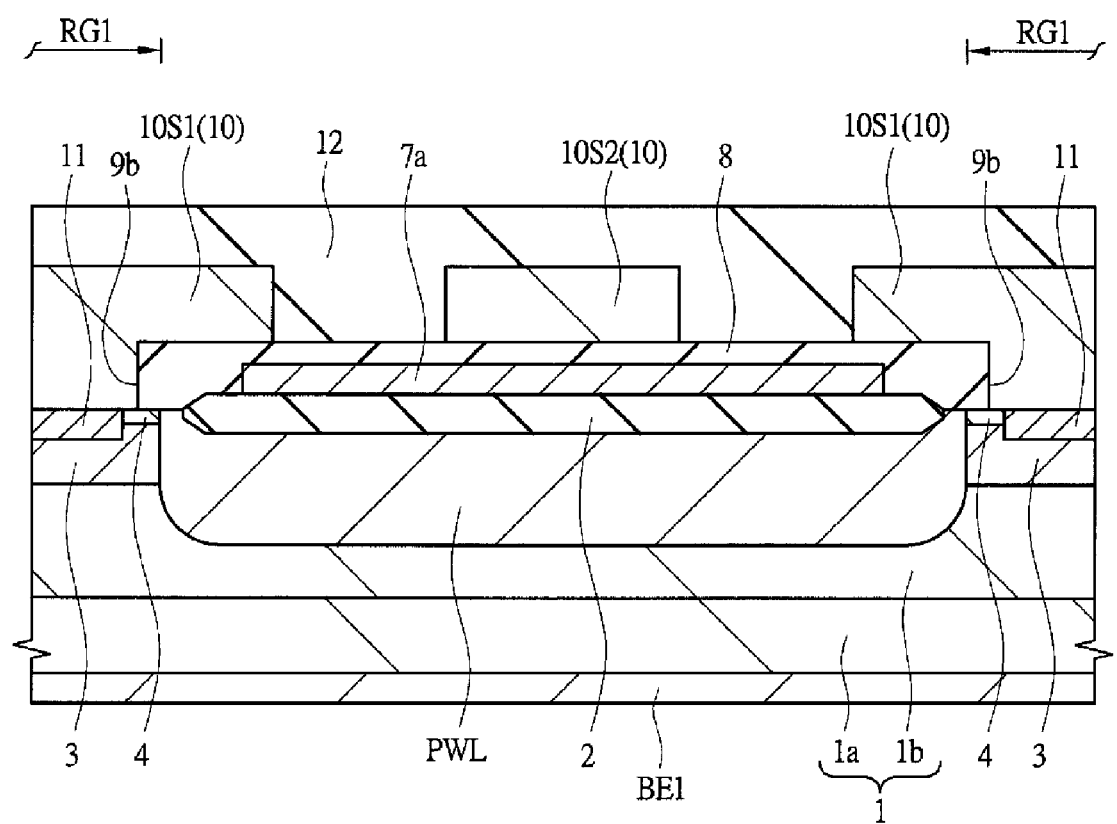
FIG. 16 is a cross-sectional view of essential parts of a semiconductor chip used in a semiconductor device of an embodiment of the present invention.
Figure 30:
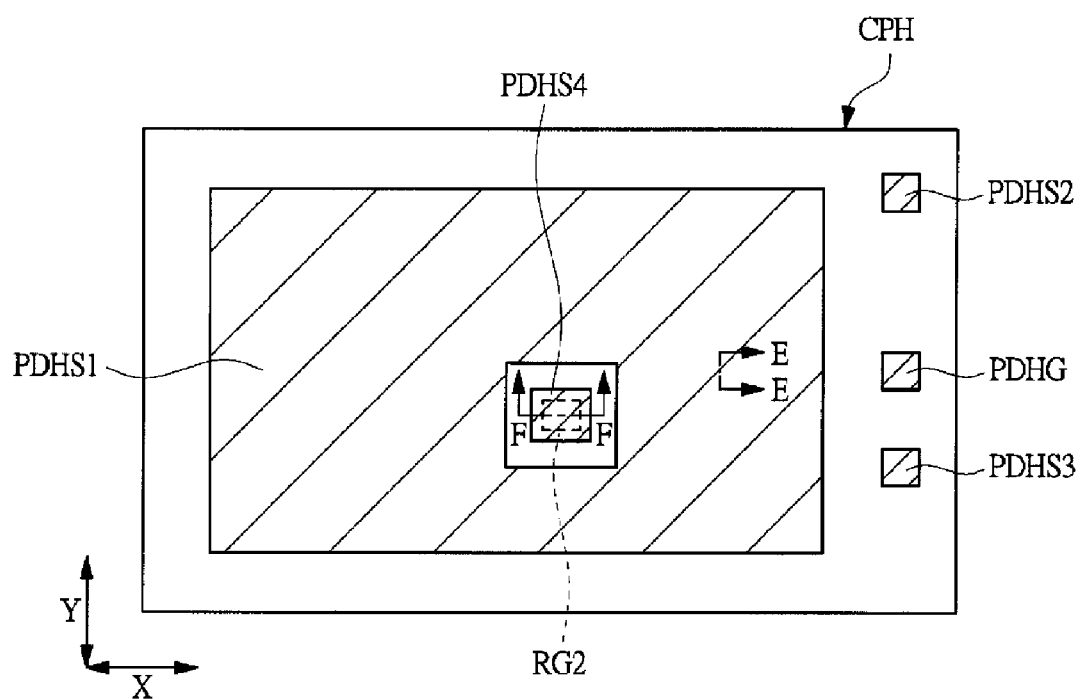
FIG. 30 is a plan view showing a chip layout of a semiconductor chip of a second modified example.
Figure 31:
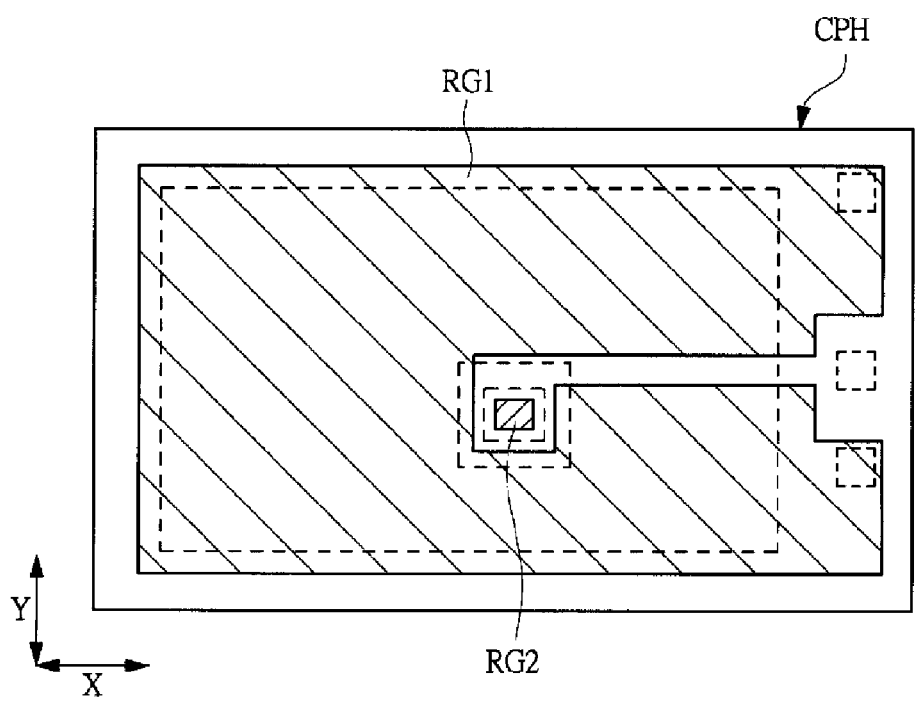
FIG. 31 is a plan view showing the chip layout of the semiconductor chip of the second modified example.
Figure 32:
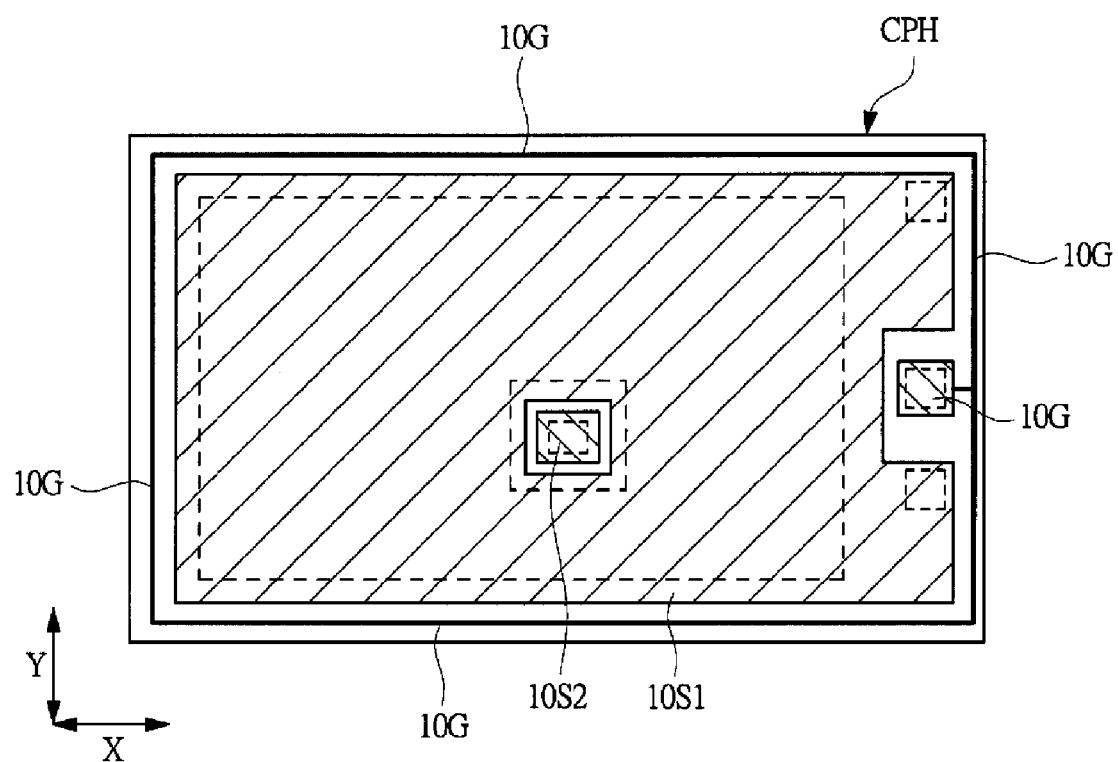
FIG. 32 is a plan view showing the chip layout of the semiconductor chip of the second modified example.
Figure 33:
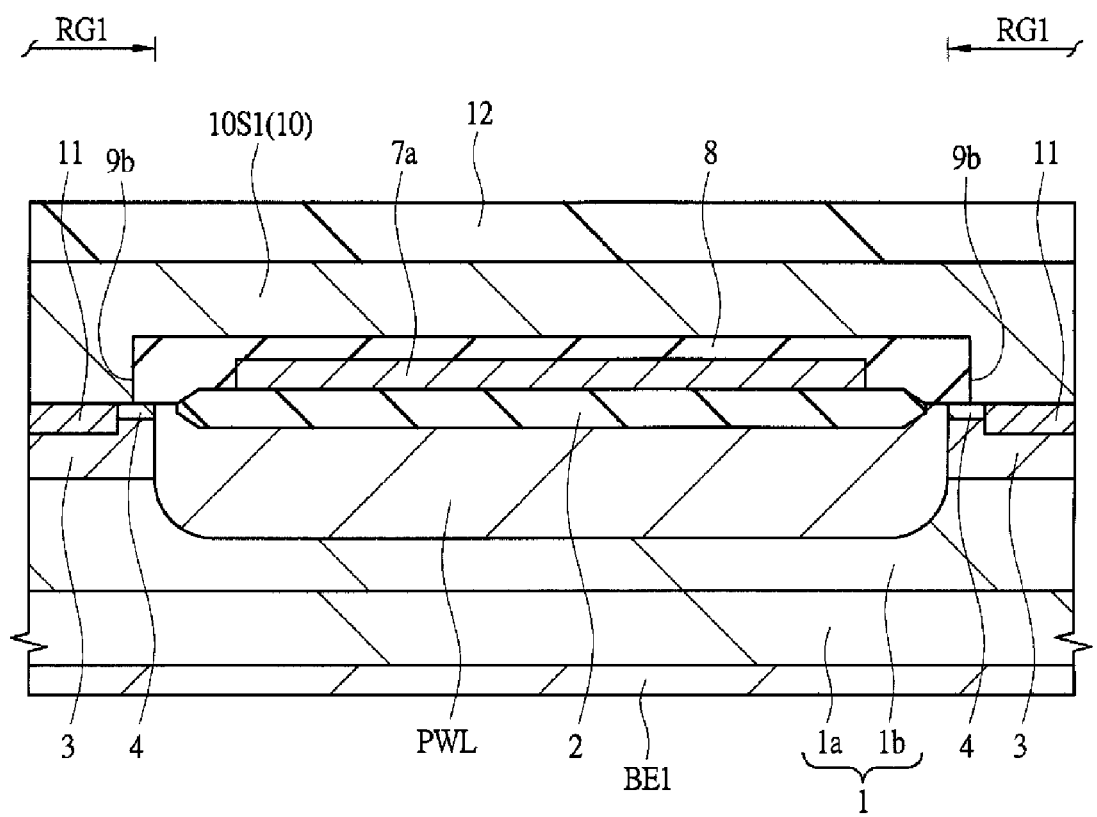
FIG. 33 is a cross-sectional view of essential parts of the semiconductor chip of the second modified example.
Figure 34:
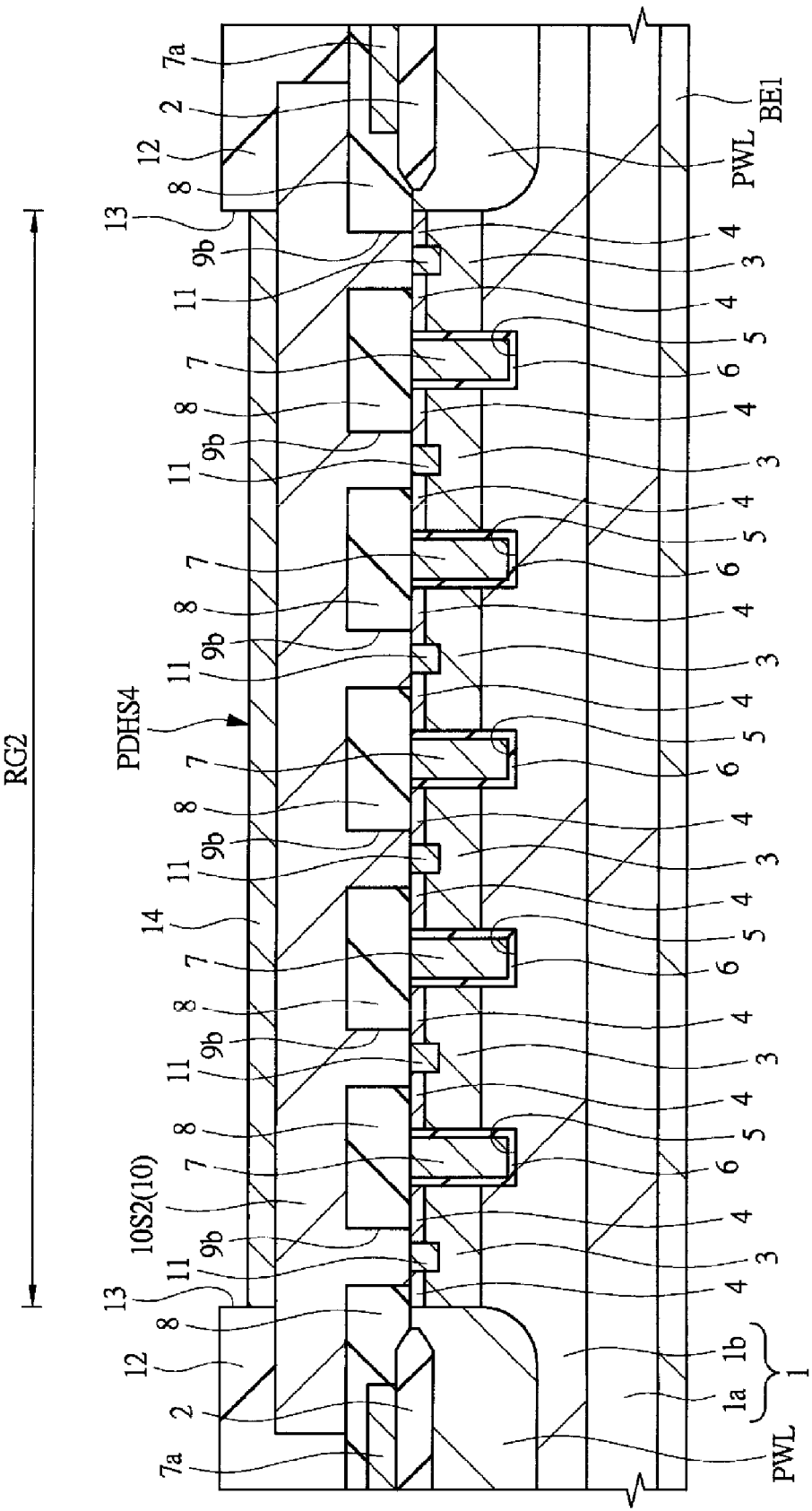
FIG. 34 is a cross-sectional view of essential parts of the semiconductor chip of the second modified example.

FIG. 30 to FIG. 32 are plan views showing a chip layout in a second modified example of the semiconductor chip CPH of the present embodiment, and FIG. 30 corresponds to FIG. 10 and FIG. 26, FIG. 31 corresponds to FIG. 11 and FIG. 27, and FIG. 32 corresponds to FIG. 12 and FIG. 28. FIG. 33 is a cross-sectional view along E-E line in FIG. 30 and corresponds to FIG. 16 and FIG. 29, and FIG. 34 is a cross-sectional view along F-F line in FIG. 30.

The main difference of the chip layout in the second modified example shown in FIG. 30 to FIG. 34 from the chip layout in FIG. 10 to FIG. 16 is that the source pad PDHS4 of the sense MOSFET QS1 is arranged in the position that overlaps with the sense MOSFET region RG2 in a planar view. Hereinafter, explanation will be given specifically.

As can be seen from a comparison between FIG. 31 and FIG. 11, the layout of the main MOSFET region RG1 and the sense MOSFET region RG2 in the main surface of the semiconductor chip CPH in the second modified example in FIG. 31 is basically the same as that in FIG. 11 (however, there is a difference in that the region in which the source pad PDHS4 of the sense MOSFET QS1 is arranged is also included in the main MOSFET region RG1 in the second modified example in FIG. 31). Consequently, also in the second modified example in FIG. 30 to FIG. 34, the sense MOSFET region RG2 is surrounded by the main MOSFET region RG1 in a planar view in the main surface of the semiconductor chip CPH, that is, the sense MOSFET region RG2 is arranged in the position surrounded by the main MOSFET region RG1 in which the MOSFET (that is, the unit transistor cells connected in parallel for the power MOSFET QH1) configuring the power MOSFET QH1 is formed.

The main difference of the layout in the second modified example in FIG. 30 to FIG. 34 from the layout in FIG. 10 to FIG. 16 and the layout in the first modified example in FIG. 26 to FIG. 28 is the relative positional relationship between the source pad PDHS4 of the sense MOSFET QS1 and the sense MOSFET region RG2. That is, in the layout in FIG. 10 to FIG. 16 and the layout in the first modified example in FIG. 26 to FIG. 28, the sense MOSFET region RG2 is arranged more internally than the source pad PDHS4 of the sense MOSFET QS1 in the main surface of the semiconductor chip CPH. In contrast to this, in the second modified example shown in FIG. 30 to FIG. 34, the source pad PDHS4 of the sense MOSFET QS1 is arranged in the position that overlaps with the sense MOSFET region RG2 in a planar view in the main surface of the semiconductor chip CPH. That is, in the second modified example shown in FIG. 30 to FIG. 34, the source pad PDHS4 of the sense MOSFET QS1 is arranged directly over the sense MOSFET region RG2.

As described above, if the pad PDHS4 is arranged at the outer circumferential part of the main surface of the semiconductor chip CPH, the possibility is great that a crack corresponding to the crack 113 is formed in a position under the sense MOSFET region RG2 in the adhesive layer SD1, and thus, in the second modified example shown in FIG. 30 to FIG. 34, the sense MOSFET region RG2 is arranged as close as possible to the inside instead of at the outer circumferential part in the main surface of the semiconductor chip CHP. Because of this, in the second modified example in FIG. 30 to FIG. 40, by arranging the sense MOSFET region RG2 in the position surrounded by the main MOSFET region RG1 in a planar view in the main surface of the semiconductor chip CPH, it is possible to increase the distance (gap) from the outer circumference of the main surface of the semiconductor chip CPH to the pad PDHS4 and at the same time, it is possible to increase the area of the main MOSFET region RG1 that occupies the main surface of the semiconductor chip CPH. By increasing the distance (gap) from the outer circumference of the main surface of the semiconductor chip CPH to the pad PDHS4, it is possible to reduce the possibility that a crack corresponding to the crack 113 is formed in a position under the sense MOSFET region RG2 in the adhesive layer SD1, and thus it is possible to improve the detection precision of an electric current flowing through the power MOSFET QH1 by the sense MOSFET QS1. Consequently, it is possible to improve reliability of the semiconductor device. Furthermore, by increasing the area of the main MOSFET region RG1 that occupies the main surface of the semiconductor chip CPH, it is possible to increase an electric current flowing through the power MOSFET QH1 formed in the main MOSFET region RG1, and thus it becomes possible to increase the output current (electric current output from the node N1).

Then, in the second modified example shown in FIG. 30 to FIG. 34, the source pad PDHS4 of the sense MOSFET QS1 is arranged in the position that overlaps with the sense MOSFET region RG2 in a planar view in the main surface of the semiconductor chip CPH. Because of this, it is no longer necessary to connect the source region (corresponding to the semiconductor region 4 of the sense MOSFET region RG2) for the sense MOSFET QS1 formed in the sense MOSFET region RG2 and the source pad PDHS4 of the sense MOSFET QS1 with a long source wiring, and thus it is possible to form the pad PDHS4 by exposing the source wiring 10S2 extending (existing) directly over the sense MOSFET region RG2 from the opening 13. Because of this, it is possible to shorten (reduce the area of) the source wiring 10S2, and thus it is possible to increase the area of the main MOSFET region RG1 that occupies the main surface of the semiconductor chip CPH. By increasing the area of the main MOSFET region RG1 that occupies the main surface of the semiconductor chip CPH, it is possible to increase an electric current flowing through the power MOSFET QH1 formed in the main MOSFET region RG1, and thus it becomes possible to increase the output current (electric current output from the node N1).

Furthermore, also in the second modified example in FIG. 30 to FIG. 34, the sense MOSFET region RG2 is arranged more internally than the gate pad PDHG in the main surface of the semiconductor chip CPH and this point is the same as in the layout in FIG. 10 and FIG. 26. However, in the second modified example in FIG. 30 to FIG. 34, the source pad PDHS4 of the sense MOSFET QS1 is arranged in the position that overlaps with the sense MOSFET region RG2 in a planar view, and thus the source pad PDHS4 of the sense MOSFET QS1 is in a state of being arranged more internally than the gate pad PDHG in the main surface of the semiconductor chip CPH. In other words, the pads PDHG and PDHS4 are arranged so that the gate pad PDHG is nearer to the outer circumferential part of the main surface of the semiconductor chip CPH than the source pad PDHS4 of the sense MOSFET QS1 in the main surface of the semiconductor chip CPH. That is, in the main surface of the semiconductor chip CPH, the distance (gap) from the outer circumference of the main surface of the semiconductor chip CPH to the source pad PDHS4 of the sense MOSFET QS1 is larger (longer) than the distance (gap) from the outer circumference of the main surface of the semiconductor chip CPH to the gate pad PDHG. Because of this, it is possible to improve the detection precision of an electric current flowing through the power MOSFET QH1 by the sense MOSFET QS1 by suppressing or preventing the formation of a crack in a position under the sense MOSFET region RG2 in the adhesive layer SD1 and at the same time, it becomes possible to make it easy to connect an electrically conductive member such as the wire WA, to the gate pad PDHG.

Moreover, in the second modified example in FIG. 30 to FIG. 34, the sense MOSFET region RG2 is surrounded by the source pad PDHS1 of the power MOSFET QH1 in a planar view in the main surface of the semiconductor chip CPH and this point is the same as in the layout in FIG. 10 and FIG. 26. However, in the second modified example in FIG. 30 to FIG. 34, the source pad PDHS4 of the sense MOSFET QS1 is arranged in the position that overlaps with the sense MOSFET region RG2 in a planar view, and thus, in the main surface of the semiconductor chip CPH, the source pad PDHS4 of the sense MOSFET QS1 is surrounded by the source pad PDHS1 of the power MOSFET QH1. That is, the source pad PDHS4 of the sense MOSFET QS1 is arranged in the position surrounded by the source pad PDHS1 of the power MOSFET QH1. Because of this, it is possible to increase the distance (gap) between the source pad PDHS4 and the sense MOSFET region RG2 in the main surface of the semiconductor chip CPH and at the same time, it is possible to increase the area of the source pad PDHS1 of the power MOSFET QH1. By increasing the area of the source pad PDHS1 of the power MOSFET QH1, it is possible to make it easy to connect an electrically conductive member, such as the metal plate MP1, to the source pad PDHS1. Furthermore, by increasing the area of the source pad PDHS1 of the power MOSFET QH1, it is also made possible to increase the connection area between the source pad PDHS1 and the metal plate MP1, and thus it is possible to reduce the on-resistance of the power MOSFET QH1, to make it easy to cause a large current to flow through the power MOSFET QH1, and to reduce the conduction loss.

Other configurations of the chip layout of the semiconductor chip CPH in the second modified example shown in FIG. 30 to FIG. 34 are basically the same as those of the chip layout in FIG. 10 to FIG. 16, and thus the explanation thereof is omitted here.

Figure 35:
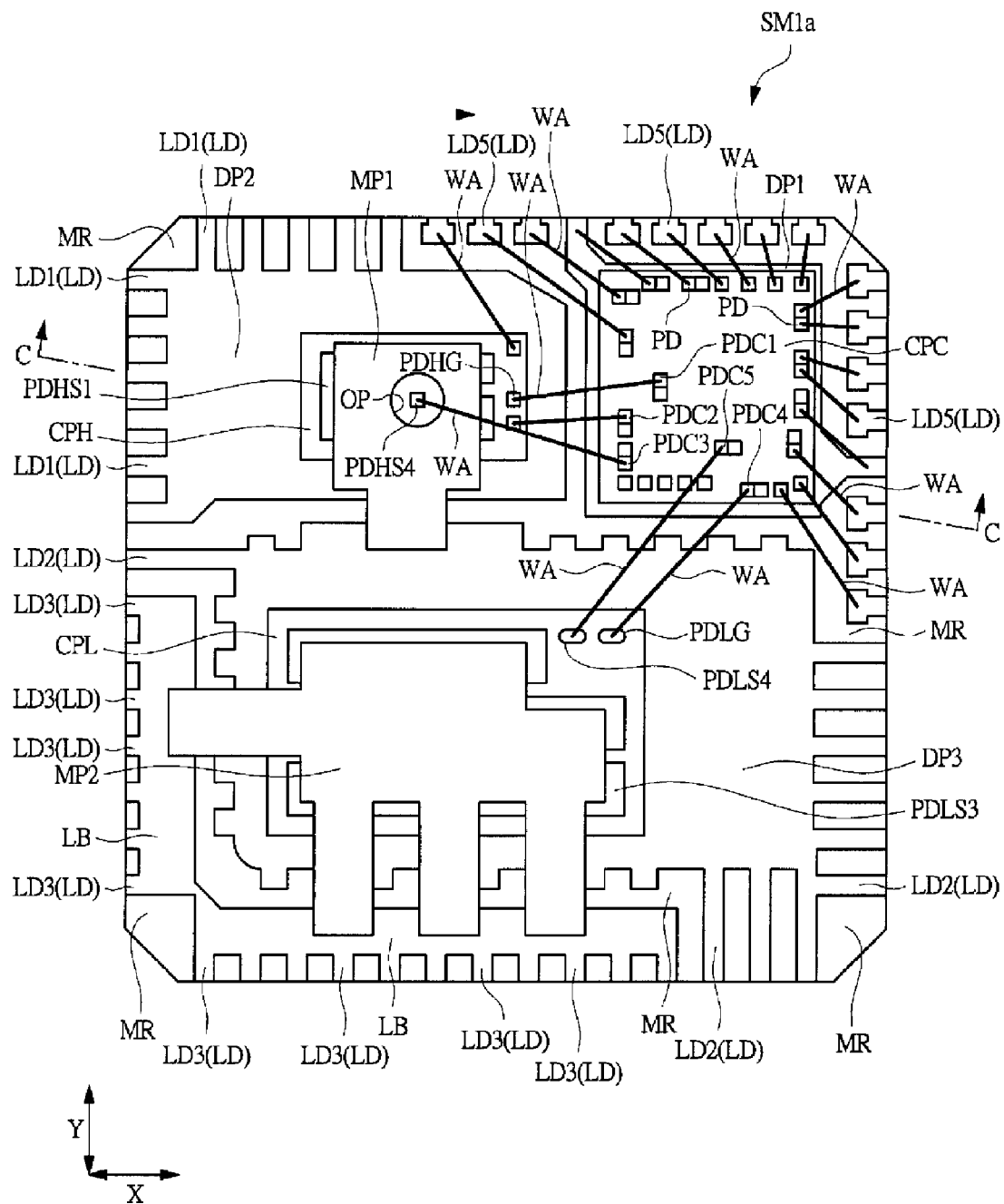
FIG. 35 is a perspective plan view of a semiconductor device when a semiconductor chip CPH of the second modified example shown in FIG. 30 to FIG. 34 is used.
Figure 36:
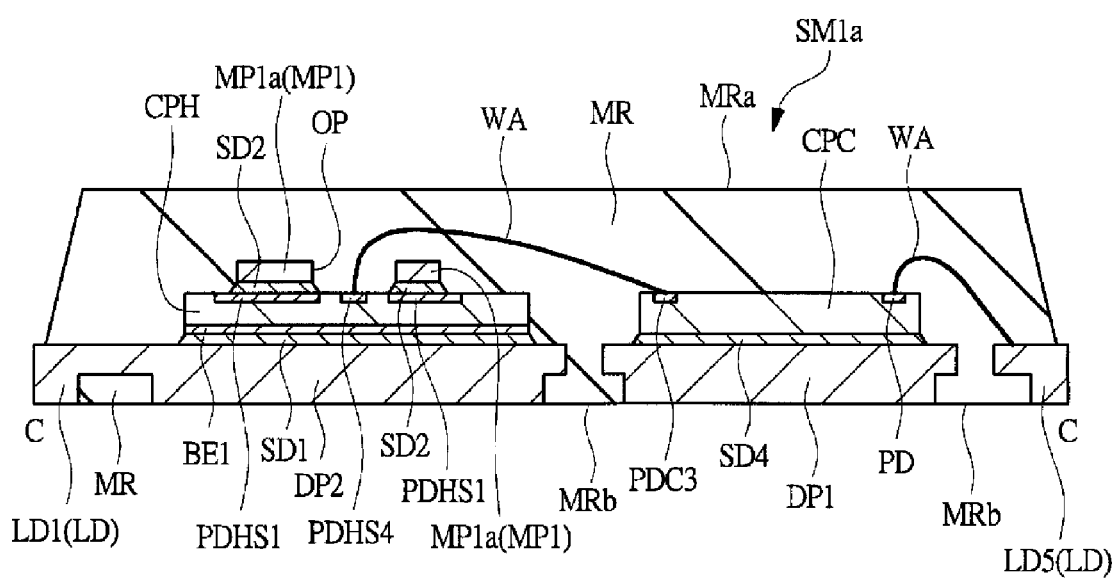
FIG. 36 is a cross-sectional view of the semiconductor device in FIG. 35.

To the source pad PDHS1 of the power MOSFET QH1, the metal plate MP1 is connected, and to the source pad PDHS4 of the sense MOSFET QS1, the wire WA is connected and in the case of the layout in the second modified example shown in FIG. 30 to FIG. 34, there is a possibility that the metal plate MP1 blocks the connection of the wire WA to the pad PDHS4. Because of this, when manufacturing the semiconductor device SM1 using the semiconductor chip CPH in the second modified example shown in FIG. 30 to FIG. 34, it is preferable to devise the connection between the metal plate MP1, and the pad PDHS4 of the semiconductor chip CPH and the pad PDC3 of the semiconductor chip CPC as in the semiconductor device SM1 (that is, a semiconductor device SM1a) in FIG. 35 and FIG. 36. FIG. 35 is a perspective plan view of the semiconductor device SM1 (that is, the semiconductor device SM1a) when using the semiconductor chip CPH in the second modified example shown in FIG. 30 to FIG. 34 and corresponds to FIG. 2 and FIG. 36 is a cross-sectional view along C-C line in FIG. 35 and corresponds to FIG. 7.

The semiconductor device SM1 (hereinafter, referred to as the semiconductor device SM1a) in FIG. 35 and FIG. 36 differs from the semiconductor device SM1 in FIG. 2 to FIG. 7 in the following point. That is, in the semiconductor device SM1a in FIG. 35 and FIG. 36, an opening (hole, through-hole) OP is formed in the metal plate MP1 and the opening OP is formed in the position and into the shape so as to expose the pad PDHS4 of the semiconductor chip CPH. Then, the pad PDHS4 of the semiconductor chip CPH and the pad PDC3 of the semiconductor chip CPC are connected by the wire WA and the wire WA is caused to pass through the opening OP in the metal plate MP1.

When manufacturing the semiconductor device SM1a, before the wire bonding process, joining of the metal plate MP1 to the semiconductor chip CPH and the die pad DP3 and joining of the metal plate MP2 to the semiconductor chip CPL and the lead wire LB are performed and at this time, the metal plate MP1 is joined to the pad PDHS1 of the semiconductor chip CPH so that the pad PDHS4 of the semiconductor chip CPH is exposed from the opening OP in the metal plate MP1 in a planar view. After that, the wire bonding process is performed and at this time, the pad PDHS4 of the semiconductor chip CPH exposed from the opening OP in the metal plate MP1 and the pad PDC3 of the semiconductor chip CPC are connected by the wire WA. That is, one end of the wire WA is connected to the pad PDHS4 of the semiconductor chip CPH exposed from the opening OP in the metal plate MP1 and the other end of the wire WA is connected to the pad PDC 3 of the semiconductor chip CPC.

As described above, the wire WA one end of which is connected to the pad PDHS4 of the semiconductor chip CPH passes through the opening OP provided in the metal plate MP1 and the other end is connected to the pad PDC 3 of the semiconductor chip CPC. Because of this, even when the semiconductor chip CPH in the second modified example shown in FIG. 30 to FIG. 34 is used, it is possible to manufacture the semiconductor device SM1a without being blocked by the metal plate MP1 when connecting the wire WA to the pad PDHS4 and further, it is possible to accurately prevent the wire WA connected to the pad PDHS4 from coming into contact with the metal plate MP1, and thus it is possible to further improve reliability of the semiconductor device SM1a.

Other configurations of the semiconductor device SM1a in FIG. 35 and FIG. 36 are basically the same as those of the semiconductor device SM1, and thus the explanation thereof is omitted here. Furthermore, in the semiconductor device SM1a in FIG. 35 and FIG. 36, it is also possible to favorably use the semiconductor chip CPH in a third modified example, to be explained next.

<With Regard to Third Modified Example of Layout within Main Surface of Semiconductor Chip CPH>

Figure 37:
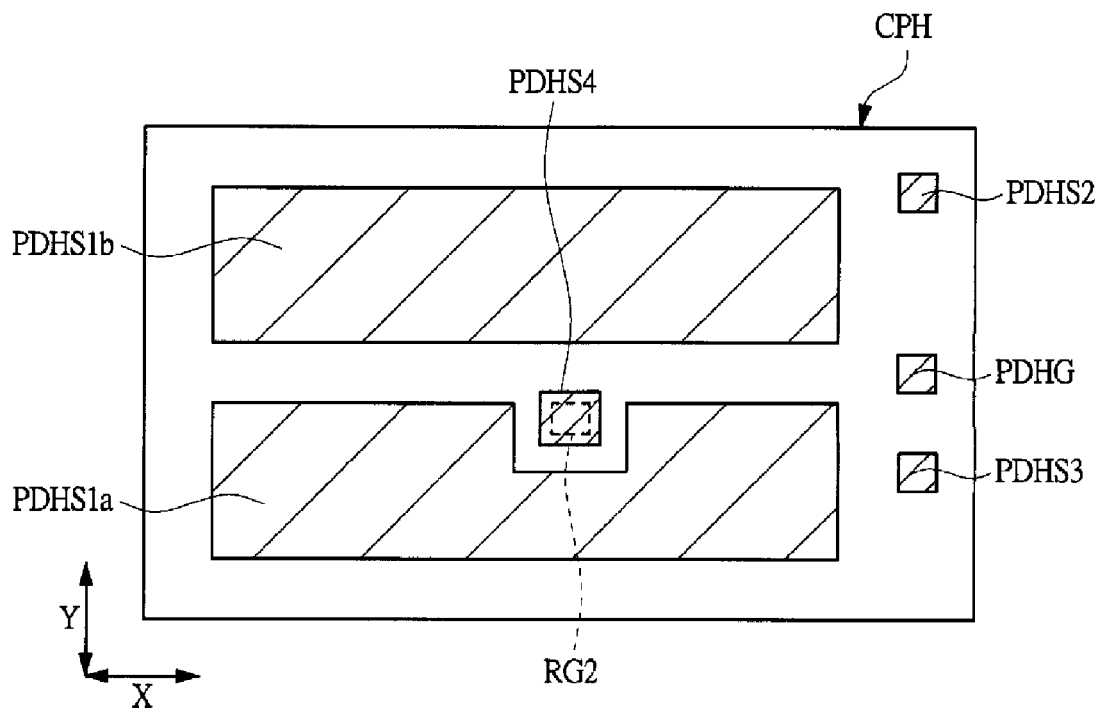
FIG. 37 is a plan view showing a chip layout of a semiconductor chip of a third modified example.
Figure 38:
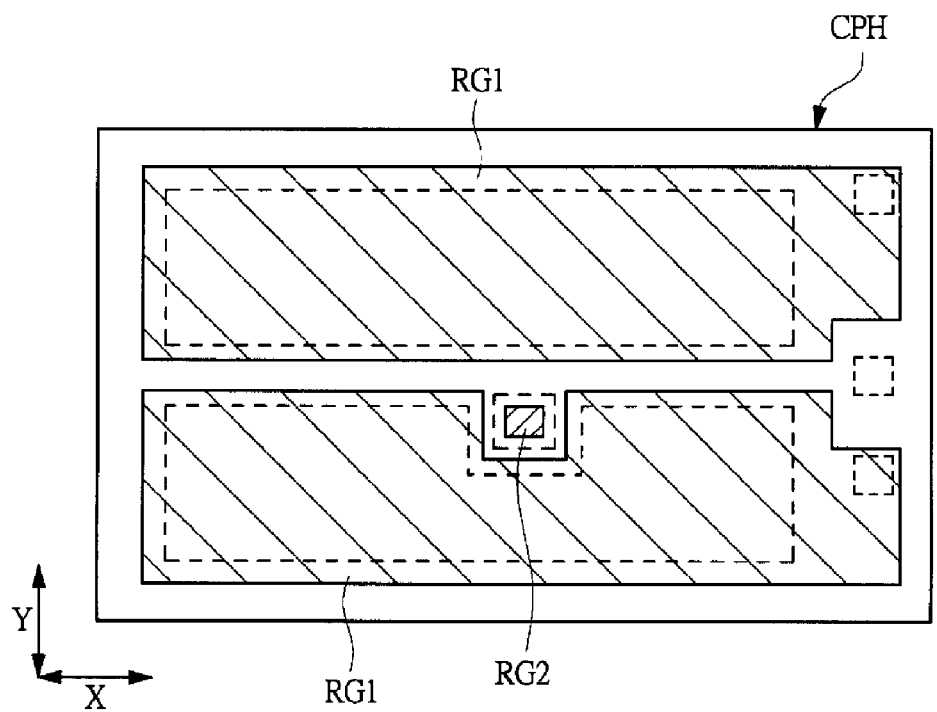
FIG. 38 is a plan view showing the chip layout of the semiconductor chip of the third modified example.
Figure 39:
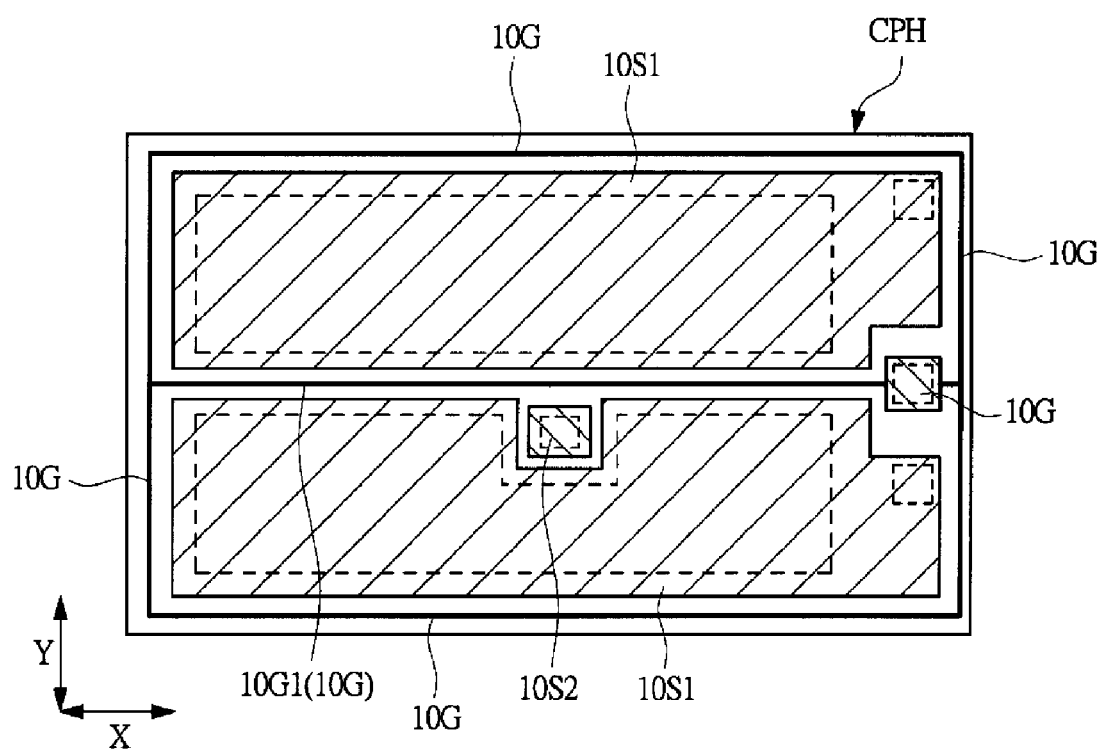
FIG. 39 is a plan view showing the chip layout of the semiconductor chip of the third modified example.
Figure 40:
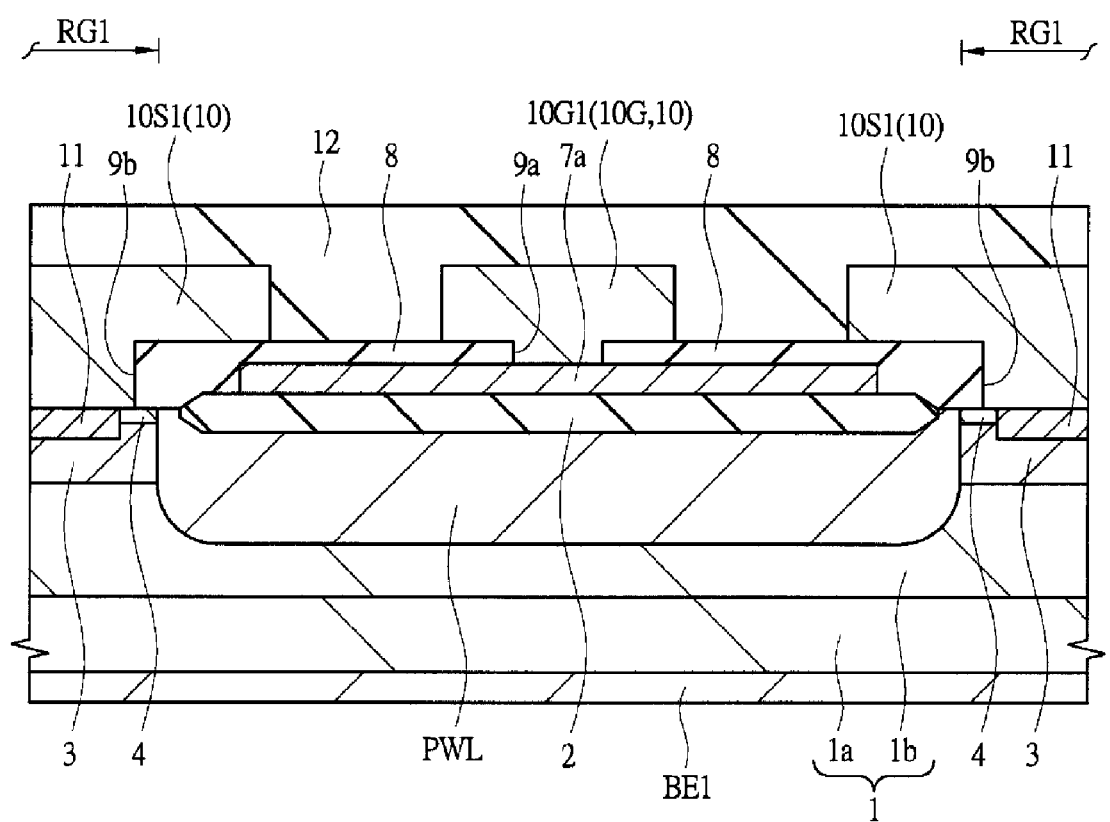
FIG. 40 is a cross-sectional view of essential parts of the semiconductor chip of the third modified example.

FIG. 37 to FIG. 39 are plan views showing a chip layout in a third modified example of the semiconductor chip CPH of the present embodiment and FIG. 37 corresponds to FIG. 10, FIG. 26 and FIG. 30, FIG. 38 corresponds to FIG. 11, FIG. 27, and FIG. 31, and FIG. 39 corresponds to FIG. 12, FIG. 28, and FIG. 32. FIG. 40 is a cross-sectional view along E-E line in FIG. 37 and corresponds to FIG. 16, FIG. 29, and FIG. 33. The cross-sectional view along F-F line in FIG. 37 is the same as that in FIG. 34.

As can be seen from a comparison between FIG. 38 and FIG. 27, the layout of the main MOSFET region RG1 and the sense MOSFET region RG2 in the main surface of the semiconductor chip CPH in the third modified example in FIG. 38 is basically the same as that in FIG. 11 in the first modified example in FIG. 27 (however, there is a difference in that the region in which the source pad PDHS4 of the sense MOSFET QS1 is arranged is also included in the main MOSFET region RG1 in the third modified example in FIG. 38). Consequently, in the third modified example in FIG. 37 to FIG. 40 also, the sense MOSFET region RG2 is surrounded by the main MOSFET region RG1 in a planar view in the main surface of the semiconductor chip CPH, that is, the sense MOSFET region RG2 is arranged in the position surrounded by the main MOSFET region RG1 in which the MOSFET (that is, the unit transistor cells connected in parallel for the power MOSFET QH1) configuring the power MOSFET QH1 is formed.

The main difference of the chip layout in the third modified example shown in FIG. 37 to FIG. 40 from the chip layout in the first modified example in FIG. 26 to FIG. 29 is that the source pad PDHS4 of the sense MOSFET QS1 is arranged in the position that overlaps with the sense MOSFET region RG2 in a planar view and other points are basically the same as those in the first modified example in FIG. 26 to FIG. 29. From another viewpoint, the arrangement of the source pad PDHS4 of the sense MOSFET QS1 in the position that overlaps with the sense MOSFET region RG2 in a planar view is the same in the second modified example in FIG. 30 to FIG. 34 and in the third modified example shown in FIG. 37 to FIG. 40. However, the source pad PDHS1 is formed but the gate wiring 10G1 is not formed in the second modified example in FIG. 30 to FIG. 34, while the source pads PDHS1a and PDHS1b are formed in place of the source pad PDHS1 and the gate wiring 10G1 is also formed in the third modified example in FIG. 37 to FIG. 40.

In the third modified example shown in FIG. 37 to FIG. 40, the same source pads PDHS1a and PDHS1b, and the gate wiring 10G1 as those in the first modified example in FIG. 26 to FIG. 29 are formed. However, in the third modified example in FIG. 37 to FIG. 40, the source pad PDHS4 of the sense MOSFET QS1 is arranged in the position that overlaps with the sense MOSFET region RG2 in a planar view in the main surface of the semiconductor chip CPH, and thus it is no longer necessary to connect the source region (corresponding to the semiconductor region 4 of the sense MOSFET region RG2) for the sense MOSFET QS1 formed in the sense MOSFET region RG2 and the source pad PDHS4 of the sense MOSFET QS1 with a long source wiring. In the first modified example, in the main surface of the semiconductor chip CPH, the source wiring 10S2 extends along the gate wiring 10G1 between the source pad PDHS1a and the source pad PDHS1b, but in the third modified example in FIG. 37 to FIG. 40, the source pad PDHS4 of the sense MOSFET QS1 is arranged in the position that overlaps with the sense MOSFET region RG2 in a planar view, and thus the source wiring 10S2 does not extend along the gate wiring 10G1. In the third modified example in FIG. 37 to FIG. 40, it is possible to form the pad PDHS4 by arranging the source wiring 10S2 directly over the sense MOSFET region RG2 and exposing the source wiring 10S2 from the opening 13. Because of this, it is possible to shorten (reduce the area of) the source wiring 10S2, and thus, it is possible to increase the area of the main MOSFET region RG1 that occupies the main surface of the semiconductor chip CPH. By increasing the area of the main MOSFET region RG1 that occupies the main surface of the semiconductor chip CPH, it is possible to increase an electric current flowing through the power MOSFET QH1 formed in the sense MOSFET QS1, and thus, it becomes possible to increase the output current (electric current output from the node N1).

As in the first modified example in FIG. 26 to FIG. 29, also in the third modified example in FIG. 37 to FIG. 40, by extending the gate wiring 10G1 between the source pad PDHS1a and the source pad PDHS1b in a planar view in the main surface of the semiconductor chip CPH, it is possible to reduce the gate resistance. Because of this, it is possible to suppress or prevent the delay of the operation of each unit transistor cell in the main MOSFET region RG1 and it is also possible to suppress or prevent the delay of the operation of each unit transistor cell in the sense MOSFET region RG2.

That the sense MOSFET region RG2 is surrounded by the main MOSFET region RG1 in a planar view in the main surface of the semiconductor chip CPH is the same in the chip layout in FIG. 10 to FIG. 16 and in the chip layouts in the first, second, and third modified examples. Further, that the sense MOSFET region RG2 is arranged more internally than the gate pad PDHG in a planar view in the main surface of the semiconductor chip CPH is the same in the chip layout in FIG. 10 to FIG. 16 and in the chip layouts in the first, second, and third modified examples. Furthermore, that the source pad PDHS4 of the sense MOSFET QS1 is arranged more internally than the gate pad PDHG in a planar view in the main surface of the semiconductor chip CPH is the same in the chip layouts in the second and third modified examples. Moreover, the fact that the sense MOSFET region RG2 is surrounded by the pad PDHS1 in a planar view in the main surface of the semiconductor chip CPH is the same in the chip layout in FIG. 10 to FIG. 16 and in the chip layout in the second modified example. Further, that the sense MOSFET region RG2 is surrounded by the pads PDHS1a and PDHS1b in a planar view in the main surface of the semiconductor chip CPH is the same in the chip layouts in the first and third modified examples. In the chip layout in the second modified example, the source pad PDHS4 of the sense MOSFET QS1 is surrounded by the pad PDHS1 in a planar view in the main surface of the semiconductor chip CPH, but in the chip layout in the third embodiment, the source pad PDHS4 of the sense MOSFET QS1 is surrounded by the pads PDHS1a and PDHS1b in a planar view in the main surface of the semiconductor chip CPH.

The semiconductor chip CPH in the second modified example and the semiconductor chip CPH in the third modified example can also be used in the semiconductor device SM1 in FIG. 2 to FIG. 7, but it is more favorable to use the semiconductor device SM1a in FIG. 35 and FIG. 36. The configuration of the semiconductor device SM1a when using the semiconductor chip CPH with the chip layout in the third modified example is already explained in the second modified example with reference to FIG. 35 and FIG. 36, and thus the repeated explanation thereof is omitted here.

It is favorable to use the semiconductor chip CPH with the chip layout in FIG. 10 to FIG. 16, or the chip layout in FIG. 23 and FIG. 24, or the chip layout in the first modified example in the semiconductor device SM1 in FIG. 2 to FIG. 7, but it is also possible to use the semiconductor chip CPH in the semiconductor device SM1a in FIG. 35 and FIG. 36.

Consequently, it is preferable to use the semiconductor chip CPH with the chip layout in FIG. 10 to FIG. 16, or the chip layout in FIG. 23 and FIG. 24, or the chip layout in the first modified example in the semiconductor device SM1 with such a structure as in FIG. 2 to FIG. 7 and to use the semiconductor chip CPH with the chip layout in the second modified example or in the third modified example in the semiconductor device SM1a with such a structure as in FIG. 35 and FIG. 36.

Further, in the case of the semiconductor device SM1 in FIG. 2 to FIG. 7, a semiconductor device SM1b in FIG. 41 to FIG. 43, to be described later, and a semiconductor device SM1d in FIG. 46 to FIG. 48, to be described later, it is preferable for the sense MOSFET region RG2 to overlap with the metal plate MP1 in a planar view in the main surface of the semiconductor chip CPH. In such a case, it is possible to make the sense MOSFET region RG2 more distant from the outer circumference of the main surface of the semiconductor chip CPH and at the same time, to increase the joint area between the metal plate MP1 and the semiconductor chip CPH (more specifically, the source pad of the power MOSFET QH1). By making the sense MOSFET region RG2 more distant from the outer circumference of the main surface of the semiconductor chip CPH, it is possible to suppress or prevent the deterioration of the detection precision of the sense MOSFET QS1, which results from the crack 113, and at the same time, by increasing the joint area between the metal plate MP1 and the semiconductor chip CPH, it is possible to reduce the on-resistance of the power MOSFET QH1 and to reduce the conduction loss. Furthermore, by preventing the source pad PDHS4 of the sense MOSFET QS1 from overlapping with the metal plate MP1 in a planar view at this time, it becomes possible to accurately connect the wire WA to the source pad PDHS4 of the sense MOSFET QS1.

Furthermore, in the case of the semiconductor device SM1a in FIG. 35 and FIG. 36, a semiconductor device SM1c in FIG. 44 and FIG. 45, to be described later, and a semiconductor device SM1e in FIG. 49 and FIG. 50, it is preferable for the source pad PDHS4 of the sense MOSFET QS1 to be exposed from the opening OP in the metal plate MP1 in a planar view in the main surface of the semiconductor chip CPH. In such a case, it is possible to connect the wire WA to the source pad PDHS4 of the sense MOSFET QS1 by preventing the wire WA from coming into contact with the metal plate MP1.

<With Regard to Fourth and Fifth Modified Examples of Semiconductor Device SM1>

Figure 41:
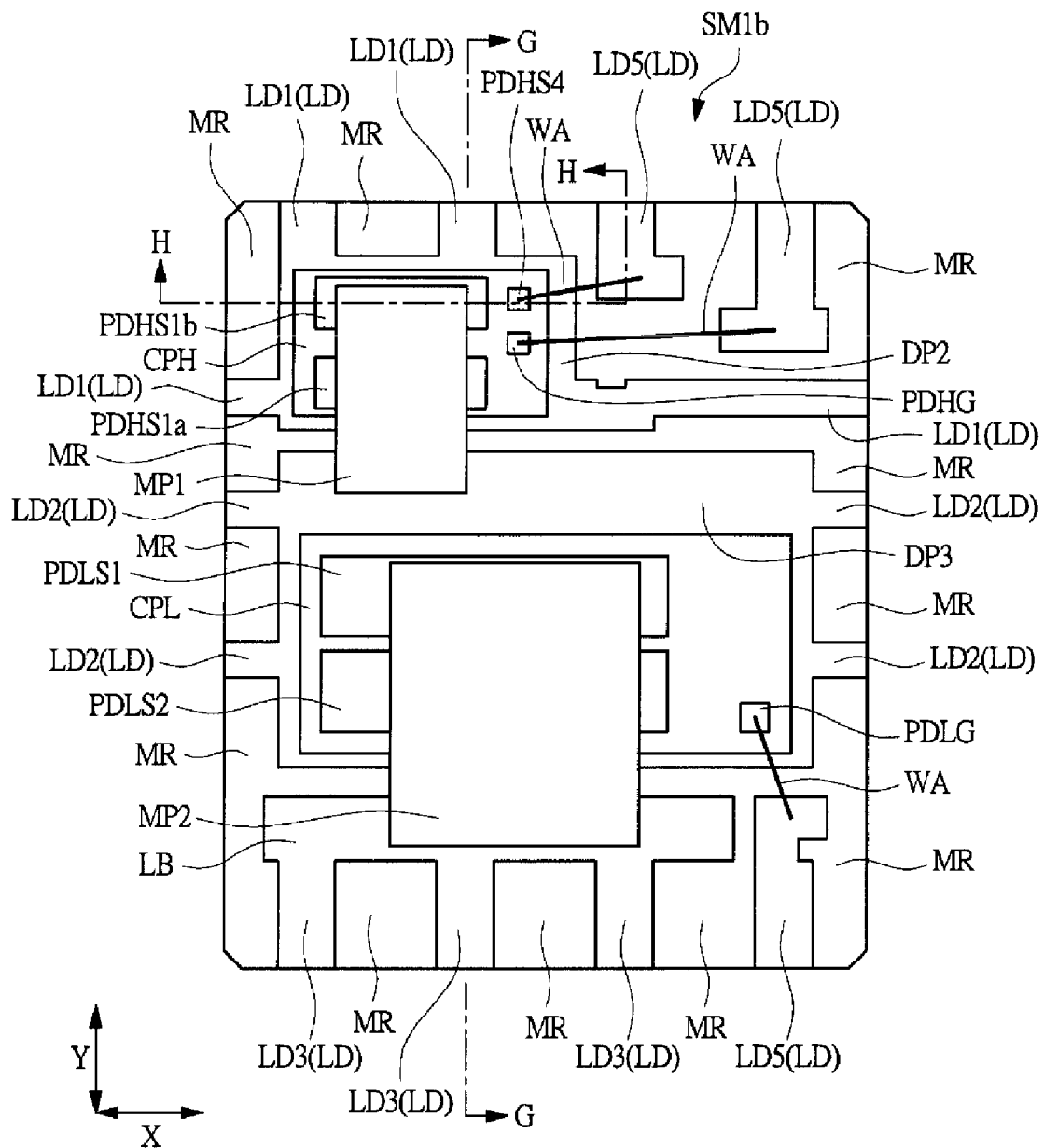
FIG. 41 is a perspective plan view showing a semiconductor device of a fourth modified example.

FIG. 41 is a perspective plan view showing a fourth embodiment of the semiconductor device SM1 (that is, the semiconductor device SM1b) of the present embodiment and corresponds to FIG. 2. Further, FIG. 42 and FIG. 43 are cross-sectional views of the semiconductor device SM1b in FIG. 41 and the cross-sectional view along G-G line in FIG. 41 corresponds to FIG. 42 and the cross-sectional view along H-H line in FIG. 41 corresponds to FIG. 43. It is assumed that the semiconductor device SM1 in the fourth modified example shown in FIG. 41 to FIG. 43 is referred to as the semiconductor device SM1b in the following.

Figure 42:
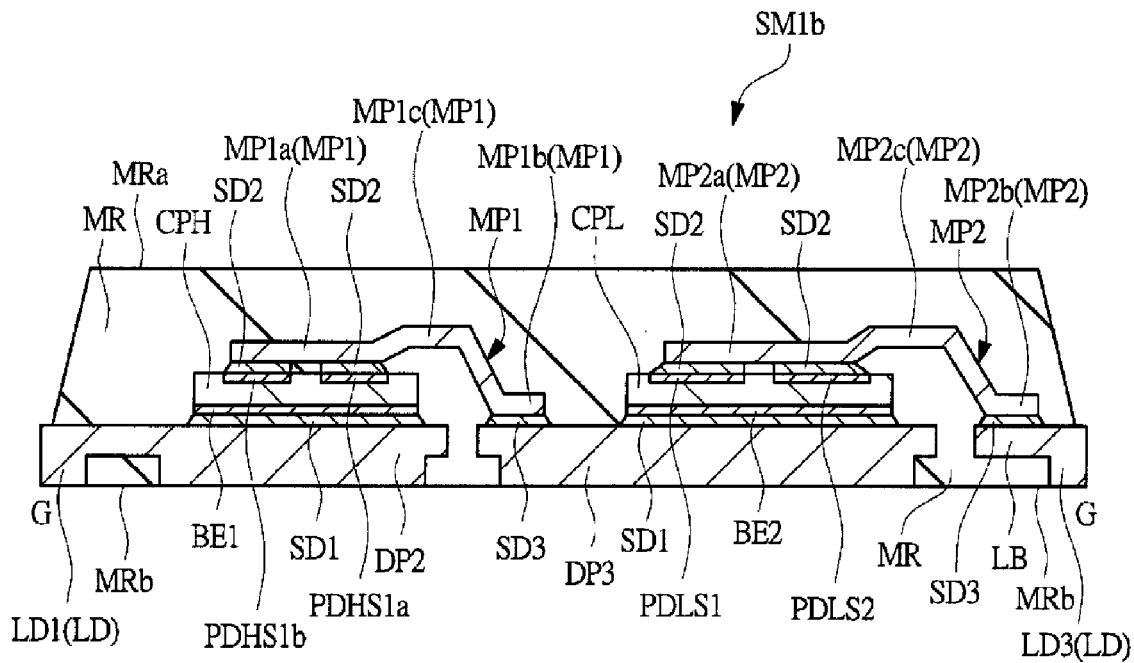
FIG. 42 is a cross-sectional view of the semiconductor device in FIG. 41.
Figure 43:
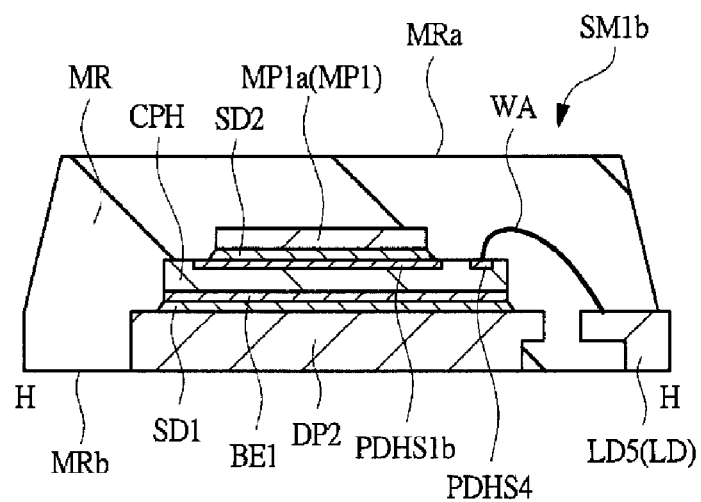
FIG. 43 is a cross-sectional view of the semiconductor device in FIG. 41.

The semiconductor device SM1b in FIG. 41 to FIG. 43 differs from the semiconductor device SM1 in FIG. 2 to FIG. 7 in that the semiconductor device SM1b does not have the semiconductor chip CPC or the die pad DP1 for mounting the semiconductor chip CPC.

In the semiconductor device SM1b in FIG. 41 to FIG. 43, in response to not having the semiconductor chip CPC, the gate pad PDHG and the source pad PDHS4 of the semiconductor chip CPH are electrically connected respectively to the different leads LD5 through the wire WA (singular or plural). The lead LD5 is a lead of the leads LD, which is not linked to the die pads DP2 and DP3. In addition, in FIG. 41 to FIG. 43, what corresponds to the semiconductor chip CPH in the first modified example is used, but the pads PDHS2 and PDHS3 are not shown schematically in the semiconductor chip CPH. When the pads PDHS2 and PDHS3 are provided in the semiconductor chip CPH, the PDHS2 and PDHS3 are electrically connected respectively to the lead LD5 (the lead LD5 connected to neither the pad PDHG nor the PDHS4 by the wire WA) through the wire WA (singular or plural).

Furthermore, in the semiconductor device SM1b in FIG. 41 to FIG. 43, in response to not having the semiconductor chip CPC, the gate pad PDLG of the semiconductor chip CPL is electrically connected to the different leads LD5 through the wire WA (singular or plural). In addition, in FIG. 41 to FIG. 43, the pads PDLS3 and PDLS4 are not shown schematically. When the pad PDLS3 is provided in the semiconductor chip CPL, the PDLS3 is joined to the first part MP2a of the metal plate MP2 via the adhesive layer SD2. Moreover, when the pad PDLS4 is provided in the semiconductor chip CPL, the pad PDLS4 is electrically connected to the lead LD5 (the lead LD5 connected to none of the pads PDHG, PDHS2, PDHS3, and PDHS4 by the wire WA) through the wire WA (singular or plural).

Other configurations of the semiconductor device SM1b are basically like in the case of those of the semiconductor device SM1 in FIG. 2 to FIG. 7, and thus the explanation thereof is omitted here.

What corresponds to the semiconductor chip CPC is not incorporated in the semiconductor device SM1b and a semiconductor chip (or a semiconductor device in which the semiconductor chip is packaged) corresponding to the semiconductor chip CPC is implemented on, for example, the wiring substrate 21 together with the semiconductor device SM1b. The semiconductor chip (semiconductor chip corresponding to the semiconductor chip CPC) implemented on the wiring substrate 21 and the lead LD of the semiconductor device SM1b are electrically connected through the wiring of the wiring substrate 21 and such a configuration as the circuit diagram in FIG. 1 is obtained. Because of this, the power MOSFETs QH1 and QL1 and the sense MOSFET QS1 formed in the semiconductor chips CPH and CPL incorporated in the semiconductor device SM1b are controlled by the semiconductor chip (or semiconductor device in which the semiconductor chip is packaged) outside the semiconductor device SM1b.

It is possible to apply the semiconductor device SM1b in FIG. 41 to FIG. 43 and the semiconductor device SM1c in FIG. 44 and FIG. 45, to be described later, to any of the chip layout in FIG. 10 to FIG. 16, the chip layout in FIG. 23 to FIG. 25, and the chip layouts in the first, second, and third modified examples as the semiconductor chip CPH. However, it is further preferable to apply the semiconductor device SM1b in FIG. 41 to FIG. 43 when using the semiconductor chip CPH with the chip layout in FIG. 10 to FIG. 16, the chip layout in FIG. 23 to FIG. 25, and chip layout in the first modified example and to apply the semiconductor device SM1c in FIG. 44 and FIG. 45, to be described later, when using the semiconductor chip CPH with the chip layouts in the second and third modified examples.

Figure 44:
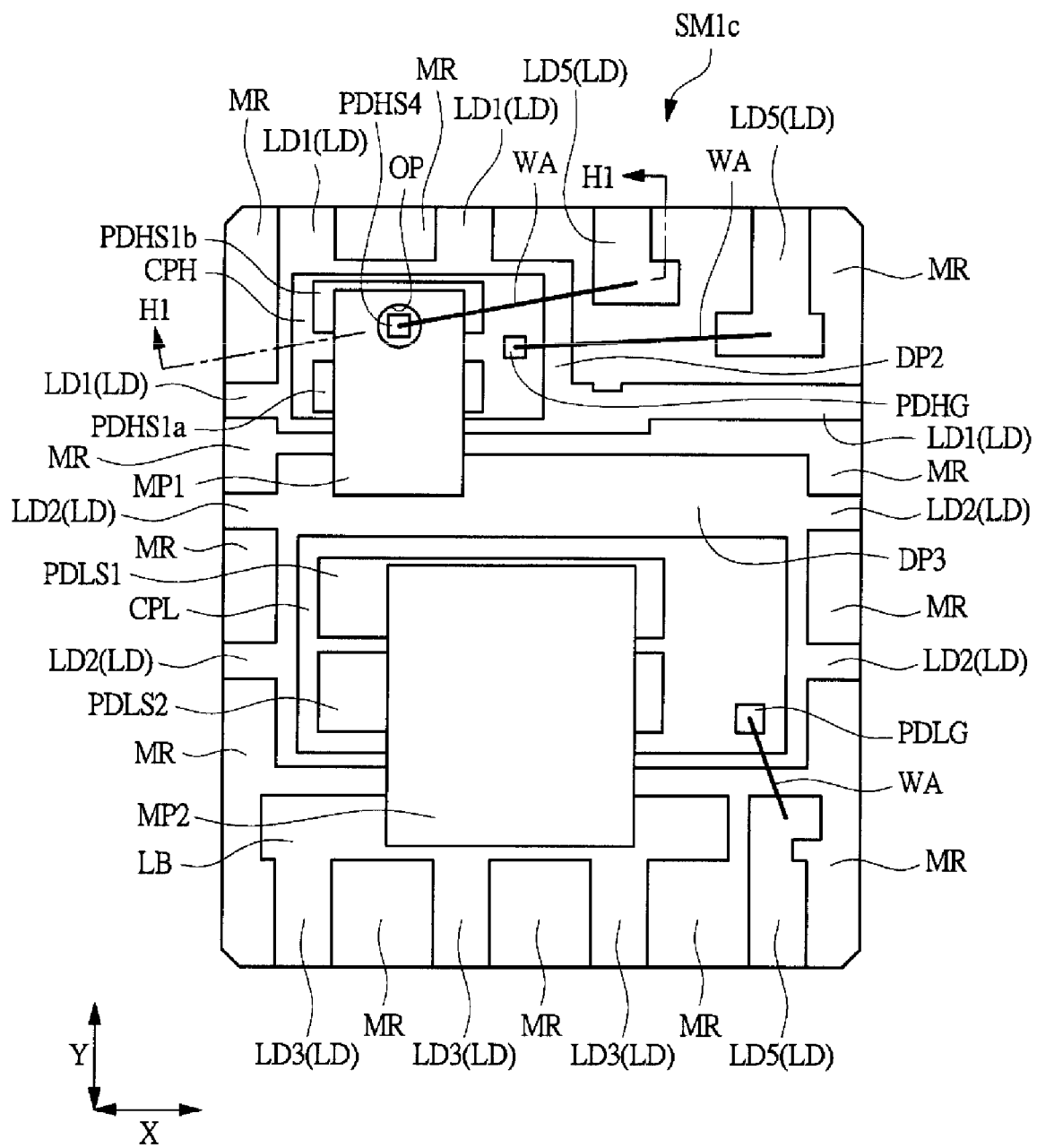
FIG. 44 is a perspective plan view showing a semiconductor device of a fifth modified example.

FIG. 44 is a perspective plan view showing a fifth modified example of the semiconductor device SM1 (that is, the semiconductor device SM1c) of the present embodiment and corresponds to FIG. 2 and FIG. 41. Furthermore, FIG. 45 is a cross-sectional view of the semiconductor device SM1c in FIG. 44 and the cross-sectional view along. H-H line in FIG. 44 corresponds to FIG. 45. It is assumed that the semiconductor device SM1 in the fifth modified example shown in FIG. 44 to FIG. 45 is referred to as the semiconductor device SM1c in the following.

The semiconductor device SM1c in FIG. 44 and FIG. 45 differs from the semiconductor device SM1b in FIG. 41 to FIG. 43 in the following point. That is, in the semiconductor device SM1c in FIG. 44 and FIG. 45, the opening (hole, through-hole) OP is formed in the metal plate MP1 and the opening OP is formed in the position and into the shape so as to expose the pad PDHS4 of the semiconductor chip CPH. Then, the pad PDHS4 of the semiconductor chip CPH and the lead LD5 are connected by the wire WA and the wire WA is caused to pass through the opening OP in the metal plate MP1. That is, the wire WA one end of which is connected to the pad PDHS4 of the semiconductor chip CPH passes through the opening OP provided in the metal plate MP1 and the other end is connected to the lead LD5. Because of this, even when the semiconductor chip CPH in the second and third modified examples shown in FIG. 44 and FIG. 45 is used, it is possible to manufacture the semiconductor device SM1c without being blocked by the metal plate when connecting the wire WA to the pad PDHS4 and further, it is possible to accurately prevent the wire WA connected to the pad PDHS4 from coming into contact with the metal plate MP1, and thus it is possible to improve reliability of the semiconductor device SM1c.

Meanwhile, it is also possible to regard the semiconductor device SM1c as the semiconductor device SM1a in FIG. 35 and FIG. 36 from which the semiconductor chip CPC and the die pad DP1 for mounting the semiconductor chip CPC are removed. That is, the difference between the semiconductor device SM1 in FIG. 2 to FIG. 7 and the semiconductor device SM1b in FIG. 41 to FIG. 43 is the difference between the semiconductor device SM1a in FIG. 35 and FIG. 36 and the semiconductor device SM1c in FIG. 44 and FIG. 45.

<With Regard to Sixth and Seventh Modified Examples of Semiconductor Device SM1>

Figure 46:
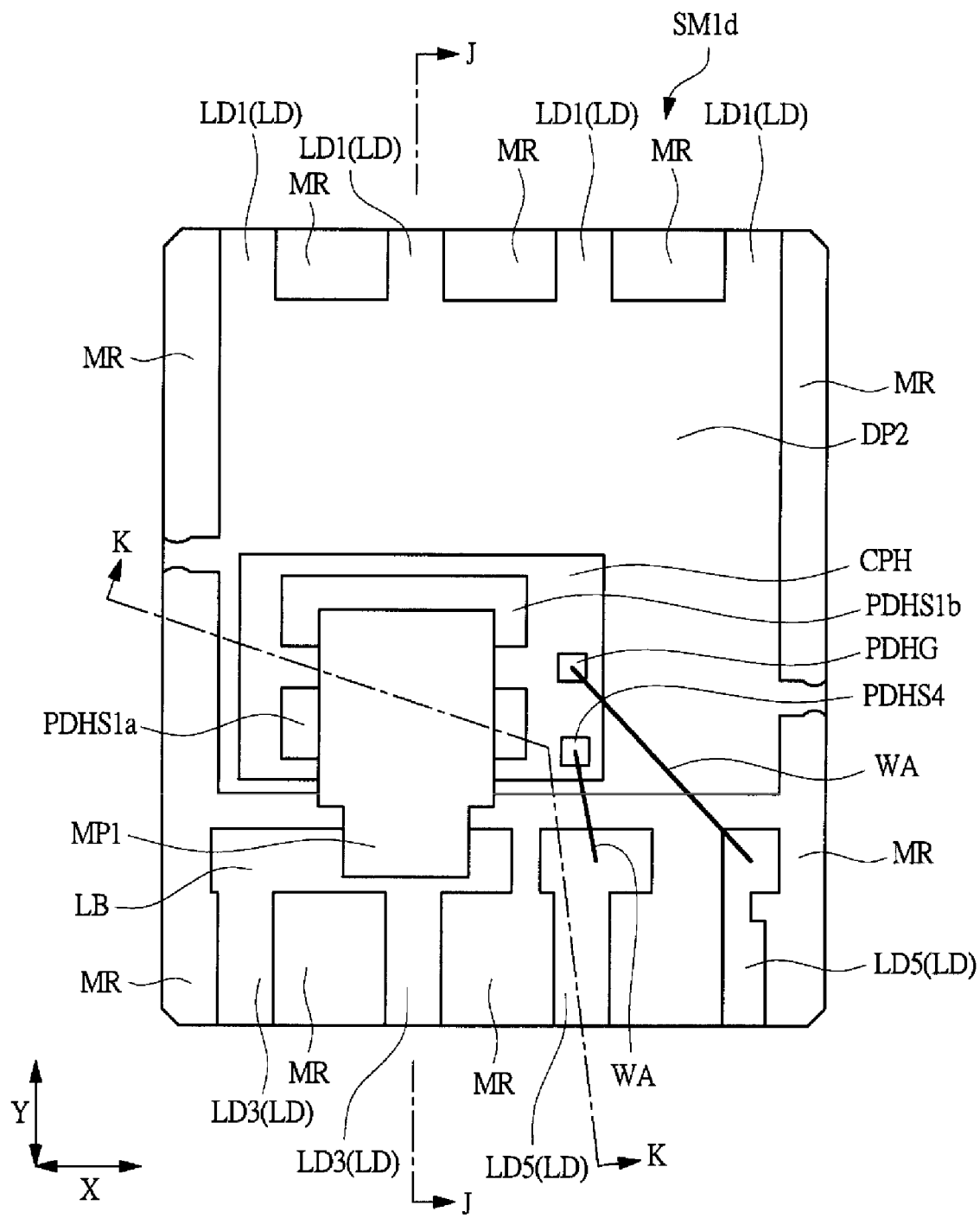
FIG. 46 is a perspective plan view showing a semiconductor device of a sixth modified example.

FIG. 46 is a perspective plan view showing a sixth modified example of the semiconductor device SM1 (that is, the semiconductor device SM1d) of the present embodiment and corresponds to FIG. 2. In addition, FIG. 47 and FIG. 48 are cross-sectional views of the semiconductor device SM1d in FIG. 46 and the cross-sectional view along J-J line in FIG. 46 corresponds to FIG. 47 and the cross-sectional view along K-K line in FIG. 46 corresponds to FIG. 48. It is assumed that the semiconductor device SM1 in the sixth modified example shown in FIG. 46 to FIG. 48 is referred to as the semiconductor device SM1d in the following.

Figure 47:
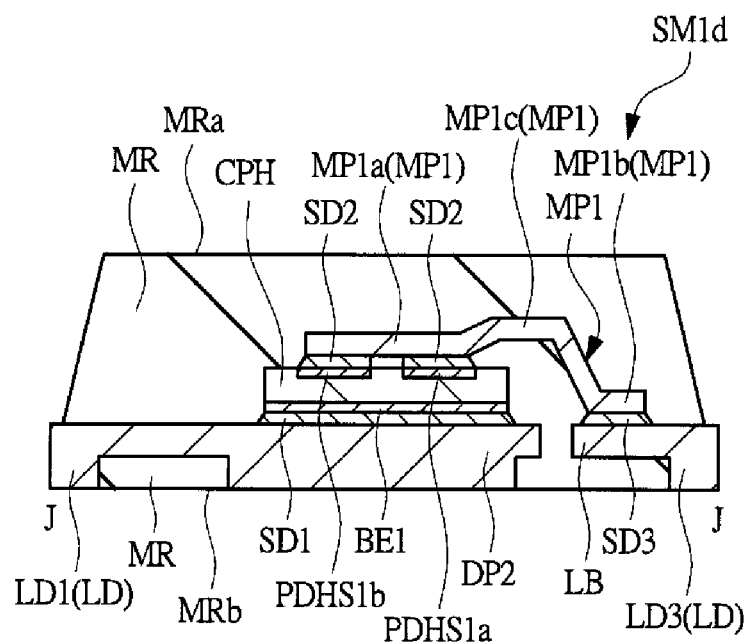
FIG. 47 is a cross-sectional view of the semiconductor device in FIG. 46.
Figure 48:
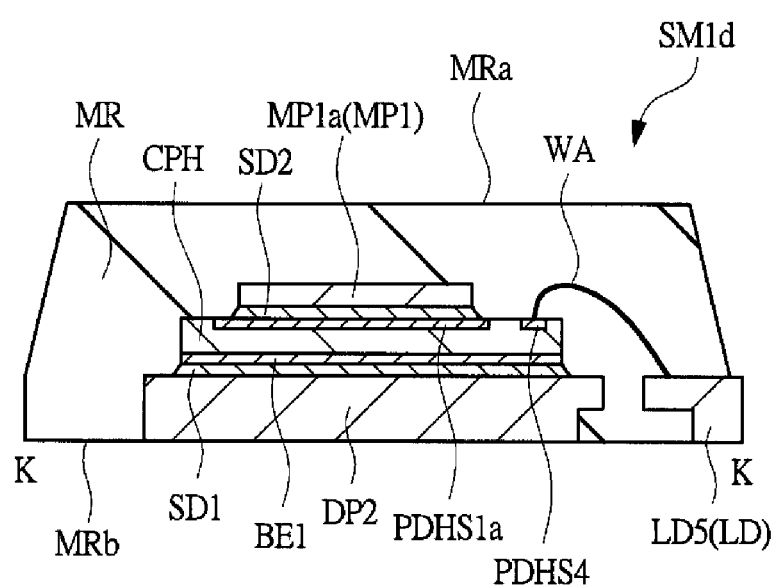
FIG. 48 is a cross-sectional view of the semiconductor device in FIG. 46.

The semiconductor device SM1d in FIG. 46 to FIG. 48 differs from the semiconductor device SM1b in FIG. 41 to FIG. 43 in that the semiconductor device SM1d does not have the semiconductor chip CPL, the die pad DP3 for mounting the semiconductor chip CPL, or the metal plate MP2.

Furthermore, in the semiconductor device SM1d in FIG. 46 to FIG. 48, in response to not having the semiconductor chip CPL and the die pad DP3, the source pad PDHS1 of the semiconductor chip CPH is electrically connected to the lead wire LB via the metal plate MP1. That is, the first part MP1a of the metal plate MP1 is joined and electrically connected to the source pad PDHS1 of the semiconductor chip CPH via the adhesive layer SD2 and the second part MP1b of the metal plate MP1 is joined and electrically connected to (the upper surface of) the lead wire LB via the adhesive layer SD3.

Other configurations of the semiconductor device SM1d in FIG. 46 to FIG. 48 are basically like in the case of those of the semiconductor device SM1b in FIG. 41 to FIG. 43, and thus the explanation thereof is omitted here.

What corresponds to the semiconductor chips CPC and CPL is not incorporated in the semiconductor device SM1d and a semiconductor chip (or a semiconductor device in which the semiconductor chip is packaged) corresponding to the semiconductor chips CPC and CPL is implemented on, for example, the wiring substrate 21 together with the semiconductor device SM1d. The semiconductor chip (semiconductor chip corresponding to the semiconductor chips CPC and CPL) implemented on the wiring substrate 21 and the lead LD of the semiconductor device SM1d are electrically connected through the wiring of the wiring substrate 21 and such a configuration as the circuit diagram in FIG. 1 is obtained. Because of this, the power MOSFET QH1 and the sense MOSFET QS1 formed in the semiconductor chip CPH incorporated in the semiconductor device SM1d and the power MOSFET QL1 provided outside the semiconductor device SM1d are controlled by the semiconductor chip (or semiconductor device in which the semiconductor chip is packaged) outside the semiconductor device SM1d.

It is possible to apply the semiconductor device SM1d in FIG. 46 to FIG. 48 and the semiconductor device SM1e in FIG. 49 and FIG. 50, to be described later, to any of the chip layout in FIG. 10 to FIG. 16, the chip layout in FIG. 23 to FIG. 25, and the chip layouts in the first, second, and third modified examples as the semiconductor chip CPH. However, it is further preferable to apply the semiconductor device SM1d in FIG. 46 to FIG. 48 when using the semiconductor chip CPH with the chip layout in FIG. 10 to FIG. 16, the chip layout in FIG. 23 to FIG. 25, and chip layout in the first modified example and to apply the semiconductor device SM1e in FIG. 49 and FIG. 50, to be described later, when using the semiconductor chip CPH with the chip layouts in the second and third modified examples.

Figure 49:
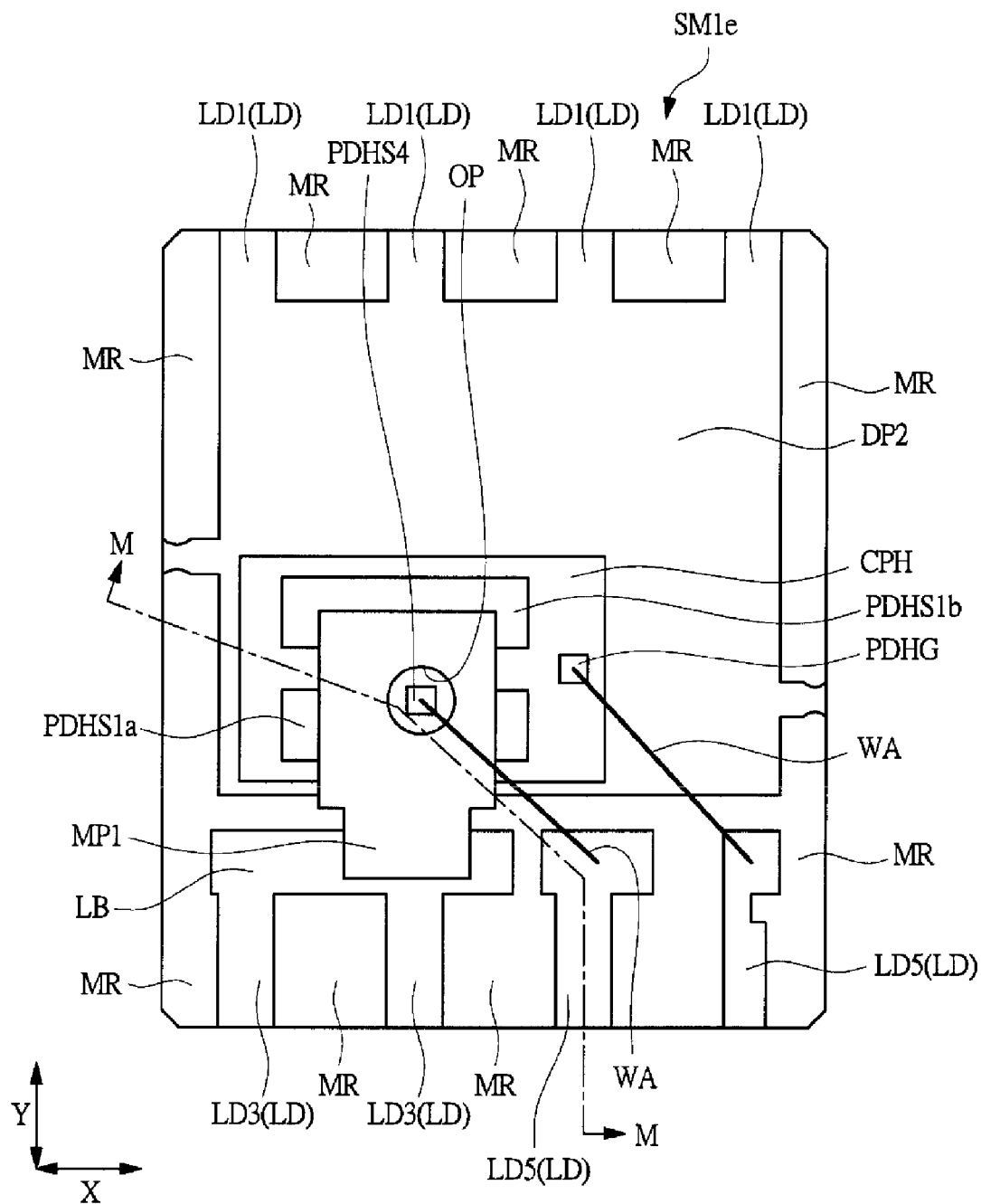
FIG. 49 is a perspective plan view showing a semiconductor device of a seventh modified example.

FIG. 49 is a perspective plan view showing a seventh modified example of the semiconductor device SM1 (that is, the semiconductor device SM1e) of the present embodiment and corresponds to FIG. 2 and FIG. 46. Moreover, FIG. 50 is a cross-sectional view of the semiconductor device SM1e in FIG. 49 and the cross-sectional view along M-M line in FIG. 49 corresponds to FIG. 50. It is assumed that the semiconductor device SM1 in the seventh modified example shown in FIG. 49 and FIG. 50 is referred to as the semiconductor device SM1e in the following.

The semiconductor device SM1e in FIG. 49 and FIG. 50 differs from the semiconductor device SM1d in FIG. 46 to FIG. 48 in the following point. That is, in the semiconductor device SM1e in FIG. 49 and FIG. 50, the opening (hole, through-hole) OP is formed in the metal plate MP1 and the opening OP is formed in the position and into the shape so as to expose the pad PDHS4 of the semiconductor chip CPH.

Then, the pad PDHS4 of the semiconductor chip CPH and the lead LD5 are connected by the wire WA, and the wire WA is caused to pass through the opening OP in the metal plate MP1. That is, the wire WA, one end of which is connected to the pad PDHS4 of the semiconductor chip CPH passes through the opening OP provided in the metal plate MP1 and the other end is connected to the lead LD5. Because of this, even when the semiconductor chip CPH in the second and third modified examples is used, it is possible to manufacture the semiconductor device SM1e without being blocked by the metal plate MP1 when connecting the wire WA to the pad PDHS4 and further, it is possible to accurately prevent the wire WA connected to the pad PDHS4 from coming into contact with the metal plate MP1, and thus it is possible to improve reliability of the semiconductor device SM1c.

Figure 45:
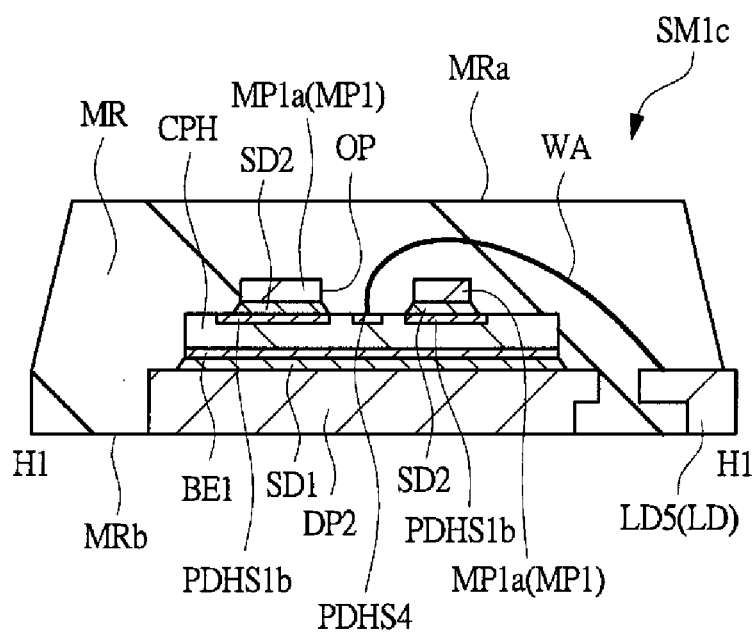
FIG. 45 is a cross-sectional view of the semiconductor device in FIG. 44.
Figure 50:
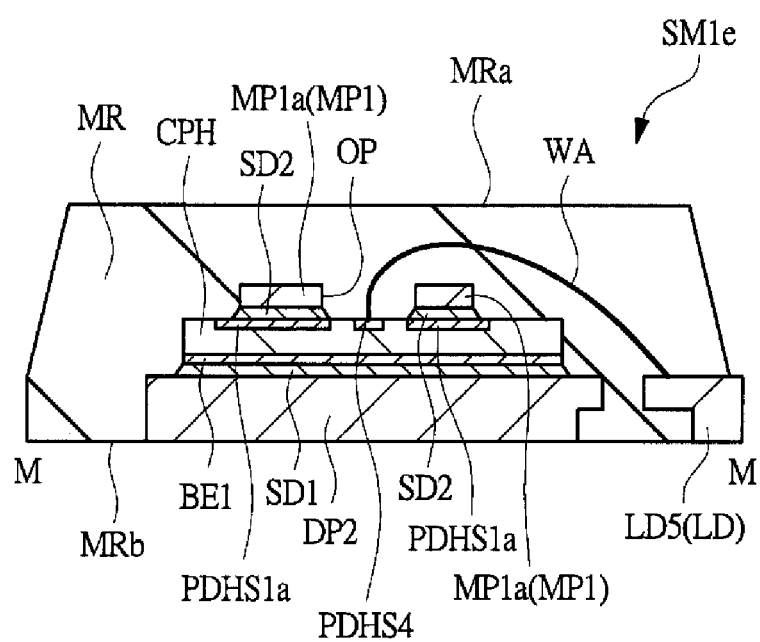
FIG. 50 is a cross-sectional view of the semiconductor device in FIG. 49.

It is also possible to regard the semiconductor device SM1e in FIG. 49 and FIG. 50 as the semiconductor device SM1c in FIG. 44 and FIG. 45 from which the semiconductor chip CPL, the die pad DP3 for mounting the semiconductor chip CPL, and the metal plate MP2 are removed. That is, the difference between the semiconductor device SM1b in FIG. 41 to FIG. 43 and the semiconductor device SM1d in FIG. 46 to FIG. 48 is the difference between the semiconductor device SM1c in FIG. 44 and FIG. 45 and the semiconductor device SM1e in FIG. 49 and FIG. 50.

As described above, the fourth to seventh modified examples of the semiconductor device SM1 are explained and in summary, it is possible to apply the main characteristics described in the first embodiment to either of the case where the semiconductor chip CPC in which the control circuit CLC is formed, the semiconductor chip CPH in which the power MOSFET QH1, which is the field effect transistor for high side switch, is formed, and the semiconductor chip CPL in which the power MOSFET QL1, which is the field effect transistor for low side switch, is formed are integrated into one semiconductor package and the case where those semiconductor chips are housed in each individual semiconductor package and the packages are electrically connected respectively on the wiring substrate, as long as the configuration of the circuit diagram shown in FIG. 1 is realized.

Figure 51:
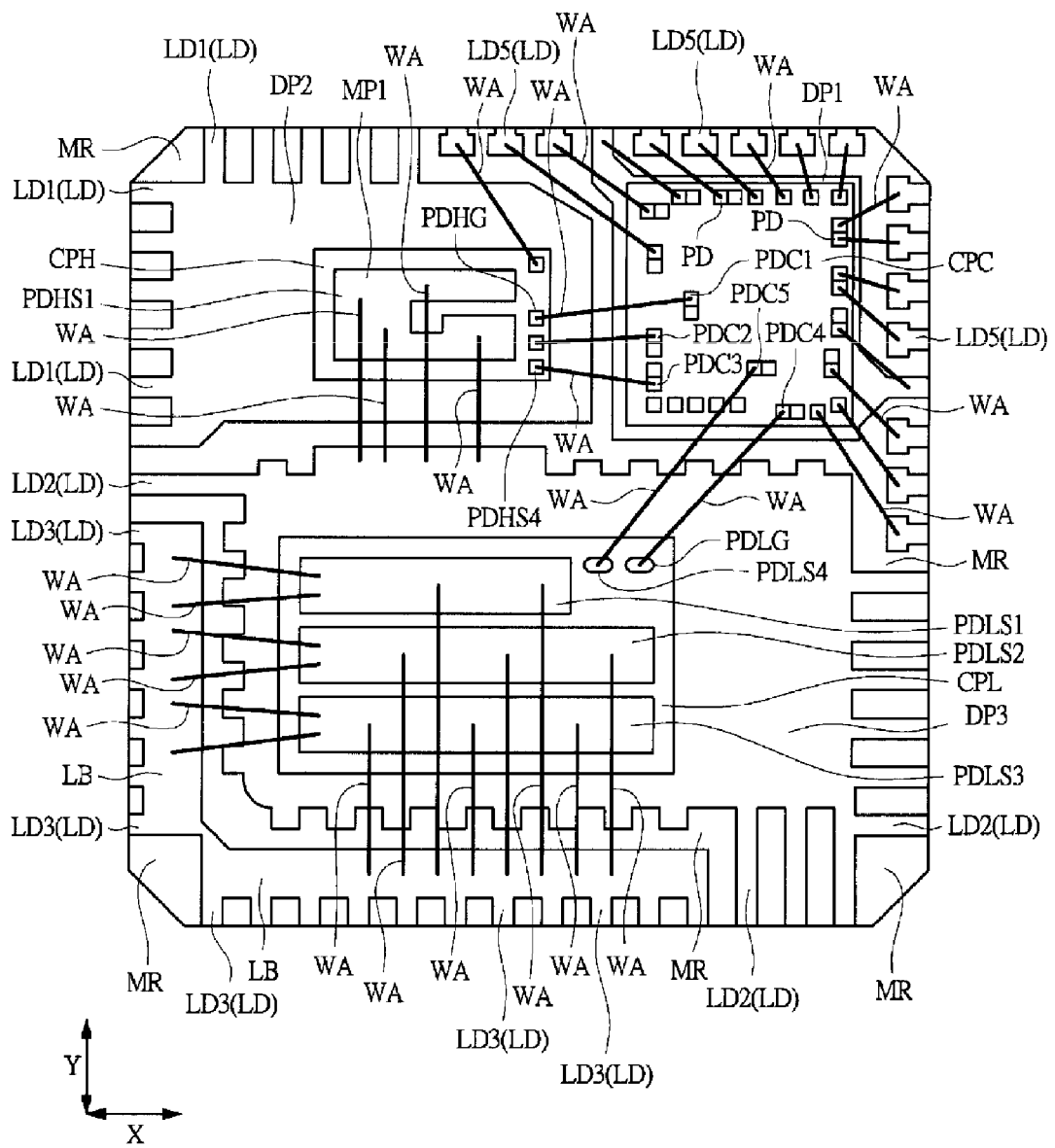
FIG. 51 is a perspective plan view of a semiconductor device of an embodiment of the present invention showing a case where a bonding wire is used in place of a metal plate.

As another aspect, it is also possible to use a bonding wire in place of the metal plates MP1 and MP2. FIG. 51 is a perspective plan view showing a semiconductor device when a bonding wire (for example, the wire WA) is used in place of the metal plates MP1 and MP2 in the semiconductor device SM1 in FIG. 2 to FIG. 7, and corresponds to FIG. 2. In the case of FIG. 2, the pad PDHS1 of the semiconductor chip CPH and the die pad DP3 are electrically connected via the metal plate MP1, and the pads PDLS1, PDLS2, and PDLS3 of the semiconductor chip CPL and the lead wire LB are electrically connected via the metal plate MP1. In contrast to this, in the case of FIG. 51, the pad PDHS1 of the semiconductor chip CPH and the die pad DP3 are electrically connected via the wire WA (singular or plural, preferably, plural), and the pads PDLS1, PDLS2, and PDLS3 of the semiconductor chip CPL and the lead wire LB are electrically connected via the wire WA (singular or plural, preferably, plural). Even in such a case (where a bonding wire is used in place of the metal plates MP1 and MP2), it is possible to obtain the same effect by applying the main characteristics described in the first embodiment. However, when the metal plates MP1 and MP2 are used as in FIG. 2 to FIG. 7, as compared with the case where the bonding wire is used in place of the metal plates MP1 and MP2 as in FIG. 51, it is possible to further reduce the on-resistance of the power MOSFETs QH1 and QL1, and thus it is possible to further reduce the package resistance and to further reduce the conduction loss. In addition, when the wire WA is used in place of the metal plates MP1 and MP2, it is possible to make thicker the wire WA that connects the pad PDHS1 of the semiconductor chip CPH and the die pad DP3 and the wire WA that connects the pads PDLS1, PDLS2, and PDLS3 of the semiconductor chip CPL and the lead wire LB, than the wire WA that connects the pads of the semiconductor chips CPH and CPL and the pad of the semiconductor chip CPC, and further, it is also possible to change the quality of the material (kind of the metal configuring the wire). Moreover, in the fourth to seventh modified examples, it is also possible to use a bonding wire in place of the metal plates MP1 and MP2.

Second Embodiment

In the first embodiment, the source pad and the gate pad are formed on the surface side of the semiconductor chips CPH and CPL and the back surface electrode for drain is formed on the back surface side, but it is also possible to replace the source pad on the surface side with a drain pad and to replace the back surface electrode for drain with a back surface electrode for source, by forming the LDMOSFET in place of the trench gate MOSFET in the semiconductor chips CPH and CPL. In a second embodiment, this case will be explained.

That is, in the first embodiment, the semiconductor chips CPH and CPL are semiconductor chips in which a vertical MOSFET having a trench gate structure is formed and the power MOSFETs QH1 and QL1 and the sense MOSFET QS1 are formed by the trench gate MISFET. In contrast to this, in the present embodiment, the semiconductor chips CPH and CPL are semiconductor chips in which the LDMOSFET is formed and the power MOSFETs QH1 and QL1 and the sense MOSFET QS1 are formed by the LDMOSFET (Laterally Diffused Metal-Oxide-Semiconductor Field Effect Transistor), respectively.

Then, the pad PDHG of the semiconductor chip CPH is the gate pad of the power MOSFET QH1 and the sense MOSFET QS1 in the first embodiment, and also in the present embodiment it is the gate pad of the power MOSFET QH1 and the sense MOSFET QS1. However, while the pads PDHS1, PDHS2, and PDHS3 of the semiconductor chip CPH are the source pads of the power MOSFET QH1 in the first embodiment, they are the drain pads of the power MOSFET QH1 in the present embodiment. Further, while the pad PDHS4 of the semiconductor chip CPH is the source pad of the sense MOSFET QS1 in the first embodiment, it is the drain pad of the sense MOSFET QS1 in the present embodiment. Furthermore, while the back surface electrode BE1 of the semiconductor chip CPH is the back surface electrode for drain of the power MOSFET QH1 and the sense MOSFET QS1 in the first embodiment, it is the back surface electrode for source of the power MOSFET QH1 and the sense MOSFET QS1 in the present embodiment.

Further, the pad PDLG of the semiconductor chip CPL is the gate pad of the power MOSFET QL1 in the first embodiment, and also in the present embodiment it is the gate pad of the power MOSFET QL1. However, while the pads PDLS1, PDLS2, PDLS3, and PDLS4 of the semiconductor chip CPL are the source pads of the power MOSFET QL1 in the first embodiment, they are the drain pads of the power MOSFET QL1 in the present embodiment. Furthermore, while the back surface electrode BE2 of the semiconductor chip CPL is the back surface electrode for drain of the power MOSFET QL1 in the first embodiment, it is the back surface electrode for source of the power MOSFET QL1 in the present embodiment.

It is also possible to apply the main characteristics in the first embodiment to the case of the semiconductor chips CPH and CPL (in the present embodiment) with such a configuration.

A configuration of the semiconductor chip CPH when the LDMOSFET is formed in place of the trench gate MOSFET will be explained with reference to FIG. 52 to FIG. 56.

Figure 52:
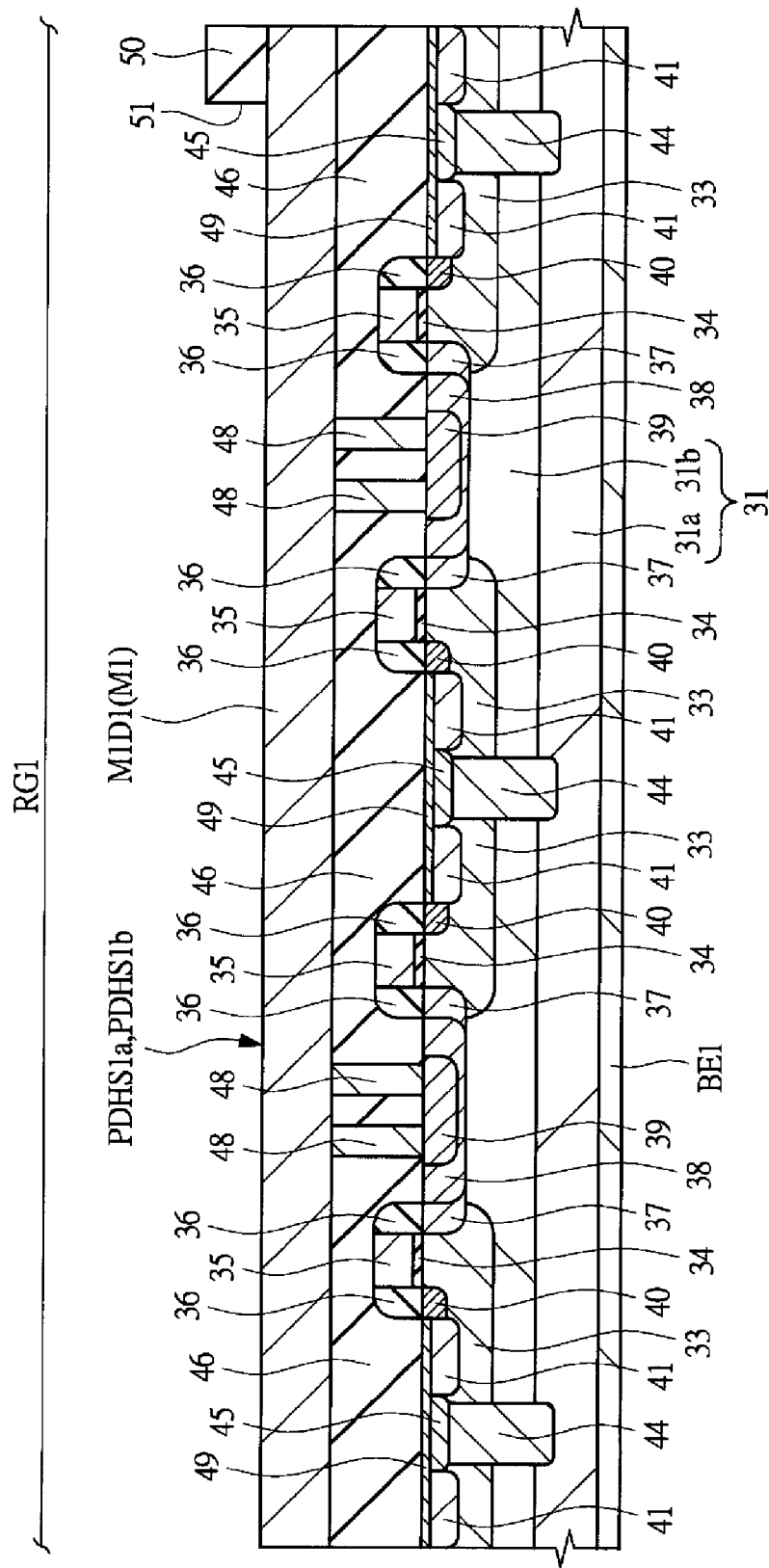
FIG. 52 is a cross-sectional view of essential parts of a semiconductor chip of another embodiment of the present invention.
Figure 53:
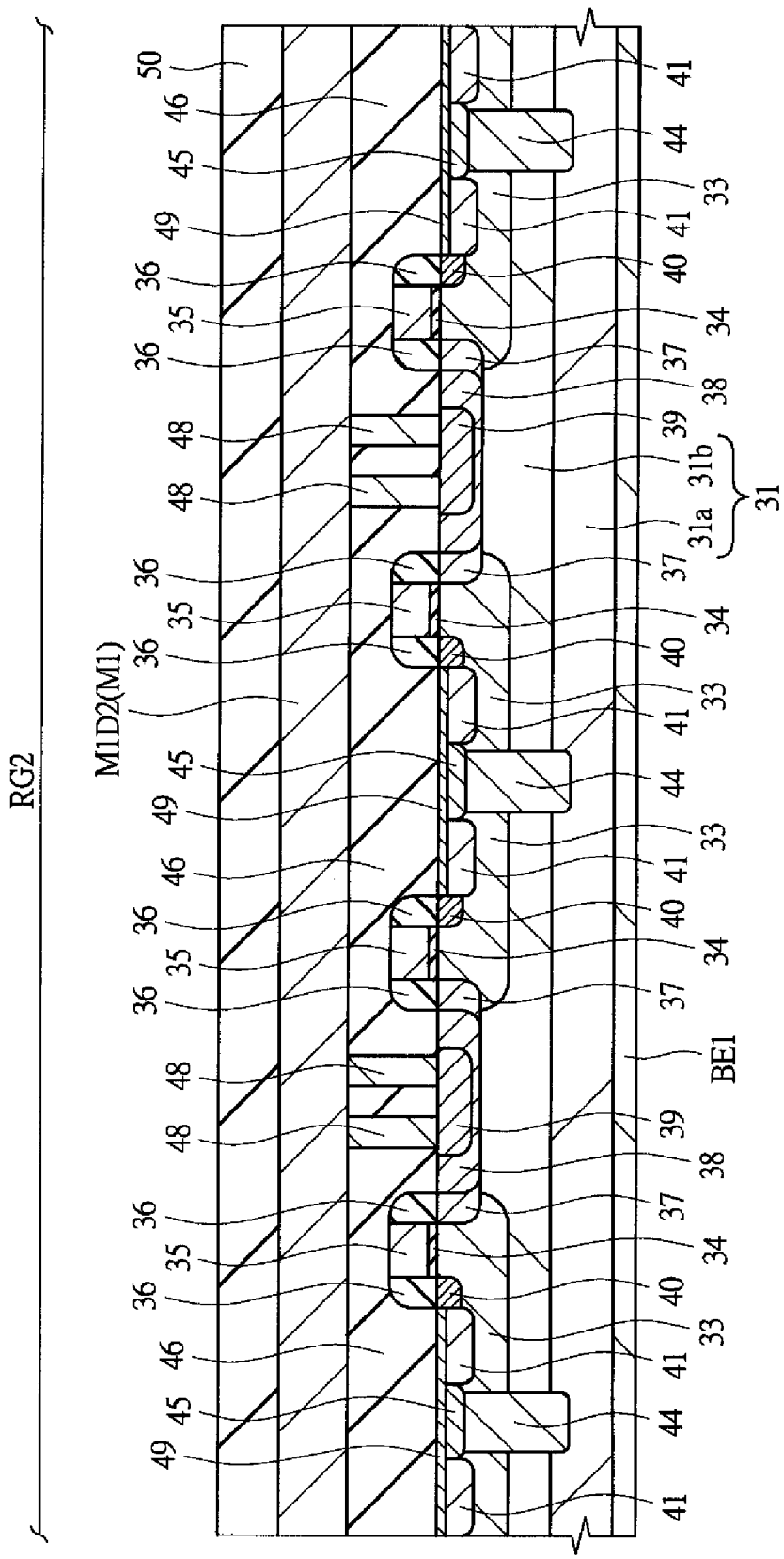
FIG. 53 is a cross-sectional view of essential parts of a semiconductor chip of another embodiment of the present invention.
Figure 54:
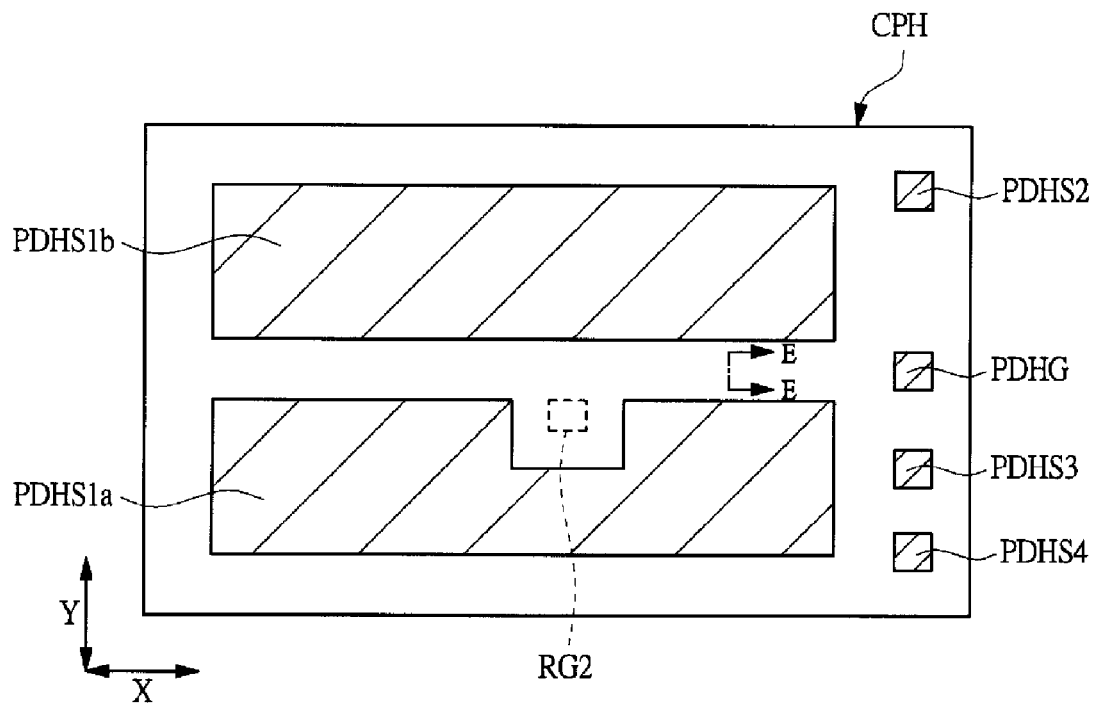
FIG. 54 is a plan view showing a chip layout of a semiconductor chip of another embodiment.
Figure 55:
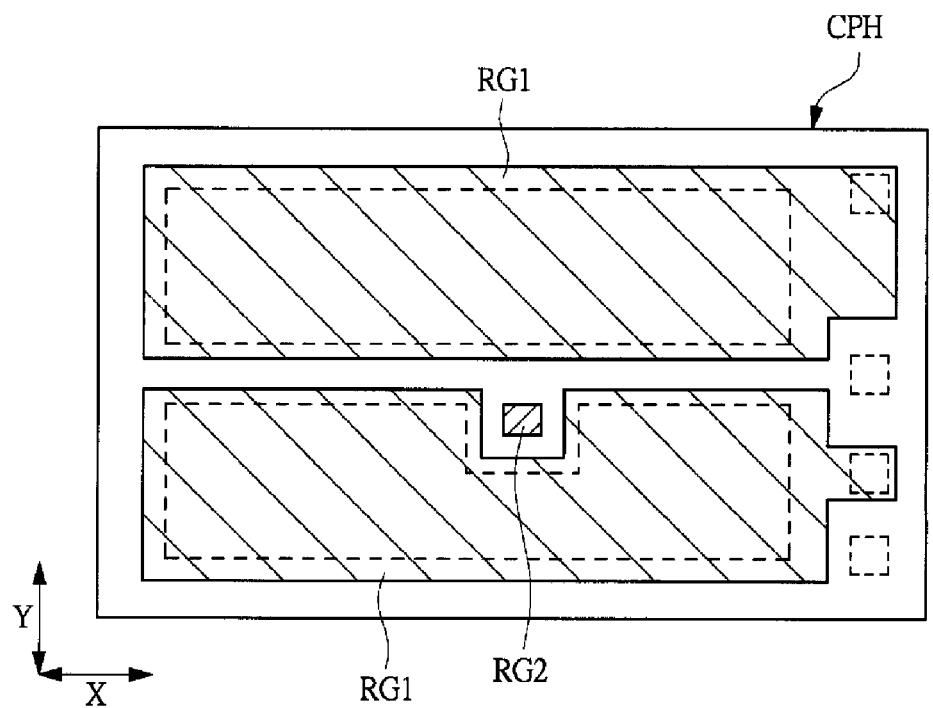
FIG. 55 is a plan view showing the chip layout of the semiconductor chip of another embodiment.
Figure 56:
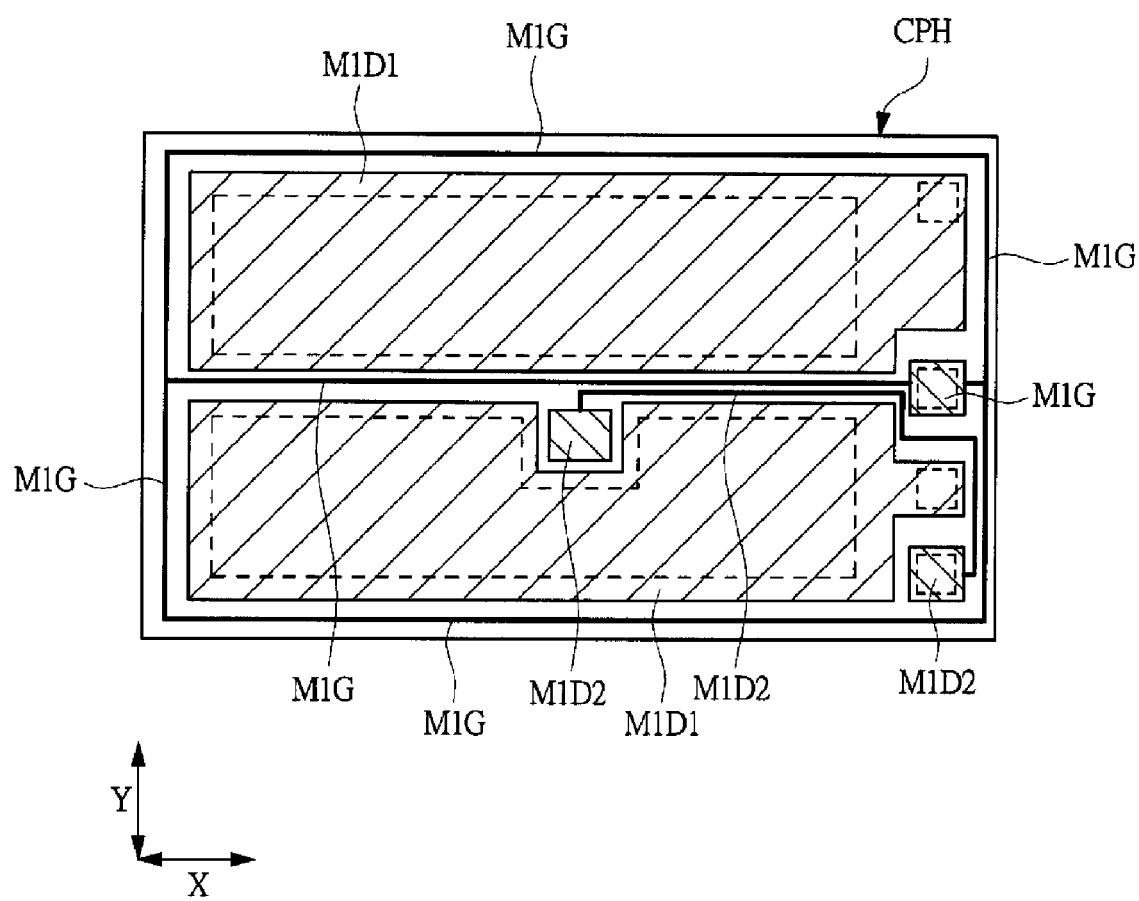
FIG. 56 is a plan view showing the chip layout of the semiconductor chip of another embodiment.

FIG. 52 and FIG. 53 are cross-sectional views of essential parts of the semiconductor chip CPH when the LDMOSFET is formed in place of the trench gate MOSFET and FIG. 52 shows a cross-sectional view of essential parts of the main MOSFET region RG1 and FIG. 53 shows a cross-sectional view of essential parts of the sense MOSFET region RG2. In addition, FIG. 54 to FIG. 56 are plan views showing a chip layout of the semiconductor chip CPH of the present embodiment and FIG. 54 corresponds to FIG. 10 and FIG. 26, FIG. 55 to FIG. 11 and FIG. 27, and FIG. 56 to FIG. 12 and FIG. 28. Meanwhile, the chip layout in FIG. 54 to FIG. 56 corresponds to the chip layout in the first modified example (FIG. 26 to FIG. 28) of the first embodiment to which the present embodiment is applied. Furthermore, in the following, the configuration of the semiconductor chip CPH will be explained with reference to FIG. 52 to FIG. 56, but it is possible to basically apply the same explanation to the configuration of the semiconductor chip CPL except that the sense MOSFET region RG2 is not provided.

The power MOSFET QH1 is formed on the main surface of a semiconductor substrate (hereinafter, simply referred to as a substrate) 31 configuring the semiconductor chip CPH. As shown in FIG. 52 and FIG. 53, the substrate 31 has a substrate main body (semiconductor substrate, semiconductor wafer) 31$a$ including p$^+$-type single crystal silicon etc. and an epitaxial layer (semiconductor layer) 31$b$ formed over the main surface of the substrate main body 31$a$ and including, for example, p$^-$-type single crystal silicon. Because of this, the substrate 31 is a so-called epitaxial wafer. In the epitaxial layer 31$b$, an element separation region (not shown schematically here) including an insulator is formed.

The element separation region is formed by, for example, the STI (Shallow Trench Isolation) method, the LOCOS (Local Oxidization of Silicon) method, etc. By the element separation region, an active region for the main MOSFET region RG1 and an active region for the sense MOSFET region RG2 are specified (formed) on the main surface (main surface of the epitaxial layer 31$b$) of the semiconductor substrate 31, a plurality of cells (unit LDMOSFET elements) of LDMOSFET is formed in the active region for the main MOSFET region RG1, and a plurality of cells (unit LDMOSFET elements) of LDMOSFET is formed in the active region for the sense MOSFET region RG2. The power MOSFET QH1 is formed by these unit LDMOSFET cells provided (in the active region) in the main MOSFET region RG1 being connected in parallel and the sense MOSFET QS1 is formed by these unit LDMOSFET cells provided (in the active region) in the sense MOSFET region RG2 being connected in parallel.

In a part of the main surface of the epitaxial layer 31$b$, a p-type well 33 that functions as a punch through stopper to suppress the extension of a depletion layer from the drain to the source of the LDMOSFET is formed. On the surface of the p-type well 33, a gate electrode 35 of LDMOSFET is formed on a gate insulating film 34 including silicon oxide etc. The gate electrode 35 includes, for example, a single film of an n-type polycrystalline silicon film, a stacked film of an n-type polycrystalline silicon film and a metal silicide film, etc., and on the sidewall of the gate electrode 35, a sidewall spacer (sidewall insulating film) 36 including silicon oxide etc. is formed.

In regions sandwiching a channel formation region (region directly under the gate electrode 35) inside of the epitaxial layer 31$b$ and distant from each other, the source and drain of the LDMOSFET are formed. The drain includes a first n$^-$-type drain region 37 in contact with the channel formation region, a second n$^-$-type drain region 38 formed in contact with the first n$^-$-type drain region and distant from the channel formation region, and an n$^+$-type drain region (drain high concentration region, high concentration n-type drain region) 39 formed in contact with the second n$^-$-type drain region and more distant from the channel formation region.

In the first n$^-$-type drain region 37, the second n$^-$-type drain region 38, and the n$^+$-type drain region 39, the first n$^-$-type drain region 37 nearest to the gate electrode 35 has the lowest impurity concentration and the n$^+$-type drain region 39 most distant from the gate electrode 35 has the highest impurity concentration. In addition, the joint depth of the second n$^-$-type drain region 38 is approximately the same as the joint depth of the first n$^-$-type drain region 37, but the n$^+$-type drain region 39 is formed shallower than the second n$^-$-type drain region 38 and the first n$^-$-type drain region 37.

The first n$^-$-type drain region (first low concentration n-type drain region, first n-type LDD region) 37 is formed in a self-aligned manner with respect to the gate electrode 35 and terminates in the lower part of the sidewall of the gate electrode 35 so that the end part thereof comes into contact with the channel formation region. The second n$^-$-type drain region (second low concentration n-type drain region, second n-type LDD region) 38 is formed in a self-aligned manner with respect to the sidewall spacer 36 formed on the sidewall on the drain side of the gate electrode 35, and thus, the second n$^-$-type drain region 38 is formed more distant from the gate electrode 35 by an amount corresponding to the film thickness of the sidewall spacer 36 along the gate length direction.

The source of the LDMOSFET includes an n$^-$-type source region 40 in contact with the channel formation region and an n$^+$-type source region 41 formed in contact with the n$^-$-type source region 40 and distant from the channel formation region and having an impurity concentration higher than that of the n$^-$-type source region 40.

The n$^-$-type source region 40 is formed in a self-aligned manner with respect to the gate electrode 35 and terminates in the lower part of the sidewall of the gate electrode 35 so that the end part thereof comes into contact with the channel formation region. Further, it is also possible to form a p-type hollow region (not shown schematically) in the lower part of the n$^-$-type source region 40 and when the hollow region is formed, although the formation thereof is not necessarily required, the spread of impurities from the source to the channel formation region is further suppressed and the short channel effect is suppressed, and thus it is possible to further suppress the reduction in the threshold voltage.

The n$^+$-type source region 41 is formed in a self-aligned manner with respect to the sidewall spacer 36 formed on the sidewall on the source side of the gate electrode 35, and thus the n$^+$-type source region 41 is formed in contact with the n$^-$-type source region 40 and also formed more distant from the channel formation region by an amount corresponding to the film thickness of the sidewall spacer 36 along the gate length direction. The position of the bottom part of the n$^+$-type source region 41 is deeper than the position of the bottom part of the n$^-$-type source region 40.

As described above, the low concentration n-type drain region (n-type LDD region) interposed between the gate electrode 35 and the n$^+$-type drain region 39 is caused to have a double structure and the impurity concentration of the first n$^-$-type drain region 37 nearest to the gate electrode 35 becomes relatively low and the impurity concentration of the second n⁻-type drain region 38 distant from the gate electrode 35 becomes relatively high. Because of this, as a result of spreading of the depletion layer between the gate electrode 35 and the drain, the feedback capacitance (Cgd) formed between the gate electrode 35 and the first n⁻-type drain region 37 in the vicinity thereof becomes small. Further, the impurity concentration of the second n⁻-type drain region 38 is high, and thus, the on-resistance (Ron) becomes also small. The second n⁻-type drain region 38 is formed in a position distant from the gate electrode 35, and thus, the influence on the feedback capacitance (Cgd) thereof is slight. Because of this, both the on-resistance (Ron) and the feedback capacitance (Cgd) can be made small, and thus, it is possible to improve power added efficiency of the amplifier circuit.

In the present application, when referring to MOSFET or LDMOSFET, it is assumed that not only MISFET using an oxide film (silicon oxide film) as a gate insulating film but also MISFET using an insulation film other than an oxide film (silicon oxide film) as a gate insulating film is included.

Here, the LDMOSFET is a MISFET (Metal Insulator Semiconductor Field Effect Transistor) element and has the following characteristics (first to third characteristics).

The first characteristic is that an LDD (Lightly doped drain) region is formed on the drain side of the gate electrode 35 in the LDMOSFET in order to enable a high voltage operation with a short channel length. That is, the drain of the LDMOSFET includes a high impurity concentration n⁺-type region (here, the n⁺-type drain region 39) and an LDD region (here, the first n⁻-type drain region 37 and the second n⁻-type drain region 38) having an impurity concentration lower than that of the n⁺-type region and the n⁺-type region (the n⁺-type drain region 39) is formed distant from the gate electrode 35 (or the channel formation region under the gate electrode 35) via the LDD region. Because of this, it is possible to realize high-voltage resistance. It is required to optimize the amount of charge (impurity concentration) in the LDD region on the drain side and the distance along the plane (main surface of the epitaxial layer 31b) between the end part of the gate electrode 35 and the n⁺-type drain region (drain high concentration region) 39 so that the breakdown voltage of the LDMOSFET becomes the maximum value.

The second characteristic is that the p-type well (p-type base region) 33 for punch through stopper is formed in the source formation region on the source side (the n⁻-type source region 40 and the n⁺-type source region 41) and the channel formation region in the LDMOSFET. On the drain side of the LDMOSFET (drain formation region), the p-type well 33 is not formed or formed so as to come into contact with a part of the drain formation region on the side nearer to the channel formation region.

The third characteristic is that the source (here, the source region including the n⁻-type source region 40 and the n⁺-type source region 41) and the drain (here, the drain region including the first n''-type drain region 37, the second n⁻-type drain region 38, and the n⁺-type drain region 39) have an asymmetric structure with respect to the gate electrode 35.

At the end part of the n⁺-type source region 41 (the end part on the side opposite to the side in contact with the n⁻-type source region 40), a p-type punch through layer (p-type semiconductor region) 44 in contact with the n⁺-type source region 41 is formed. In the vicinity of the surface of the p-type punch through layer 44, a p⁺-type semiconductor region 45 having an impurity concentration higher than that of the p-type punch through layer 44 is formed. The p-type punch through layer 44 is an electrically conductive layer for electrically connecting the source of the LDMOSFET and the substrate main body 31a and formed by, for example, a p-type polycrystalline silicon film embedded inside of a groove formed in the epitaxial layer 31b. The tip end part (bottom part) of the p-type punch through layer 44 reaches the substrate main body 31a. It is also possible to form the p-type punch through layer 44 by a metal layer embedded in the groove formed in the substrate 31.

On the surface (upper part) of the n⁺-type source region 41 and the p⁺-type semiconductor region 45, a metal silicide layer (for example, a nickel silicide layer or cobalt silicide layer) 49 is formed by the salicide (Self Aligned Silicide) technology etc. and the n⁺-type source region 41 and the p⁺-type semiconductor region 45 are electrically connected via the metal silicide layer 49.

Over the main surface of the epitaxial layer 31b, an insulating film (interlayer insulating film) 46 is formed so as to cover the gate electrode 35 and the sidewall spacer 36. The insulating film 46 includes, for example, a stacked film of a thin silicon nitride film and a thick silicon oxide film thereover etc. The upper surface of the insulating film 46 is flattened.

In the insulating film 46, a contact hole (opening, through-hole) is formed and within the contact hole, a plug (fill-in conductor for connection) 48 including a tungsten (W) film as a principal component is embedded. The contact hole and the plug 48 to be embedded therein are formed in the upper part of the drain (the n⁺-type drain region 39), the gate electrode 35, etc.

Over the insulating film 46 in which the plug 48 is embedded, a wire (first layer wire) M1 including an electric conductor film having aluminum (Al) etc. as a main element is formed. The wire M1 is formed by patterning the electric conductor film formed over the insulating film 46 in which the plug 48 is embedded. It is also possible to form the wire M1 integrated with the plug part to be embedded in the contact hole by forming the electric conductor film for the wire M1 over the insulating film 46 so as to fill in the contact hole without forming the plug 48 and patterning the electric conductor film. In this case, the plug 48 includes the same material as that of the wire M1 and is integrated with the wire M1.

The wire M1 has a gate wiring M1G and drain wires M1D1 and M1D2. Of these, the gate wiring M1G is electrically connected to the gate electrode 7 formed in the main MOSFET region RG1 and the sense MOSFET region RG2 via the plug 48. The drain wire M1D1 is electrically connected to n⁺-type drain region 39 formed in the main MOSFET region RG1 via the plug 48. The drain wire M1D2 is electrically connected to n⁺-type drain region 39 formed in the sense MOSFET region RG2 via the plug 48.

The wire M1 is covered with an insulating protective film (insulating film) 50 including a polyimide resin etc. That is, over the insulating film 46, the protective film 50 is formed so as to cover the wire M1. The protective film 50 is a film (insulating film) in the uppermost layer of the semiconductor chip CPH. In the protective film 50, a plurality of openings 51 is formed and from each opening 51, a part of the wire M1 is exposed. The wire M1 exposed from the opening 51 forms the pad electrode (bonding pad).

That is, by the gate wiring M1G exposed from the opening 51, the gate pad PDHG of the power MOSFET QH1 and the sense MOSFET QS1 is formed. Further, by the drain wire M1D1 exposed from the opening 51, the drain pads PDHS1, PDHS2, and PDHS3 of the power MOSFET QH1 are formed. Furthermore, by the drain wire M1D2 exposed from the opening 51, the drain pad PDHS4 of the sense MOSFET QS1 is formed. The drain pads PDHS1, PDHS2, and PDHS3 of the power MOSFET QH1 are separated by the protective film 50 in the uppermost layer, but are electrically connected to one another through the drain wire M1D1. In contrast, the drain wire M1D2 is separated from the drain wire M1D1, and thus the drain pad PDHS4 of the sense MOSFET QS1 is not short-circuited with and electrically separated from the drain pads PDHS1, PDHS2, and PDHS3 of the power MOSFET QH1.

On the surface of the pads PDHS1, PDHS2, PDHS3, PDHS4, and PDHG (that is, over the wire M1 of the part exposed at the bottom part of the opening 51), there are cases where a metal layer (not shown schematically here) like in the case of the metal layer 14 is formed by the plating method or the like.

On the back surface of the substrate 31 (main surface on the side opposite to the main surface on the side on which the epitaxial layer 31b is formed), the back surface electrode BE1 is formed and in the first embodiment, the back surface electrode BE1 is the back surface electrode for drain, but in the present embodiment, the back surface electrode BE1 is the back surface electrode for source. The back surface electrode BE1 is formed on the entire back surface of the substrate 31 configuring the semiconductor chip CPH.

The source (the n⁻-type source region 40 and the n⁺-type source region 41) of the LDMOSFET formed in the epitaxial layer 31b of the main MOSFET region RG1 and the sense MOSFET region RG2 is electrically connected to the substrate main body 31a via the metal silicide layer 49 and the p-type punch through layer 44 and is further electrically connected to the back surface electrode BE1 for source via the substrate main body 31a.

The drain (the first n⁻-type drain region 37, the second n⁻-type drain region 38, and the n⁺-type drain region 39) of the LDMOSFET formed in the epitaxial layer 31b of the main MOSFET region RG1 is electrically connected to the drain pads PDHS1, PDHS2, and PDHS3 via the plug 48 (the plug 48 arranged over the n⁺-type drain region 39) and the drain wire M1D1.

The drain (the first n⁻-type drain region 37, the second n⁻-type drain region 38, and the n⁺-type drain region 39) of the LDMOSFET formed in the epitaxial layer 31b of the sense MOSFET region RG2 is electrically connected to the drain pad PDHS4 via the plug 48 (the plug 48 arranged over the n⁺-type drain region 39) and the drain wire M1D2.

The gate electrode 35 of the LDMOSFET formed in the epitaxial layer 31b of the main MOSFET region RG1 and the sense MOSFET region RG2 is electrically connected to the gate pad PDHG via the plug 48 (the plug 48 arranged over the gate electrode 35) and the gate wiring M1G.

As described above, in the present embodiment, the LDMOSFET for the power MOSFET QH1 and the LDMOSFET for the sense MOSFET QS1 are formed within the semiconductor chip CPH. Then, in the present embodiment, on the main surface (upper surface, surface) of the semiconductor chip CPH, the pads PDHS1, PDHS2, PDHS3, and PDHS4 are formed as the drain pads, on the back surface of the semiconductor chip CPH, the pad PDHG is formed as the gate pad, and on the back surface of the semiconductor chip CPH, the back surface electrode BE1 is formed as the back surface electrode for source.

Further, in the present embodiment, the structure (cross-sectional structure) of the semiconductor chip CPL is basically the same as the structure (cross-sectional structure) of the semiconductor chip CPH and the semiconductor chip CPL is a semiconductor chip in which the LDMOSFET is formed on the same substrate as the substrate 31 and the configuration of each unit LDMOSFET cell formed in the semiconductor chip CPH is basically the same as that of each unit LDMOSFET cell in the semiconductor chip CPH. However, in the semiconductor chip CPL, the sense MOSFET QS1 is not formed and a plurality of unit LDMOSFET cells configuring the power MOSFET QH1 is formed in the entire region combining the main MOSFET region RG1 and the sense MOSFET region RG2 and the power MOSFET QL1 is formed by these unit LDMOSFET cells being connected in parallel.

The layout of the main MOSFET region RG1, the sense MOSFET region RG2, and the pads PDHG, PDHS1, PDHS2, PDHS3, and PDHS4 in the semiconductor chip CPH is basically the same as the chip layout in FIG. 26 to FIG. 28 (the first modified example of the first embodiment), and thus the explanation thereof is omitted here. The layout of the gate wiring M1G, the drain wire. M1D1, and the drain wire M1D2 in the semiconductor chip CPH is basically the same as the gate wiring M1g, the source wiring 10S1, and the source wiring 10S2, respectively, in the chip layout in FIG. 26 to FIG. 28 (the first modified example of the first embodiment), and thus the explanation thereof is omitted here. It is possible to apply the present embodiment to the semiconductor chip CPH with the chip layout in FIG. 10 to FIG. 12, the chip layout in FIG. 23 to FIG. 25, and the chip layouts in the second, third, and fourth modified examples of the first embodiment.

That is, in the semiconductor chips CPH and CPL of the first embodiment, by forming the LDMOSFET in place of the trench gate MOSFET, it is possible to replace the source pads (the pads PDHS1, PDHS2, PDHS3, and PDHS4) on the side of the chip surface with the drain pad, the drain back surface electrode (the back surface electrode BE1) on the side of the chip back surface with the source back surface electrode, and the source wiring with the drain wire. Even in such a case, the first embodiment is effective and as an example, a case will be explained where the semiconductor chip CPH of the present embodiment is applied to the semiconductor device SM1d in FIG. 46 to FIG. 48, although the repeated explanation thereof is omitted.

Figure 57:
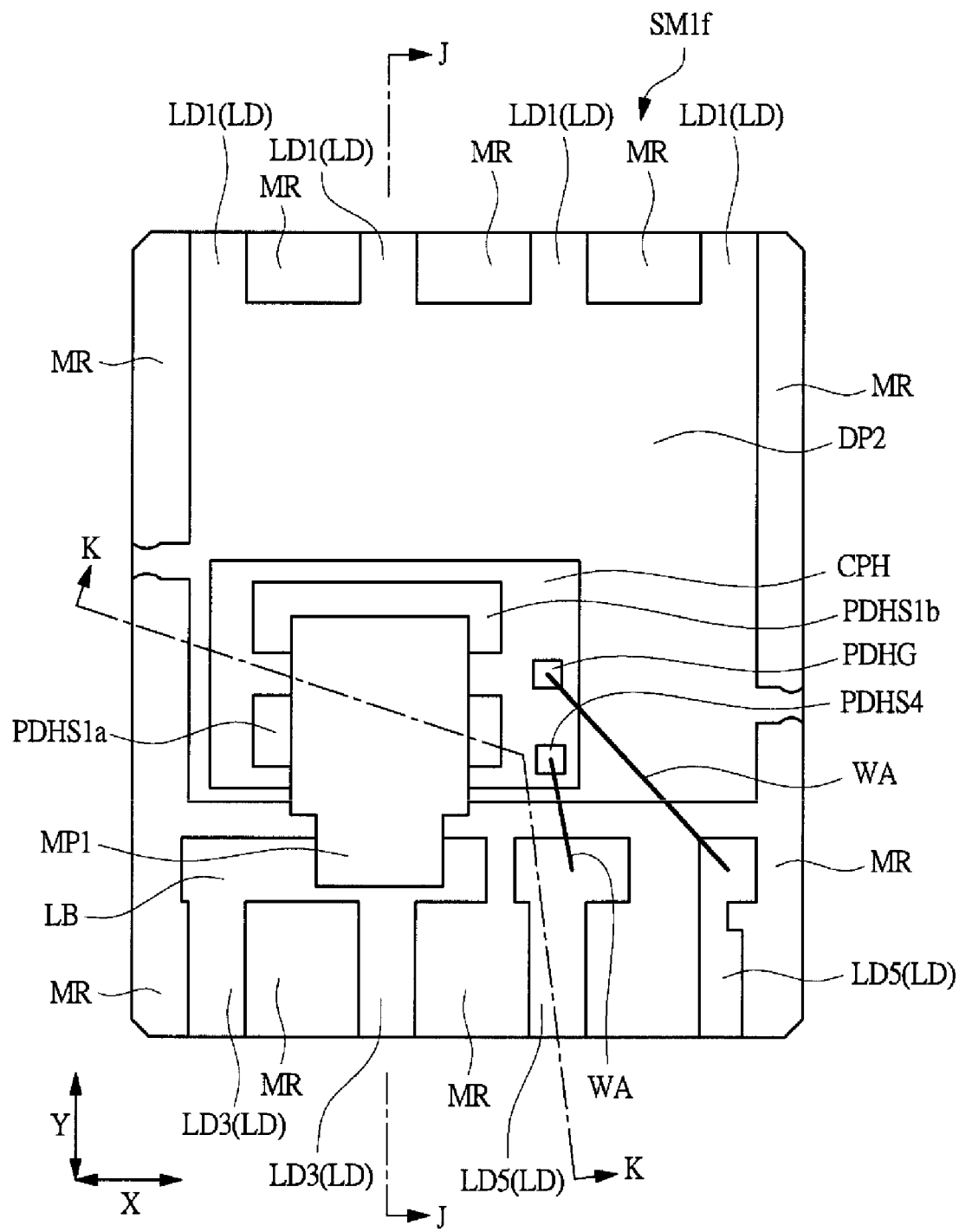
FIG. 57 is a perspective plan view of a semiconductor device using the semiconductor chip in FIG. 52 to FIG. 56.
Figure 58:
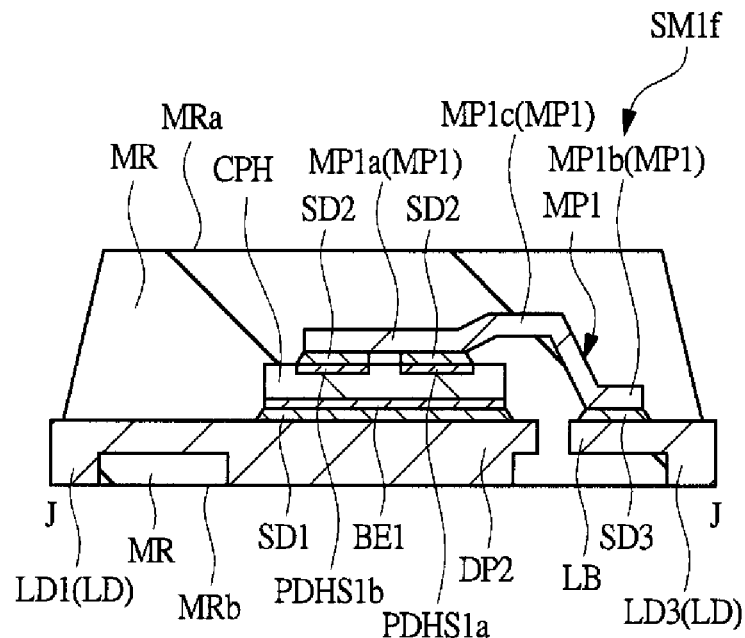
FIG. 58 is a cross-sectional view of the semiconductor device in FIG. 57.
Figure 59:
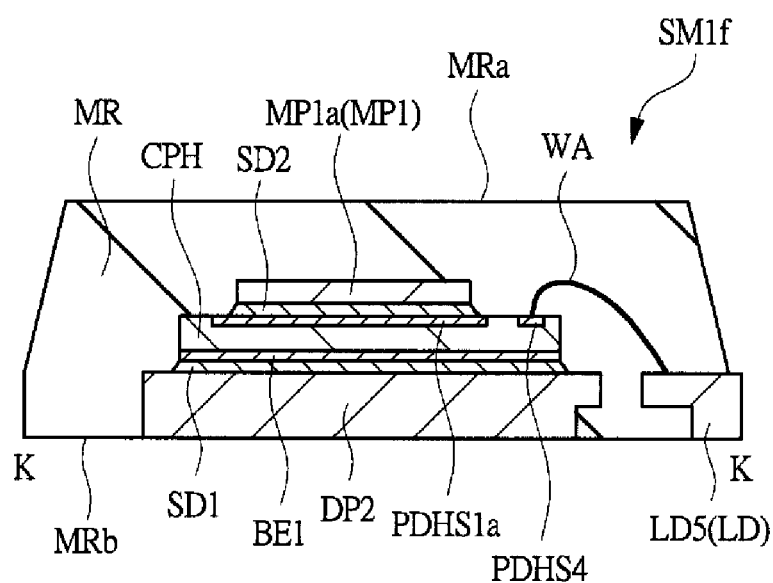
FIG. 59 is a cross-sectional view of the semiconductor device in FIG. 57.

FIG. 57 is a perspective plan view showing a case where the semiconductor chip. CPH of the present embodiment is applied to the semiconductor device SM1d in the sixth modified example of the first embodiment shown in FIG. 46 to FIG. 48 and corresponds to FIG. 46. FIG. 58 and FIG. 59 are cross-sectional views of a semiconductor device SM1f in FIG. 57 and correspond to FIG. 47 and FIG. 48, respectively. The cross-sectional view along J-J line in FIG. 57 corresponds to FIG. 58 and the cross-sectional view along K-K line in FIG. 57 corresponds to FIG. 59. It is assumed that the semiconductor device SM1d shown in FIG. 57 to FIG. 59 to which the semiconductor chip CPH of the present embodiment is applied is referred to as the semiconductor device SM1f in the following.

The difference of the semiconductor chip CPH is described above and other differences between the semiconductor device SM1d in FIG. 46 to FIG. 48 and the semiconductor device SM1f in FIG. 57 to FIG. 59 are as follows.

In the semiconductor device SM1d in FIG. 46 to FIG. 48, the pads PDHS1a and PDHS1b of the semiconductor chip CPH are electrically connected to the lead wire LB via the metal plate MP1 and the pads PDHS1a and PDHS1b are the source pads of the power MOSFET QH, and thus the lead wire LB connected to the pads PDHS1a and PDHS1b via the metal plate MP1 is the lead wiring for source of the power MOSFET QH1. Furthermore, in the semiconductor device SM1d in FIG. 46 to FIG. 48, the pad PDHS4 of the semiconductor chip CPH is electrically connected to the lead LD5 via the wire WA and the pad PDHS4 is the source pad of the sense MOSFET QS1, and thus the lead LD5 connected to the pad PDHS4 via the wire WA is the lead for source of the sense MOSFET QS1. Furthermore, in the semiconductor device SM1d in FIG. 46 to FIG. 48, the back surface electrode BE1 of the semiconductor chip CPH is the back surface electrode for drain, and thus the die pad DP2 electrically connected to the back surface electrode BE1 of the semiconductor chip CPH via the adhesive layer SD1 and the lead LD1 linked to the die pad DP2 are the die pad and the lead for drain of the power MOSFET QH1 and the sense MOSFET QS1.

In contrast to the above, in the semiconductor device SM1f in FIG. 57 to FIG. 59, the pads PDHS1a and PDHS1b of the semiconductor chip CPH are electrically connected to the lead wire LB via the metal plate MP1 and the pads PDHS1a and PDHS1b are the drain pads of the power MOSFET QH1, and thus, the lead wire LB connected to the pads PDHS1a and PDHS1b via the metal plate MP1 is the lead wire for drain of the power MOSFET QH1. Furthermore, in the semiconductor device SM1f in FIG. 57 to FIG. 59, the pad PDHS4 of the semiconductor chip CPH is electrically connected to the lead LD5 via the wire WA and the pad PDHS4 is the drain pad of the sense MOSFET QS1, and thus the lead LD5 connected to the pad PDHS4 via the wire WA is the lead for drain of the sense MOSFET QS1. Furthermore, in the semiconductor device SM1f in FIG. 57 to FIG. 59, the back surface electrode BE1 of the semiconductor chip CPH is the back surface electrode for source, and thus the die pad DP2 electrically connected to the back surface electrode BE1 of the semiconductor chip CPH via the adhesive layer SD1 and the lead LD1 linked to the die pad DP2 are the die pad and the lead for source of the power MOSFET QH1 and the sense MOSFET QS1.

Other configurations of the semiconductor device SM1f in FIG. 57 to FIG. 59 are basically the same as those of the semiconductor device SM1d in FIG. 46 to FIG. 48, and thus, the explanation thereof is omitted here. Further, also when the present embodiment is applied to the semiconductor device SM1e in FIG. 49 and FIG. 50, the difference is the same as that in the case where the semiconductor device SM1f in FIG. 57 to FIG. 59 is explained.

It is also possible to apply the semiconductor chips CPH and CPL of the present embodiment to the semiconductor device SM1 in FIG. 2 to FIG. 7, the semiconductor device SM1a in FIG. 35 and FIG. 36, the semiconductor device SM1b in FIG. 41 to FIG. 43, and the semiconductor device SM1c in FIG. 44 and FIG. 45.

Figure 60:
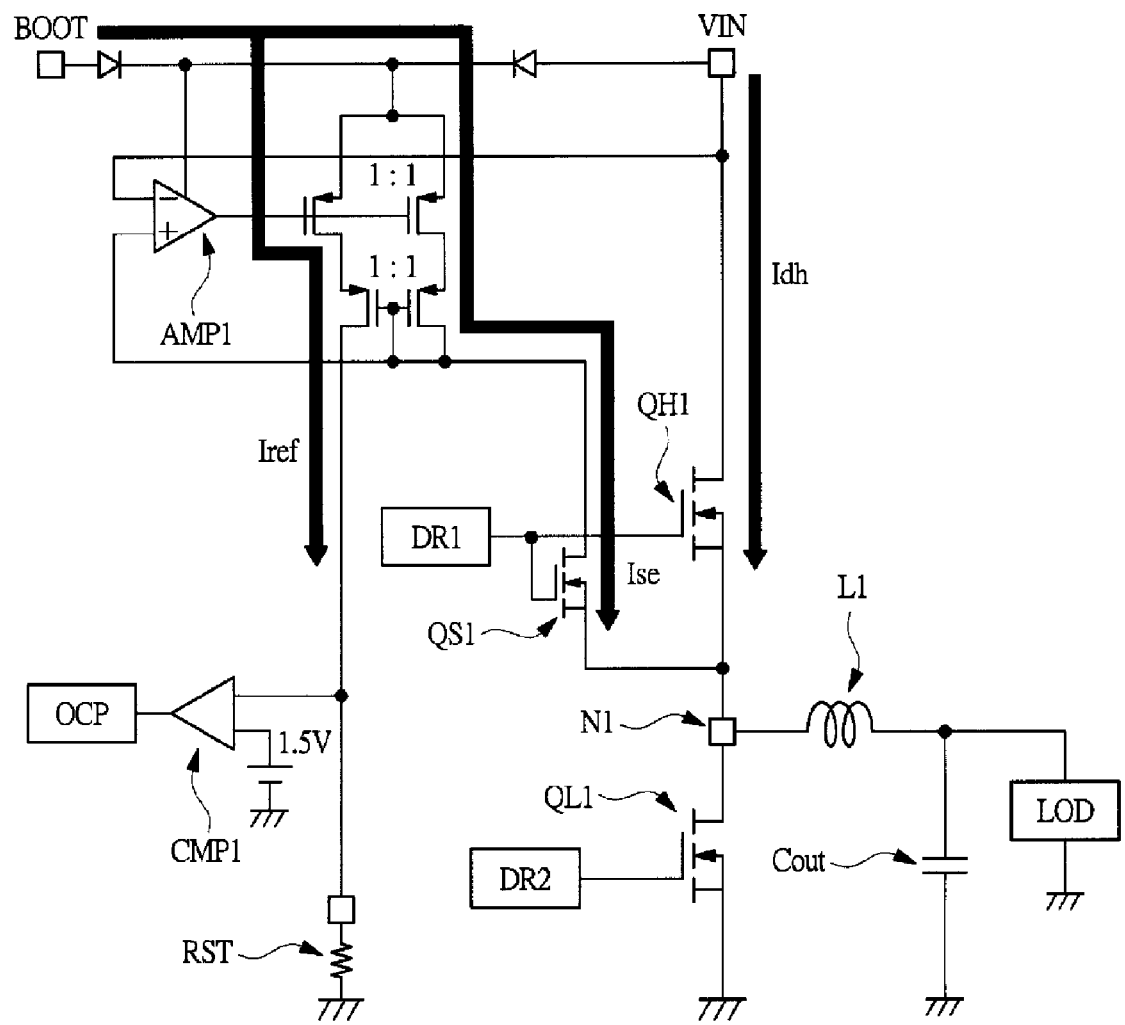
FIG. 60 is a circuit diagram showing an example of an electronic device using a semiconductor device of another embodiment of the present invention.

FIG. 60 is a circuit diagram when the present embodiment is applied and corresponds to FIG. 1 in the first embodiment.

While in the semiconductor chip CPH of the first embodiment, the drain is shared by the power MOSFET QH1 and the sense MOSFET QS1, in the semiconductor chip CPH of the present embodiment, the source is shared by the power MOSFET QH1 and the sense MOSFET QS1. Consequently, it is preferable to modify the circuit in FIG. 1 to the circuit as shown in FIG. 60.

In the first embodiment, the electric current Idh flowing through the power MOSFET QH1 is output from the output node N1, but the electric current Ise flowing through the sense MOSFET QS1 is not output from the output node N1. Because of this, in the first embodiment, as in FIG. 1, by directly utilizing the electric current Ise, it is possible to detect the value of the electric current Ise by causing the electric current Ise to flow through the resistor RST (actually, the value is detected after being converted into a voltage). In contrast, in the case of the present embodiment, the source is shared by the power MOSFET QH1 and the sense MOSFET QS1, and thus the sum of the electric current Idh flowing through the power MOSFET QH1 and the electric current Ise flowing through the sense MOSFET QS1 is output from the output node N1. Because of this, in the circuit in FIG. 60, it is possible to indirectly detect the value of the electric current Ise flowing through the sense MOSFET QS1 by generating an electric current Iref equal in magnitude to the electric current Ise flowing through the sense MOSFET QS1 and causing the electric current Iref to flow through the resistor RST. As to others, explanation of the case of the circuit in FIG. 60 is basically the same as the explanation given with reference to FIG. 1, and thus the explanation thereof is omitted here.

The invention made by the inventors of the present invention will be explained specifically based on the embodiments, but it is needless to say that the present invention is not limited to the embodiments and the embodiments can be modified in a variety of ways without deviating from the gist thereof.

The present invention is effected when applied to a semiconductor device.

What is claimed is:

1. A semiconductor device comprising:
a first chip mounting part having electric conductivity;
a first semiconductor chip having a first main surface and a first back surface on the side opposite to the first main surface, the first back surface being joined to the first chip mounting part via an electrically conductive joining material; and
a sealing part configured to seal at least a part of the first semiconductor chip and the first chip mounting part,
wherein in the first semiconductor chip, a first MOSFET and a second MOSFET, the drains of which are electrically connected to each other and the gates of which are electrically connected to each other are formed,
the first MOSFET is formed in a first region of the first main surface of the first semiconductor chip,
the second MOSFET is an element configured to detect an electric current flowing through the first MOSFET and formed in a second region of the first main surface of the first semiconductor chip,
a first gate pad electrically connected to the gates of the first and second MOSFETs, a first source pad electrically connected to the source of the first MOSFET, and a second source pad electrically connected to the source of the second MOSFET are formed on the first main surface of the first semiconductor chip,
a drain electrode electrically connected to the drains of the first and second MOSFETs is formed on the first back surface of the first semiconductor chip, and
in the first main surface of the first semiconductor chip, the area of the second region is smaller than that of the first region, and the second region is located more internally than the second source pad.

2. The semiconductor device according to claim 1,
wherein the source region of the second MOSFET formed in the second region and the second source pad are electrically connected via a wiring for source formed in the first semiconductor chip.

3. The semiconductor device according to claim 2,
wherein on the first main surface of the first semiconductor chip, the second region is arranged closer to inside than the first gate pad.

4. The semiconductor device according to claim 3,
wherein on the first main surface of the first semiconductor chip, the second region is surrounded by the first region in a planar view.

5. The semiconductor device according to claim 4,
wherein on the first main surface of the first semiconductor chip, the second region is surrounded by the first source pad in a planar view.

6. The semiconductor device according to claim 5,
wherein the first MOSFET is controlled depending on electric current flowing through the second MOSFET.

7. The semiconductor device according to claim 6, further comprising a first conductor part, at least a part of which is sealed by the sealing part,
wherein the first source pad and the first conductor part are electrically connected via a first conductor plate, and
in the main surface of the first semiconductor chip, the second region overlaps with the conductor plate in a planar view.

8. The semiconductor device according to claim 7, further comprising:
a second semiconductor chip mounted over the first conductor part; and
a second conductor part at least a part of which is sealed by the sealing part,
wherein the second semiconductor chip has a second main surface and a second back surface on the side opposite to the second main surface, the second back surface being joined to the first conductor part via an electrically conductive joining material,
in the second semiconductor chip, a third MOSFET is formed,
a second gate pad electrically connected to the gate of the third MOSFET and a third source pad electrically connected to the source of the third MOSFET are formed on the second main surface of the second semiconductor chip,
a drain electrode electrically connected to the drain of the third MOSFET is formed on the second back surface of the second semiconductor chip, and
the third source pad and the second conductor part are electrically connected via a second conductor plate.

9. The semiconductor device according to claim 8, further comprising:
a second chip mounting part; and
a third semiconductor chip having a third main surface and a third back surface on the side opposite to the third main surface, the third back surface being joined to the second chip mounting part,
wherein in the third semiconductor chip, a control circuit configured to control the first and second MOSFETs is formed, and
the first gate pad, the second gate pad, and the second source pad are electrically connected to the pad of the second semiconductor chip, respectively, via wires.

10. The semiconductor device according to claim 9,
wherein when determining that an electric current flowing through the second MOSFET is excessive, the control circuit of the third semiconductor chip turns off the first MOSFET.

11. The semiconductor device according to claim 4,
wherein in the first main surface of the first semiconductor chip, a third source pad electrically connected to the source of the first MOSFET is further formed,
a wiring for gate electrically connecting the gates of the first and second MOSFETs and the first gate pad extends between the first source pad and the third source pad in the same layer as that of the wiring for source in a planar view, and
the wiring for source extends along the wiring for gate between the first source pad and the third source pad in a planar view.

12. The semiconductor device according to claim 11, further comprising a first conductor part at least a part of which is sealed by the sealing part,
wherein the first and third source pads and the first conductor part are electrically connected via a first conductor plate, and
in the main surface of the first semiconductor chip, the second region overlaps with the conductor plate in a planar view.

13. A semiconductor device comprising:
a first chip mounting part having electric conductivity;
a first semiconductor chip having a first main surface and a first back surface on the side opposite to the first main surface, the first back surface being joined to the first chip mounting part via an electrically conductive joining material; and
a sealing part configured to seal at least a part of the first semiconductor chip and the first chip mounting part,
wherein in the first semiconductor chip, a first MOSFET and a second MOSFET the drains of which are electrically connected to each other and the gates of which are electrically connected to each other are formed,
the first MOSFET is formed in a first region of the first main surface of the first semiconductor chip,
the second MOSFET is an element configured to detect an electric current flowing through the first MOSFET and is formed in a second region of the first main surface of the first semiconductor chip,
a first gate pad electrically connected to the gates of the first and second MOSFETs, a first source pad electrically connected to the source of the first MOSFET, and a second source pad electrically connected to the source of the second MOSFET are formed on the first main surface of the first semiconductor chip,
a drain electrode electrically connected to the drains of the first and second MOSFETs is formed on the first back surface of the first semiconductor chip, and
in the first main surface of the first semiconductor chip, the area of the second region is smaller than that of the first region and the second region is surrounded by the first region in a planar view.

14. The semiconductor device according to claim 13,
wherein in the first main surface of the first semiconductor chip, the second source pad overlaps with the second region in a planar view.

15. The semiconductor device according to claim 14,
wherein in the first main surface of the first semiconductor chip, the second source pad is arranged more internally than the first gate pad.

16. The semiconductor device according to claim 15,
wherein in the first main surface of the first semiconductor chip, the second source pad is surrounded by the first source pad in a planar view.

17. The semiconductor device according to claim 16, further comprising a first conductor part at least a part of which is sealed by the sealing part,
wherein the first source pad and the second conductor part are electrically connected via a first conductor plate.

18. The semiconductor device according to claim 17,
wherein the first conductor plate has an opening,
in the first main surface of the first semiconductor chip, the second source pad is exposed from the opening in a planar view, and
to the second source pad, a wire is connected.

19. The semiconductor device according to claim 18, further comprising:
- a second semiconductor chip mounted over the first conductor part; and
- a second conductor part at least a part of which is sealed by the sealing part,
- wherein the second semiconductor chip has a second main surface and a second back surface on the side opposite to the second main surface, the second back surface being joined to the first conductor part via an electrically conductive joining material,
- in the second semiconductor chip, a third MOSFET is formed,
- a second gate pad electrically connected to the gate of the third MOSFET and a third source pad electrically connected to the source of the third MOSFET are formed on the second main surface of the second semiconductor chip,
- a drain electrode electrically connected to the drain of the third MOSFET is formed on the second back surface of the second semiconductor chip, and
- the third source pad and the second conductor part are electrically connected via a second conductor plate.

20. The semiconductor device according to claim 19, further comprising:
- a second chip mounting part; and
- a third semiconductor chip having a third main surface and a third back surface on the side opposite to the third main surface, the third back surface being joined to the second chip mounting part,
- wherein in the second semiconductor chip, a control circuit configured to control the first and second MOSFETs is formed, and
- the first gate pad, the second gate pad, and the second source pad are electrically connected to the pad of the third semiconductor chip, respectively, via wires.

21. A semiconductor device having:
- a first chip mounting part having electric conductivity;
- a first semiconductor chip having a first main surface and a first back surface on the side opposite to the first main surface, the first back surface being joined to the first chip mounting part via an electrically conductive joining material; and
- a sealing part configured to seal at least a part of the first semiconductor chip and the first chip mounting part,
- wherein in the first semiconductor chip, a first MOSFET and a second MOSFET the sources of which are electrically connected to each other and the gates of which are electrically connected to each other are formed,
- the first MOSFET is formed in a first region of the first main surface of the first semiconductor chip,
- the second MOSFET is an element configured to detect an electric current flowing through the first MOSFET and formed in a second region of the first main surface of the first semiconductor chip,
- a first gate pad electrically connected to the gates of the first and second MOSFETs, a first drain pad electrically connected to the drain of the first MOSFET, and a second drain pad electrically connected to the drain of the second MOSFET are formed on the first main surface of the first semiconductor chip,
- a source electrode electrically connected to the sources of the first and second MOSFETs is formed on the first back surface of the first semiconductor chip, and
- in the first main surface of the first semiconductor chip, the area of the second region is smaller than that of the first region and the second region is located more internally than the second drain pad.

22. A semiconductor device comprising:
- a first chip mounting part having electric conductivity;
- a first semiconductor chip having a first main surface and a first back surface on the side opposite to the first main surface, the first back surface being joined to the first chip mounting part via an electrically conductive joining material; and
- a sealing part configured to seal at least a part of the first semiconductor chip and the first chip mounting part,
- wherein in the first semiconductor chip, a first MOSFET and a second MOSFET the sources of which are electrically connected to each other and the gates of which are electrically connected to each other are formed,
- the first MOSFET is formed in a first region of the first main surface of the first semiconductor chip,
- the second MOSFET is an element configured to detect an electric current flowing through the first MOSFET and formed in a second region of the first main surface of the first semiconductor chip,
- a first gate pad electrically connected to the gates of the first and second MOSFETs, a first drain pad electrically connected to the drain of the first MOSFET, and a second drain pad electrically connected to the drain of the second MOSFET are formed on the first main surface of the first semiconductor chip,
- a source electrode electrically connected to the sources of the first and second MOSFETs is formed on the first back surface of the first semiconductor chip, and
- in the first main surface of the first semiconductor chip, the area of the second region is smaller than that of the first region and the second region is surrounded by the first region in a planar view.

* * * * *